US008235605B2

(12) United States Patent
Kim

(10) Patent No.: US 8,235,605 B2
(45) Date of Patent: Aug. 7, 2012

(54) SELF-STANDING PARALLEL PLATE BEAM SPLITTER, METHOD FOR MANUFACTURING THE SAME, AND LASER DIODE PACKAGE STRUCTURE USING THE SAME

(76) Inventor: Jeong Soo Kim, Gongju-si (KR)

( * ) Notice: Subject to any disclaimer, the term of this patent is extended or adjusted under 35 U.S.C. 154(b) by 298 days.

(21) Appl. No.: 12/531,950

(22) PCT Filed: Mar. 18, 2008

(86) PCT No.: PCT/KR2008/001520
§ 371 (c)(1),
(2), (4) Date: Apr. 13, 2010

(87) PCT Pub. No.: WO2008/114991
PCT Pub. Date: Sep. 25, 2008

(65) Prior Publication Data
US 2010/0226655 A1 Sep. 9, 2010

(30) Foreign Application Priority Data

| Mar. 19, 2007 | (KR) | 10-2007-0026558 |
| Jun. 20, 2007 | (KR) | 10-2007-0060267 |
| Oct. 25, 2007 | (KR) | 10-2007-0108008 |
| Nov. 26, 2007 | (KR) | 10-2007-0120602 |
| Jan. 4, 2008 | (KR) | 10-2008-0001466 |
| Jan. 9, 2008 | (KR) | 10-2008-0002613 |
| Jan. 23, 2008 | (KR) | 10-2008-0007104 |
| Mar. 5, 2008 | (KR) | 10-2008-0020534 |

(51) Int. Cl.
*G02B 6/36* (2006.01)
*G02B 27/14* (2006.01)
*H04B 10/12* (2006.01)
*B05D 5/06* (2006.01)
*G03F 7/20* (2006.01)

(52) U.S. Cl. ............... 385/92; 385/36; 385/31; 398/139; 359/629; 427/162; 430/321

(58) Field of Classification Search .................... 385/31, 385/88, 89, 92, 93, 94, 49, 36; 359/260, 359/261, 528, 546, 639, 640, 629; 398/135, 398/136, 137, 138, 139; 427/162; 430/321
See application file for complete search history.

(56) References Cited

U.S. PATENT DOCUMENTS 4,733,067 A 3/1988 Oinoue et al.
(Continued)

FOREIGN PATENT DOCUMENTS
JP 11-97804 A 4/1999

*Primary Examiner* — Brian Healy
(74) *Attorney, Agent, or Firm* — Drinker Biddle & Reath LLP

(57) ABSTRACT

Disclosed herein are a self-standing parallel plate beam splitter, a method for manufacturing the same, and a laser diode package structure using the same. The self-standing parallel plate beam splitter according to the present invention is easy to manufacture and is applicable to various laser diode packages, thereby enabling easy implementation of a laser diode package that is capable of performing bidirectional communication, a laser diode package having a triplexer function, a laser diode package having a wavelength locking function, and a laser diode package having a front side monitoring function to monitor the operation state of a laser diode chip using some of laser light emitted from the front side of the laser diode chip.

29 Claims, 22 Drawing Sheets

U.S. PATENT DOCUMENTS

| | | |
|---|---|---|
| 4,807,238 A | 2/1989 | Yokomori |
| 5,566,265 A | 10/1996 | Spaeth et al. |
| 5,652,763 A | 7/1997 | Delfyett, Jr. |
| 5,880,889 A * | 3/1999 | Neumann et al. ............. 359/634 |
| 5,936,986 A | 8/1999 | Cantatore et al. |
| 6,188,132 B1 | 2/2001 | Shih et al. |
| 6,493,121 B1 | 12/2002 | Althaus |
| 6,826,211 B2 | 11/2004 | Tatsuno et al. |
| 6,879,784 B1 | 4/2005 | Blair et al. |
| 7,093,988 B2 | 8/2006 | Tsumori |
| 2003/0147601 A1* | 8/2003 | Bartur et al. .................... 385/92 |
| 2008/0247766 A1* | 10/2008 | McCaul et al. ............... 398/202 |
| 2010/0226655 A1* | 9/2010 | Kim ............................ 398/139 |

* cited by examiner

[Fig. 1]
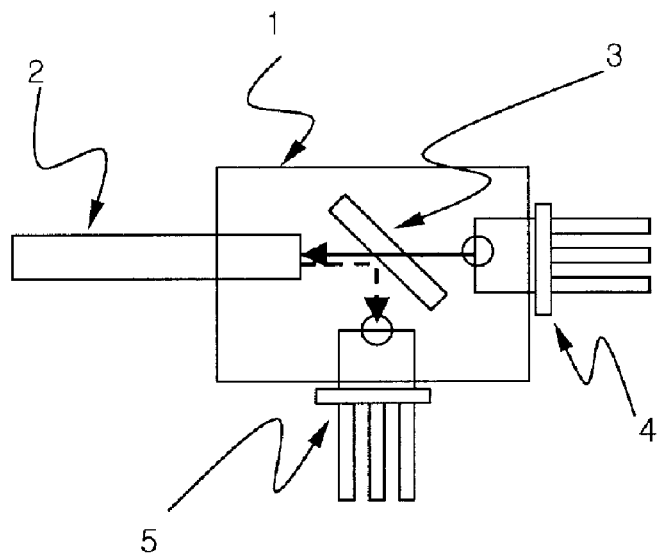
[Fig. 2]
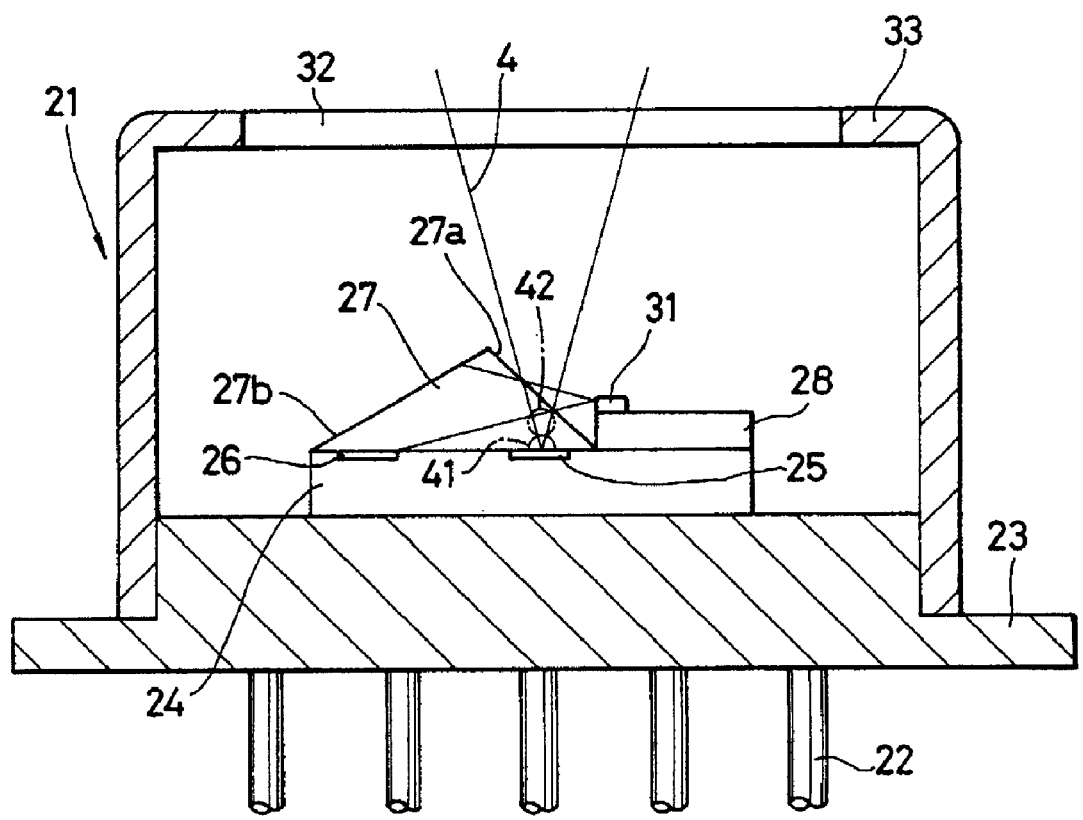

[Fig. 3]
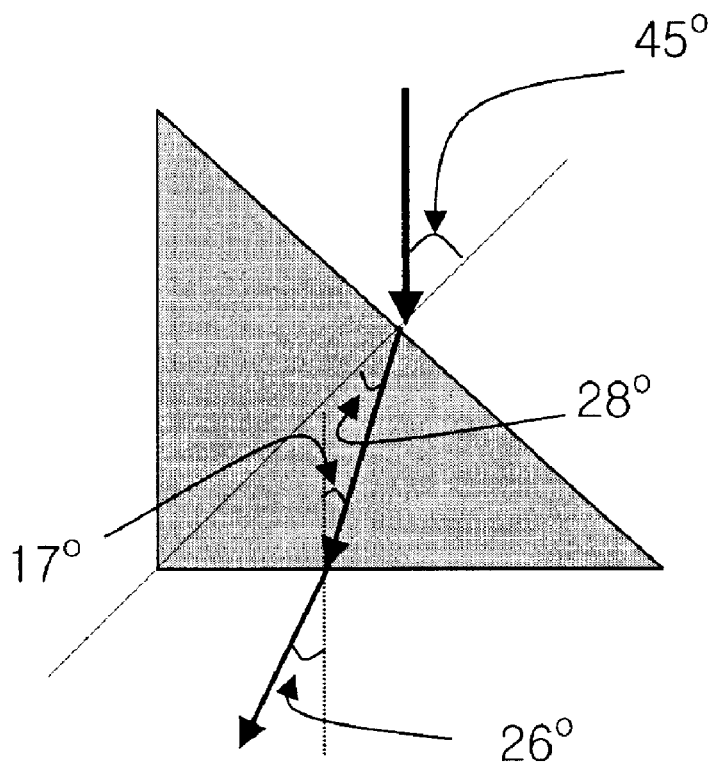
[Fig. 4]
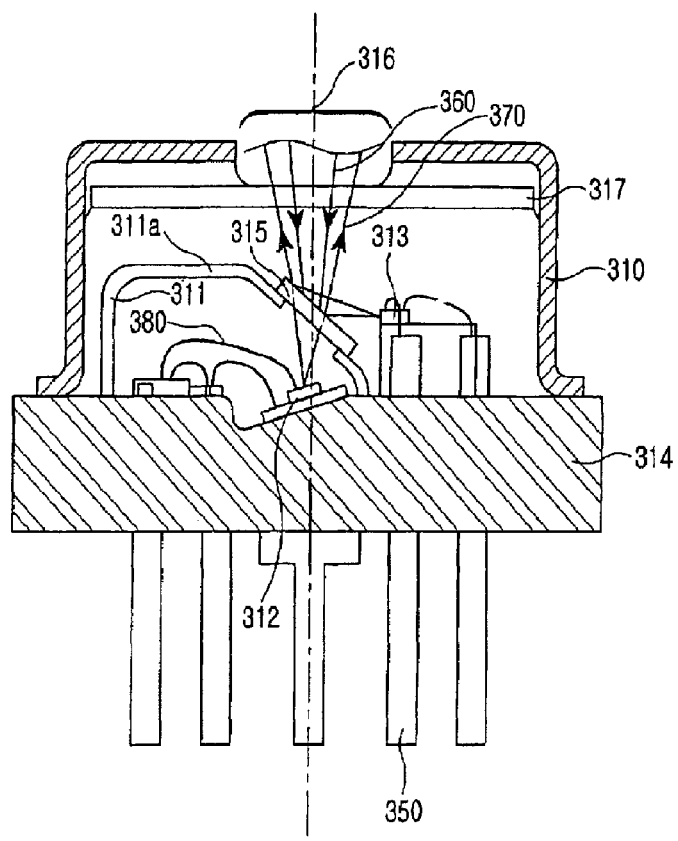

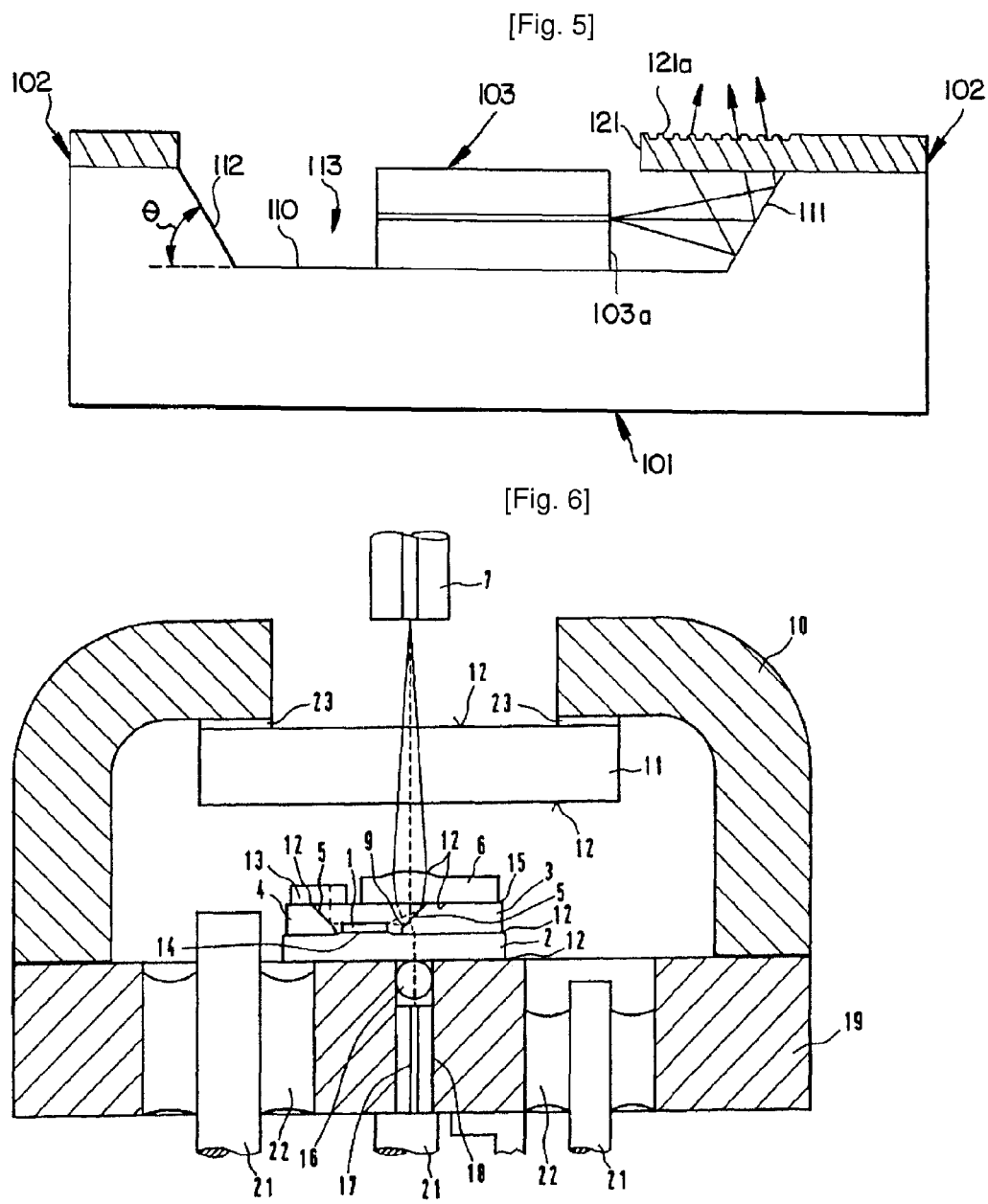

[Fig. 7]
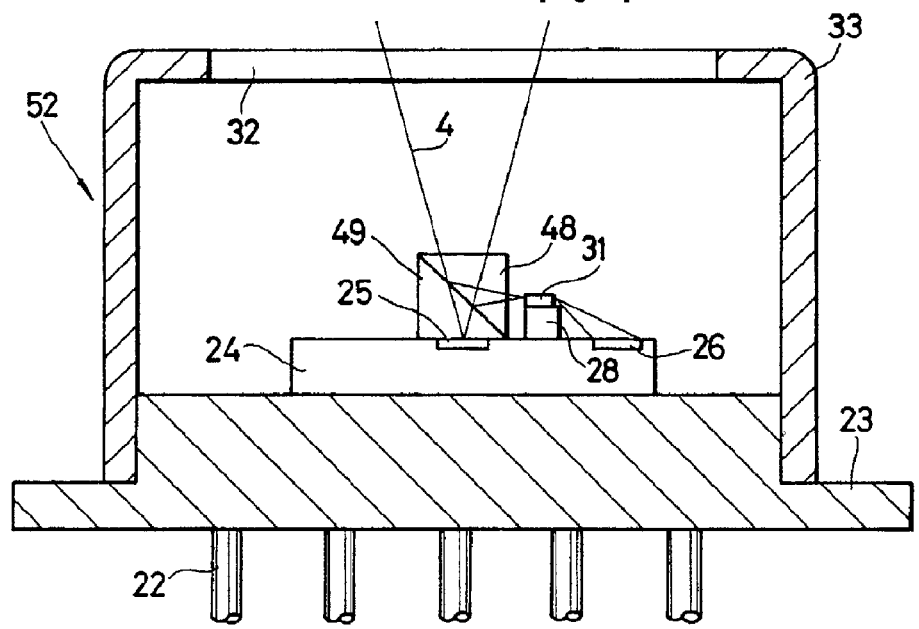
[Fig. 8]
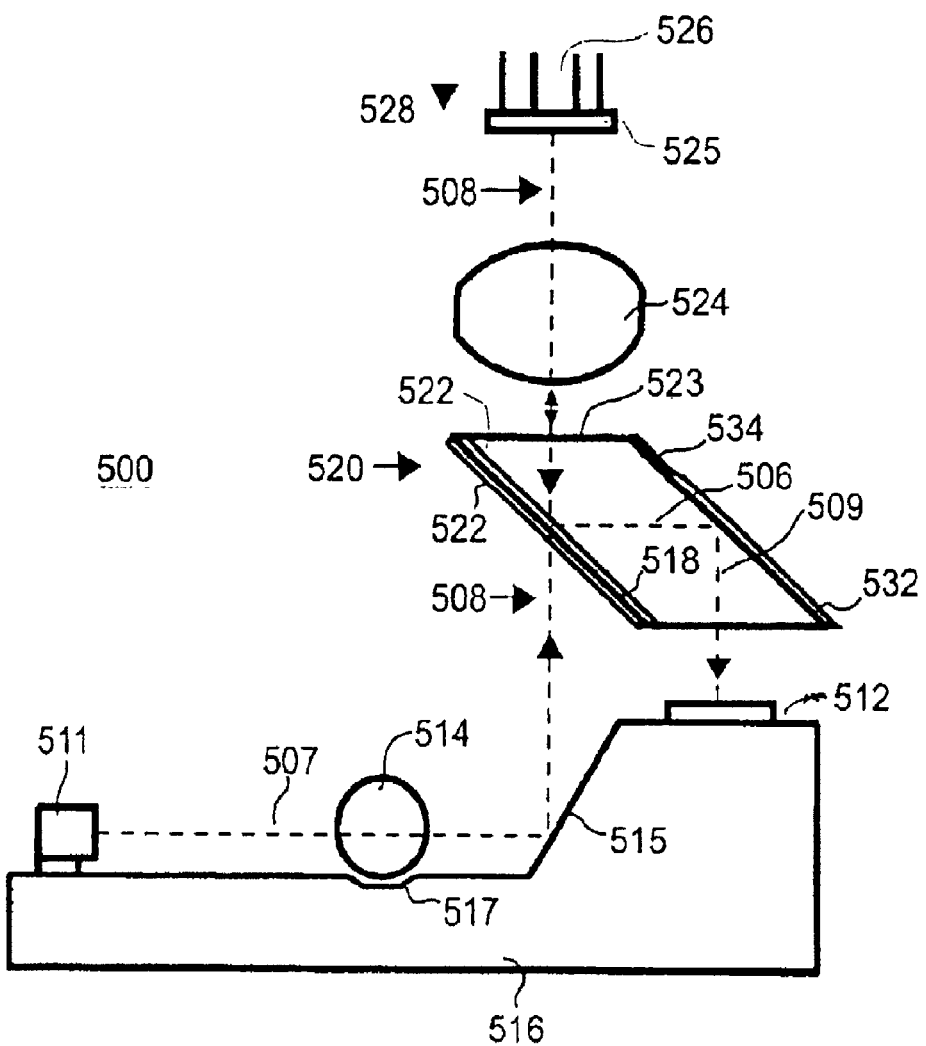

[Fig. 9]
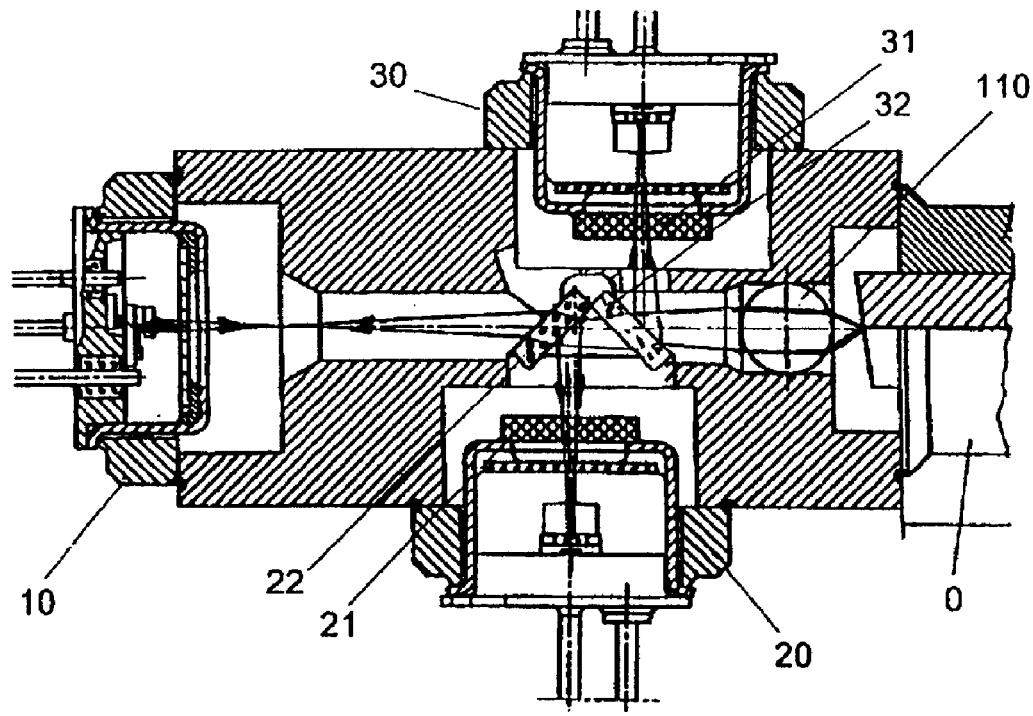
[Fig. 10]
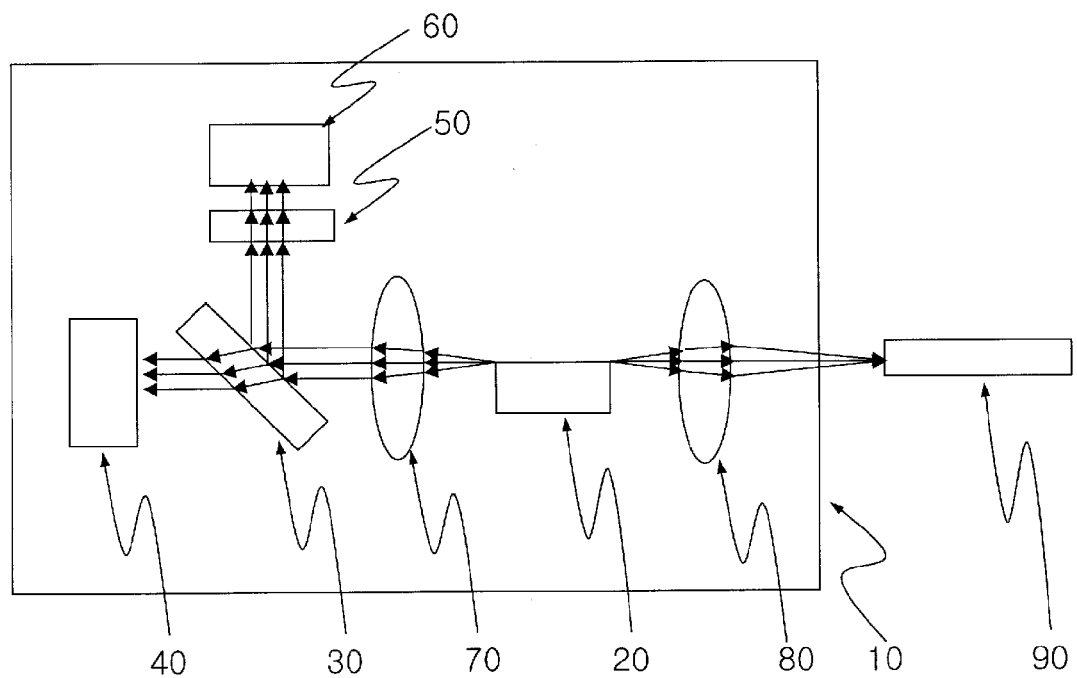

[Fig. 11]
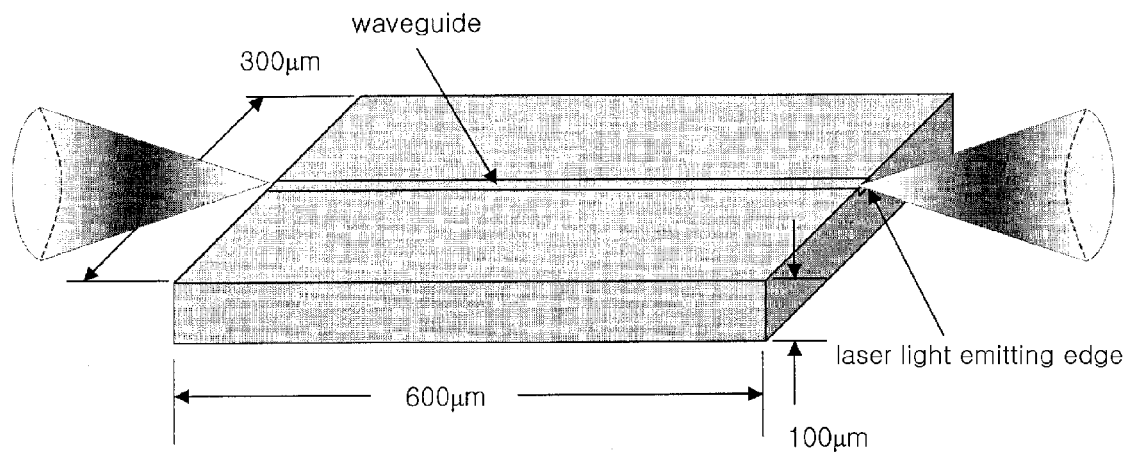
[Fig. 12]
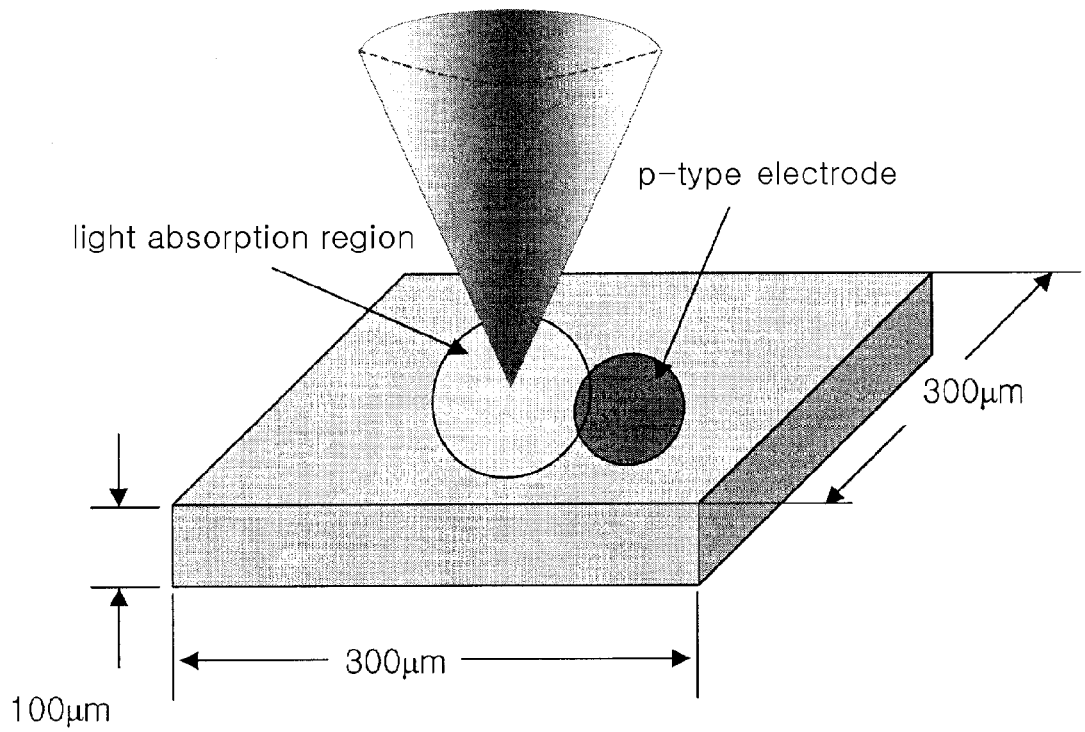

[Fig. 13]
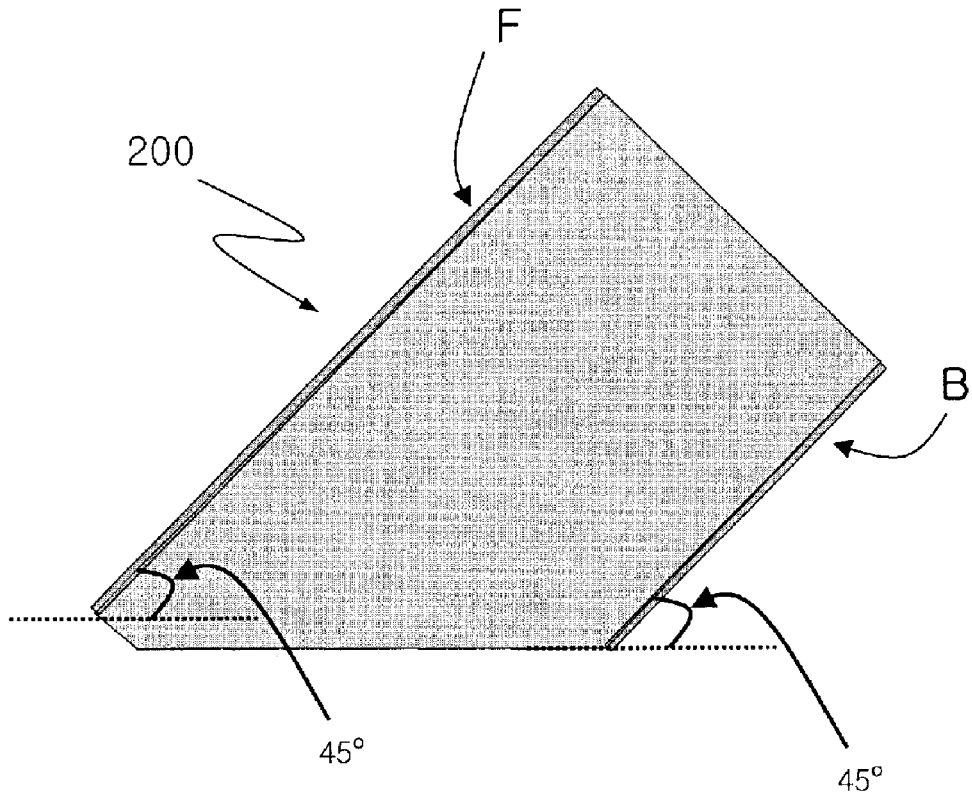
[Fig. 14]
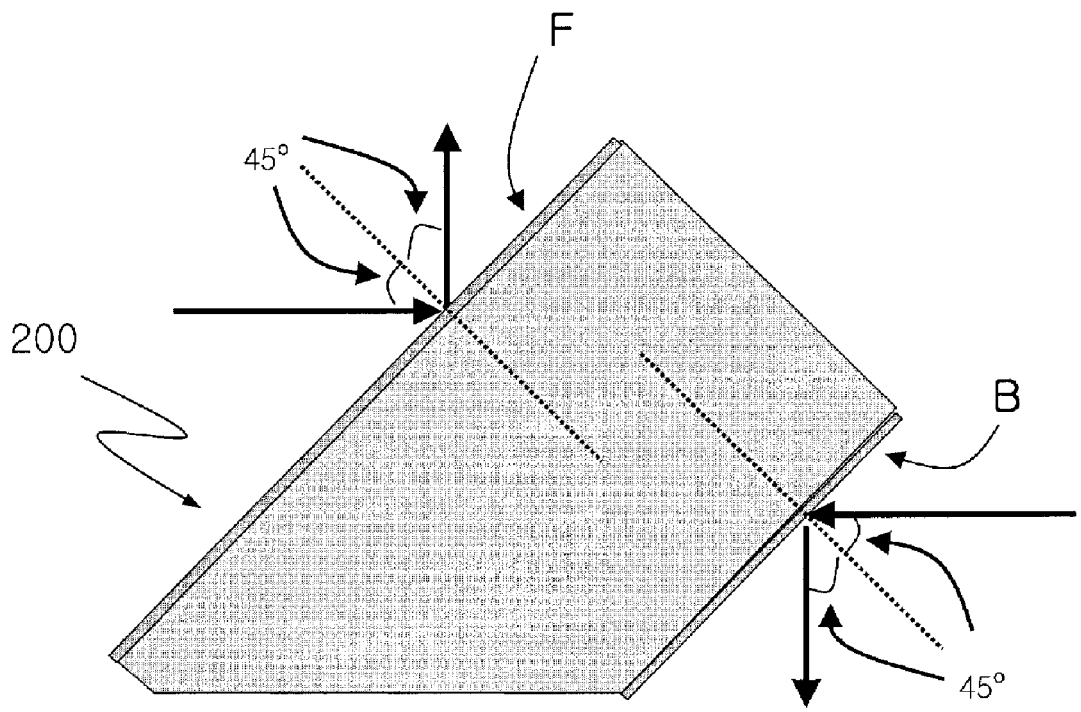

[Fig. 15]
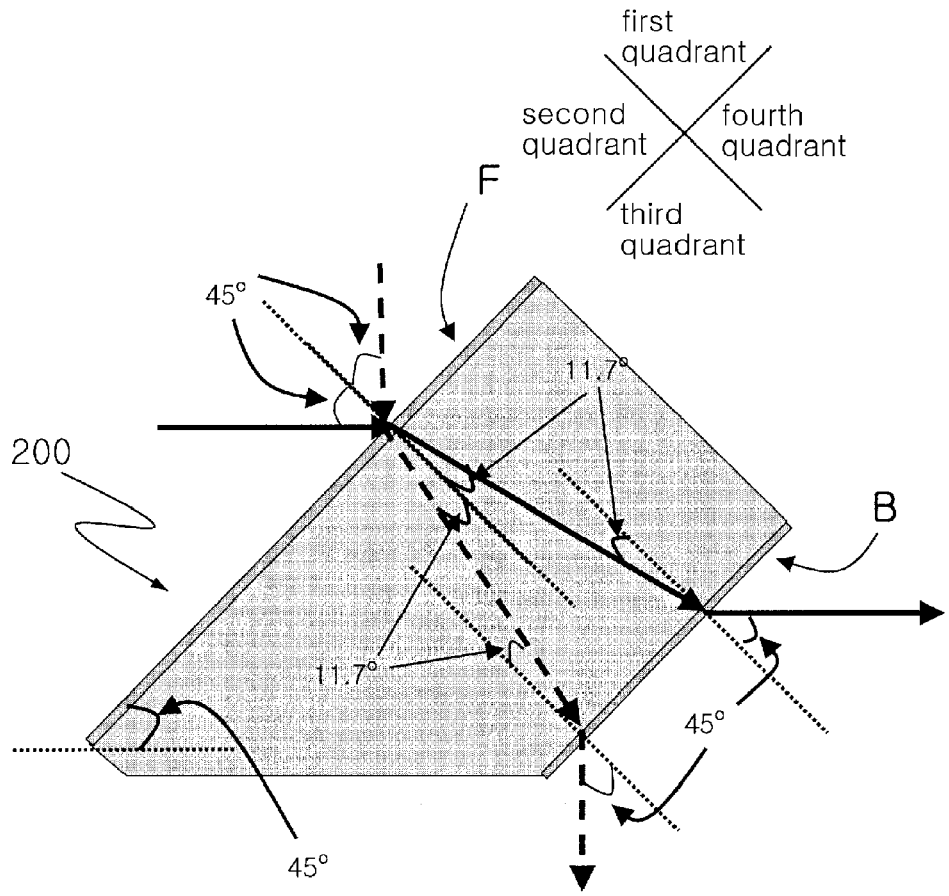
[Fig. 16]
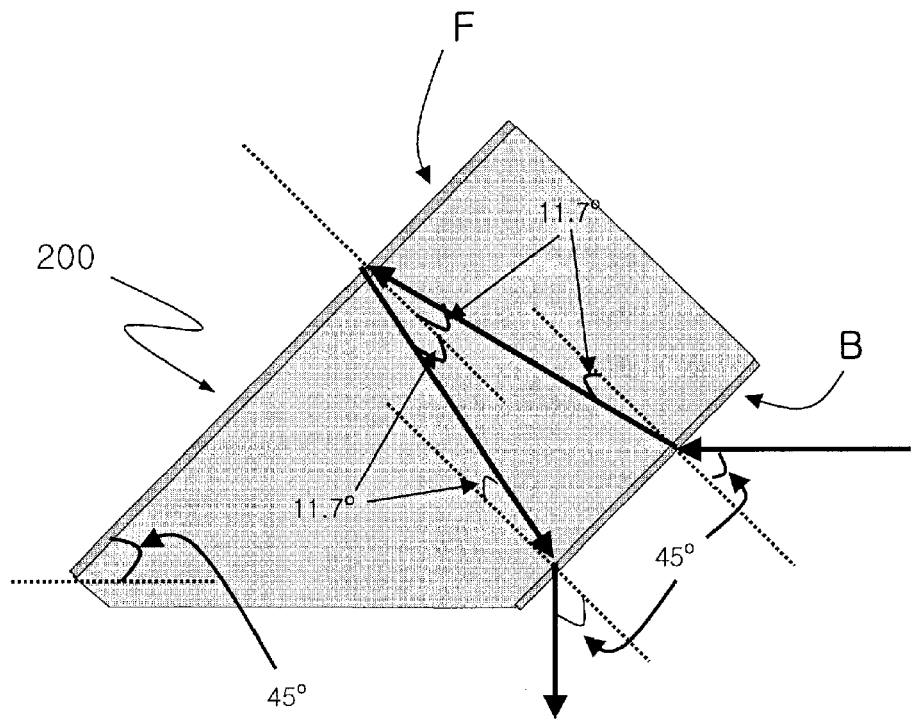

[Fig. 17]
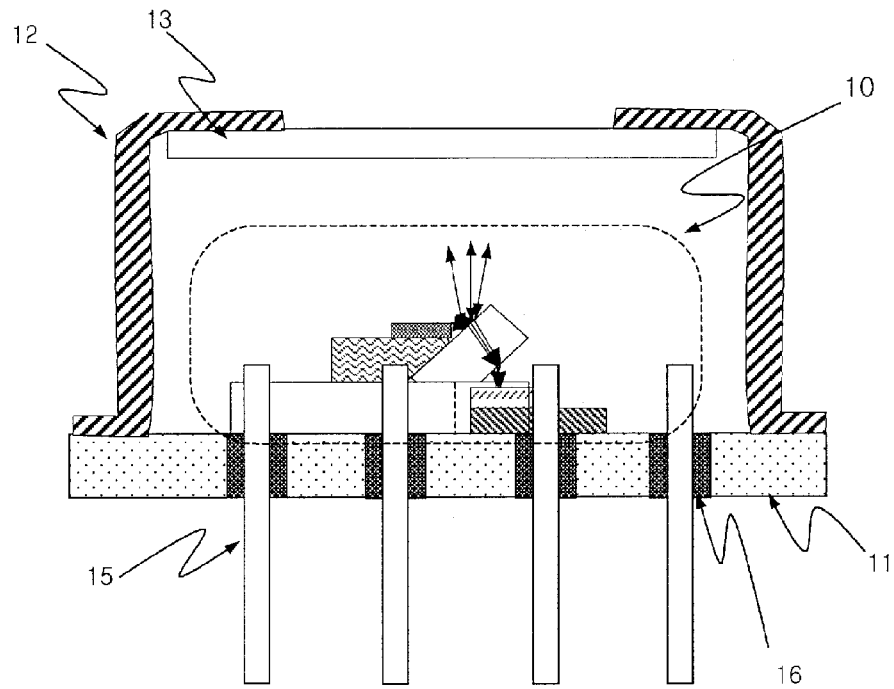
[Fig. 18]
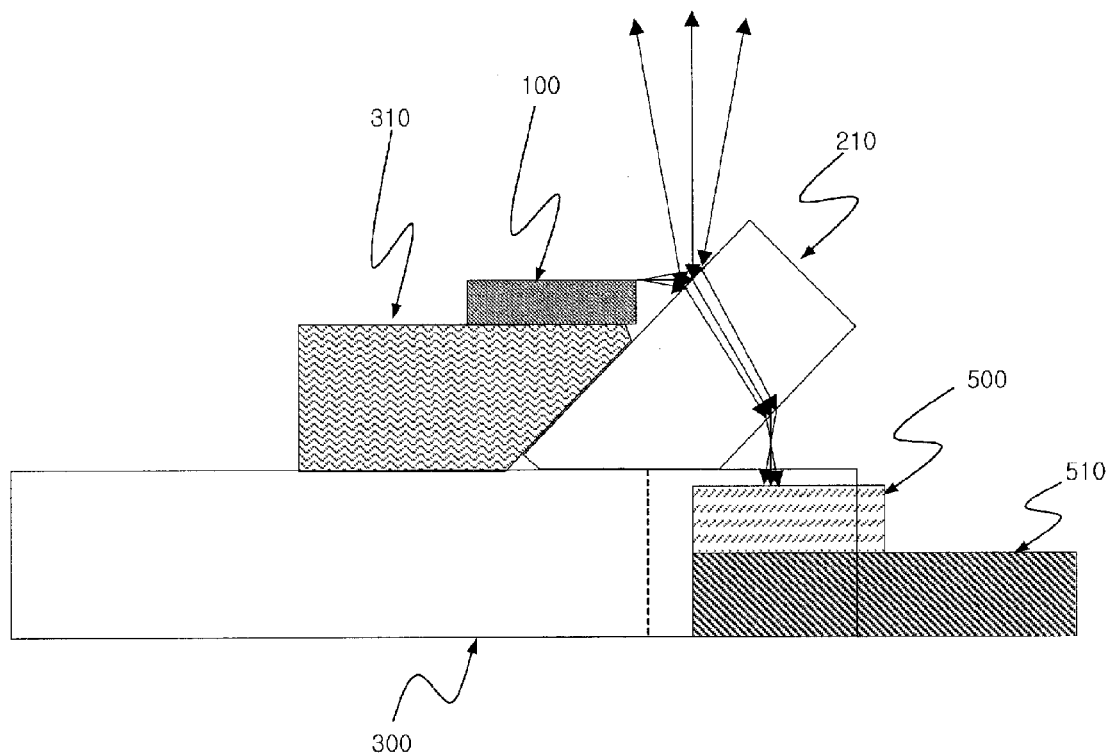

[Fig. 19]
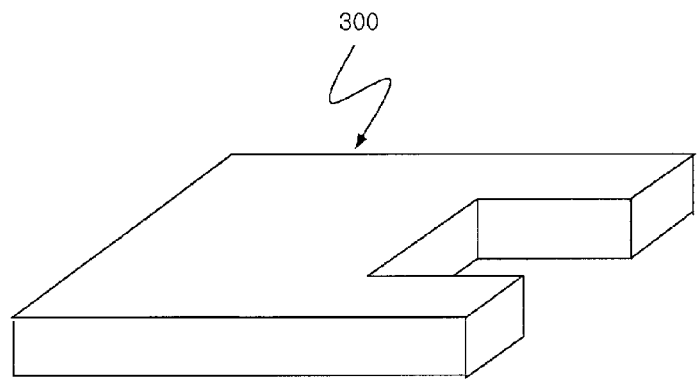
[Fig. 20]
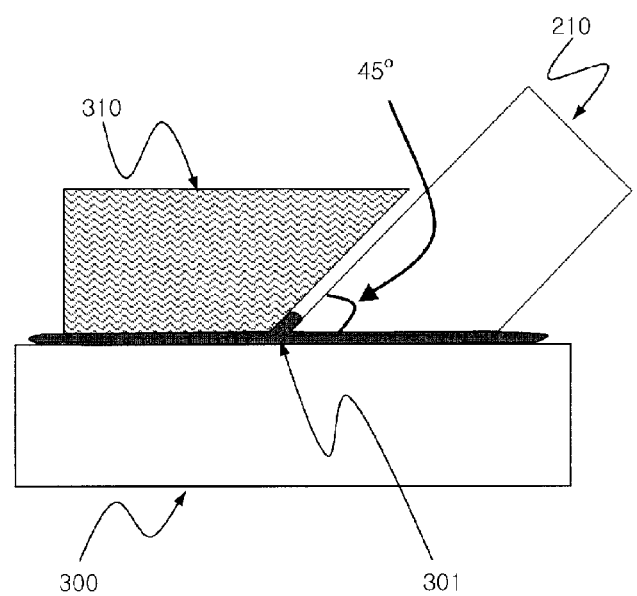
[Fig. 21]
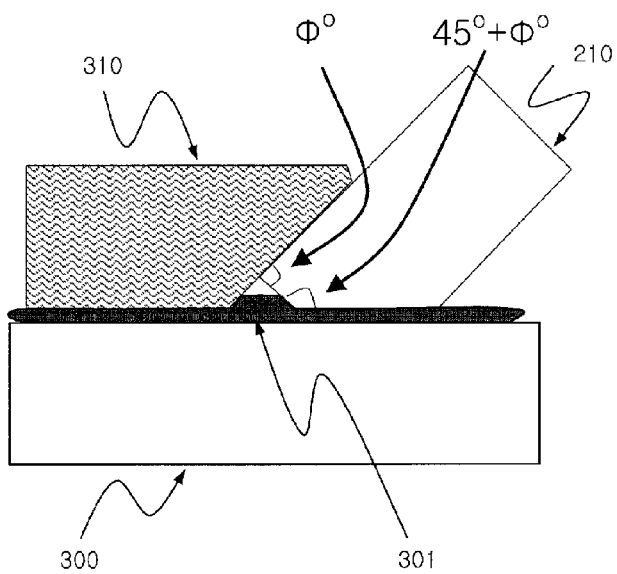

[Fig. 22]
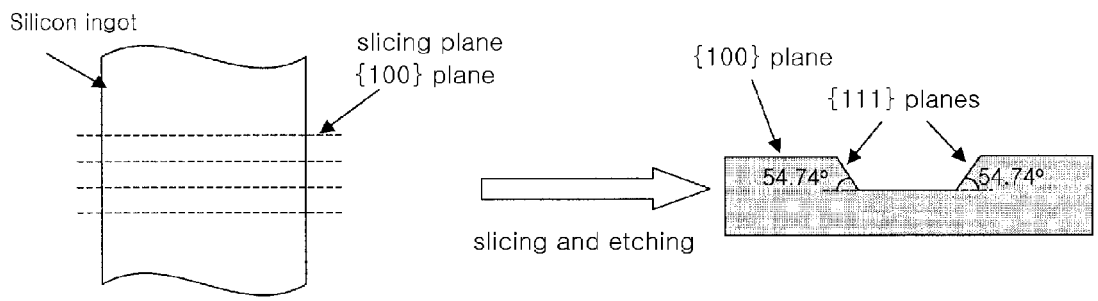
[Fig. 23]
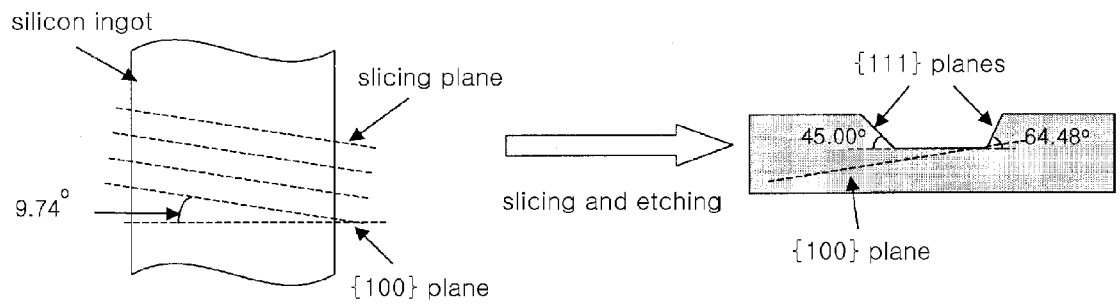
[Fig. 24]
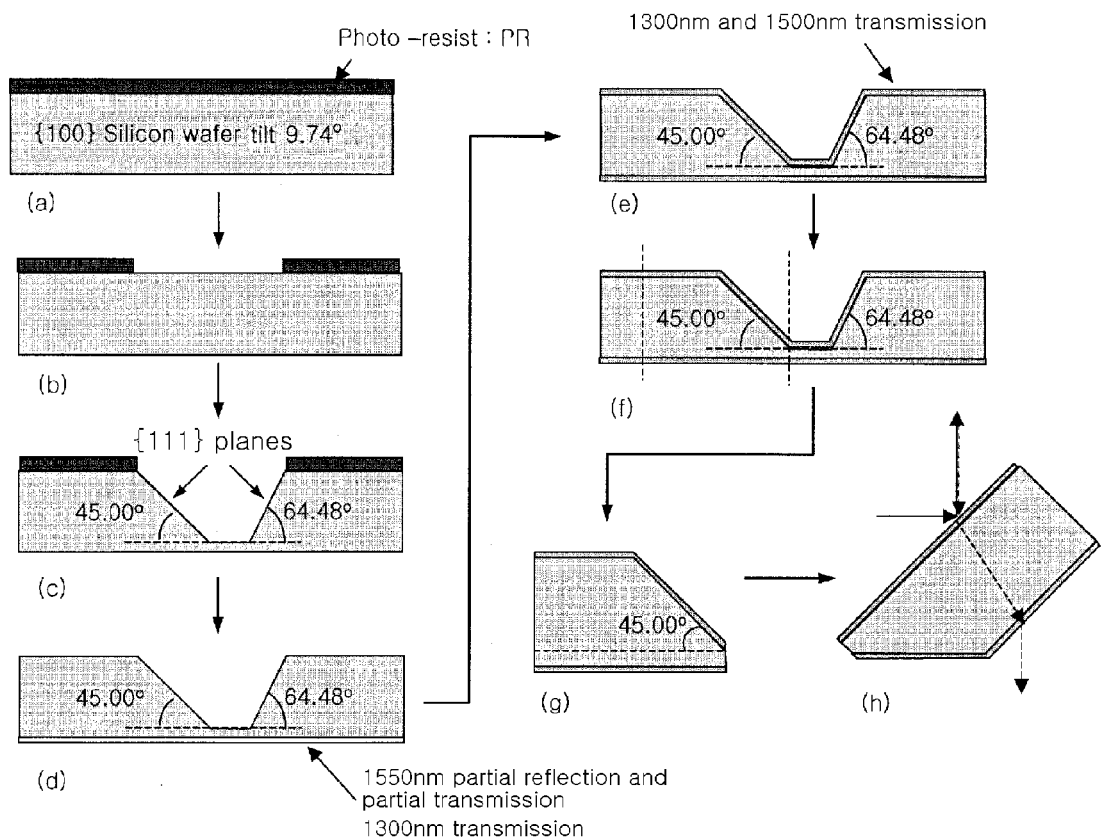

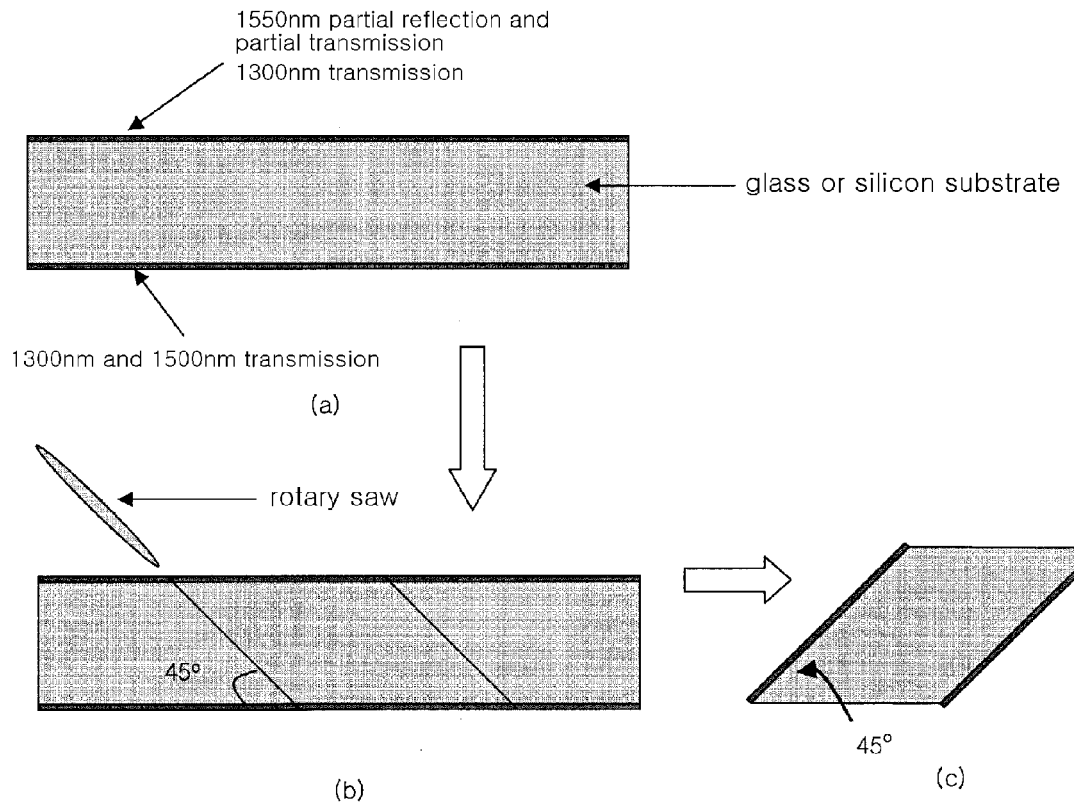
[Fig. 25]
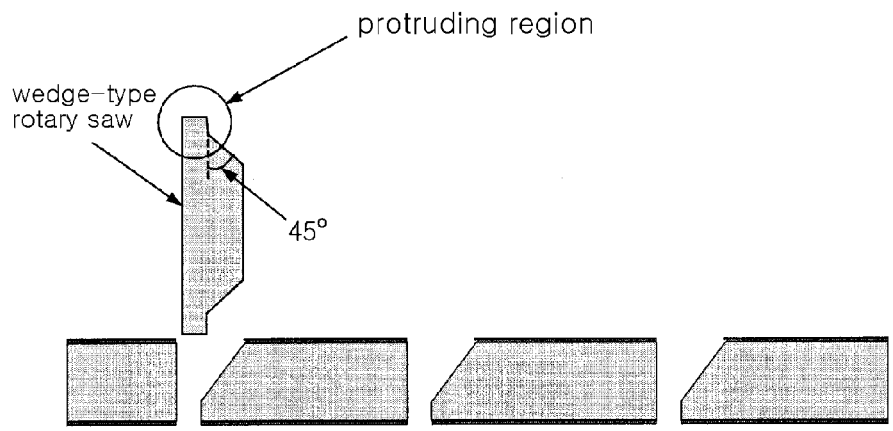
[Fig. 26]

[Fig. 27]
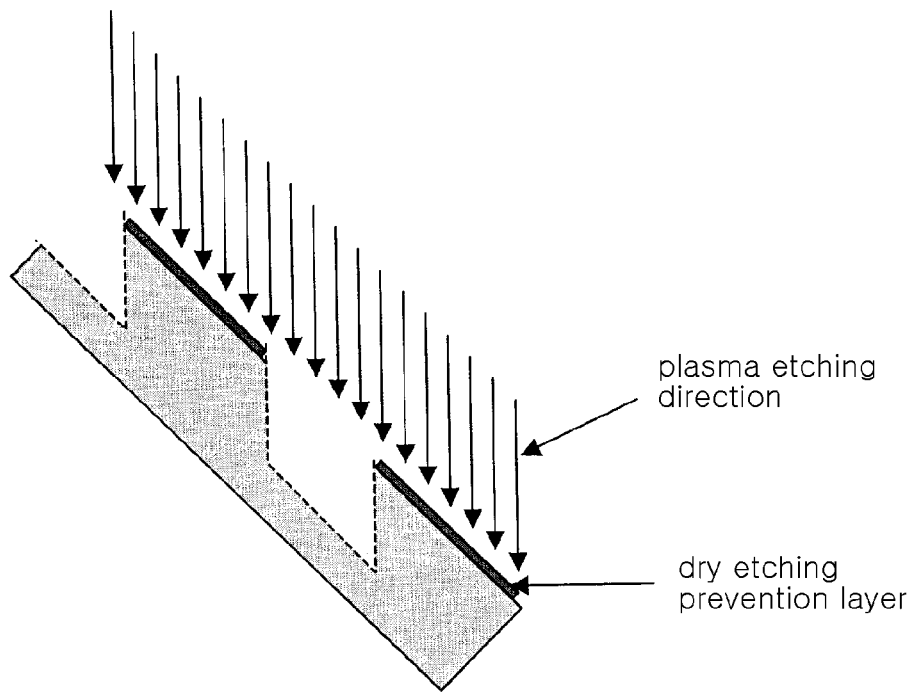
[Fig. 28]
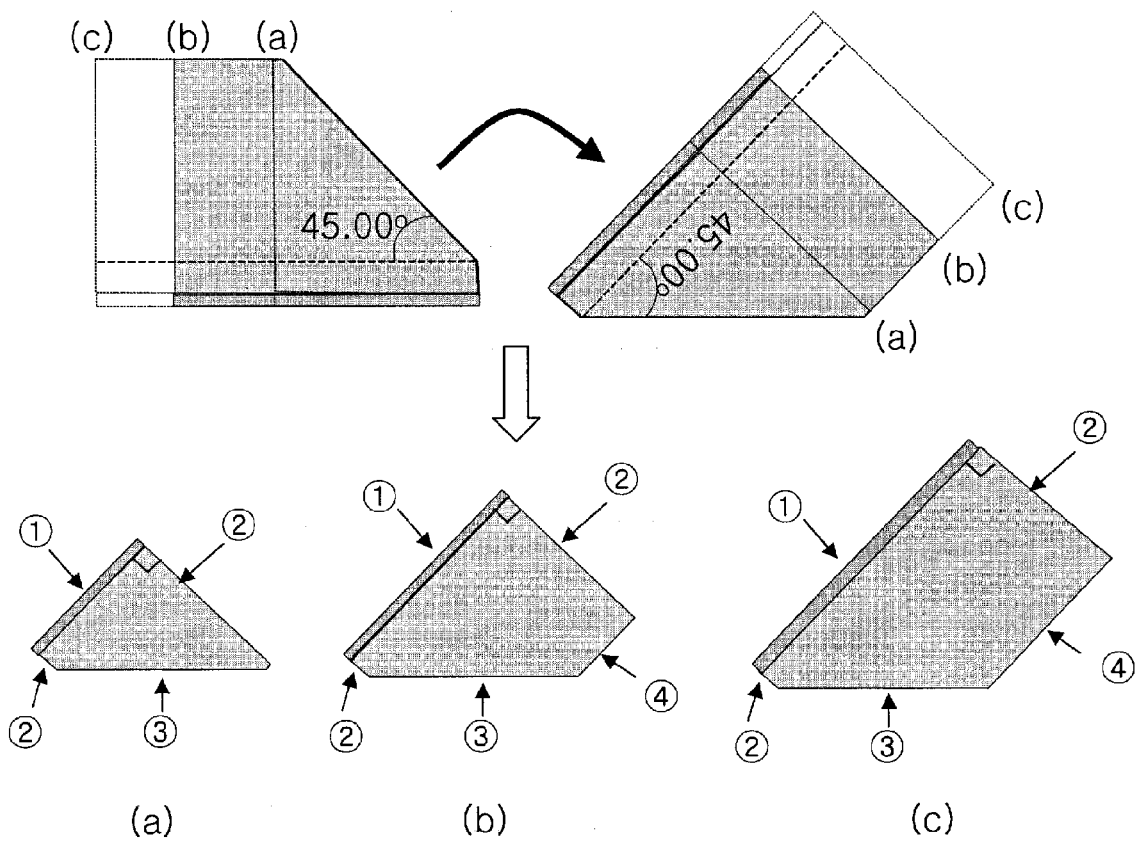

[Fig. 29]
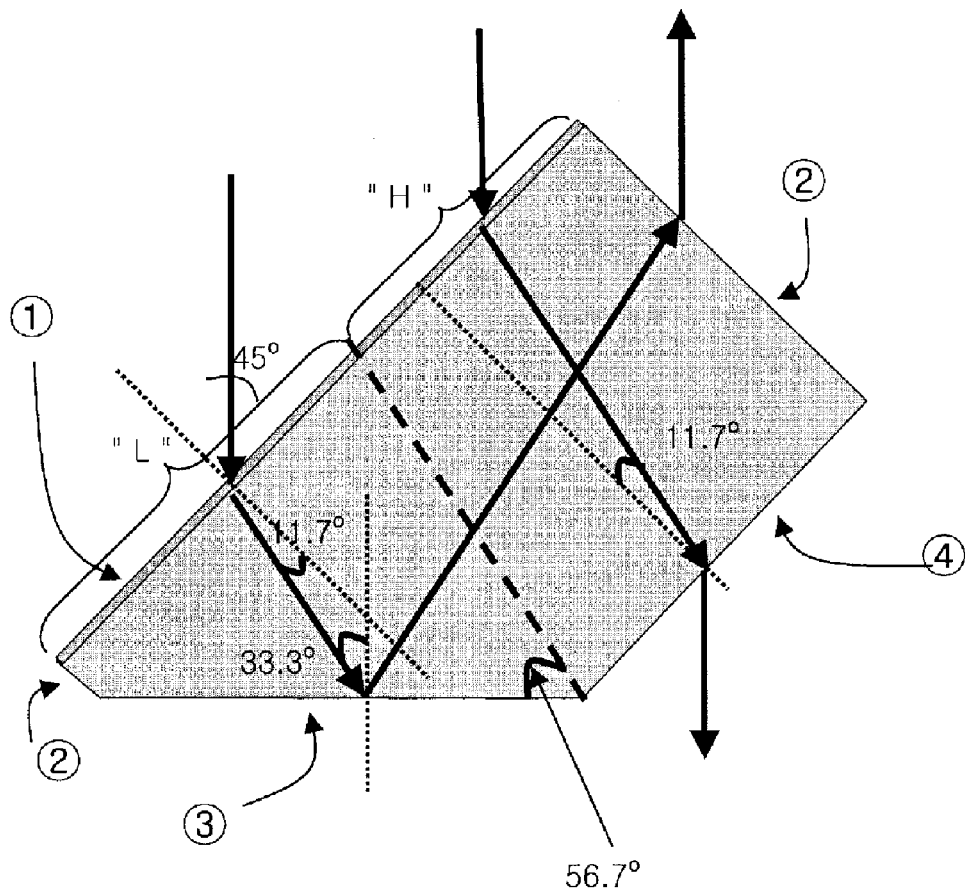
[Fig. 30]
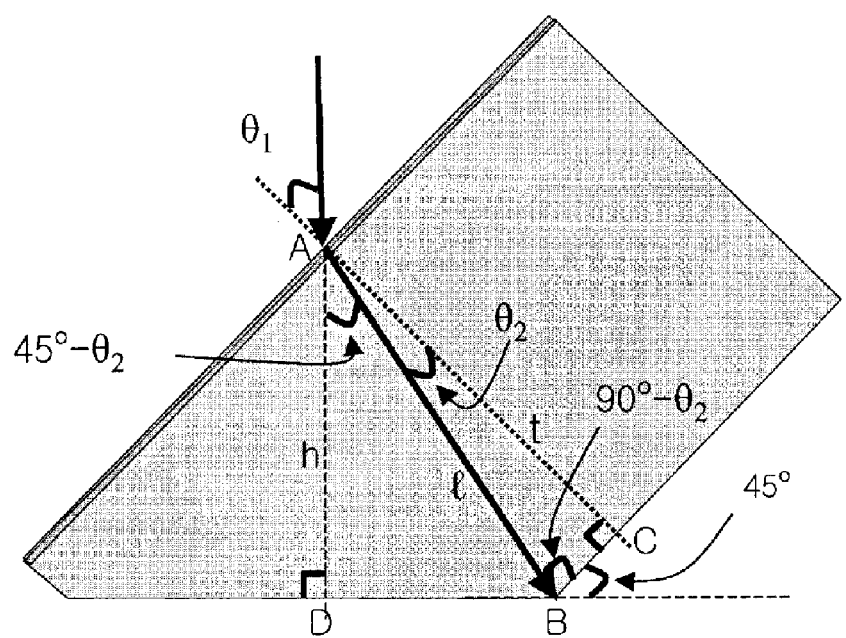

[Fig. 31]
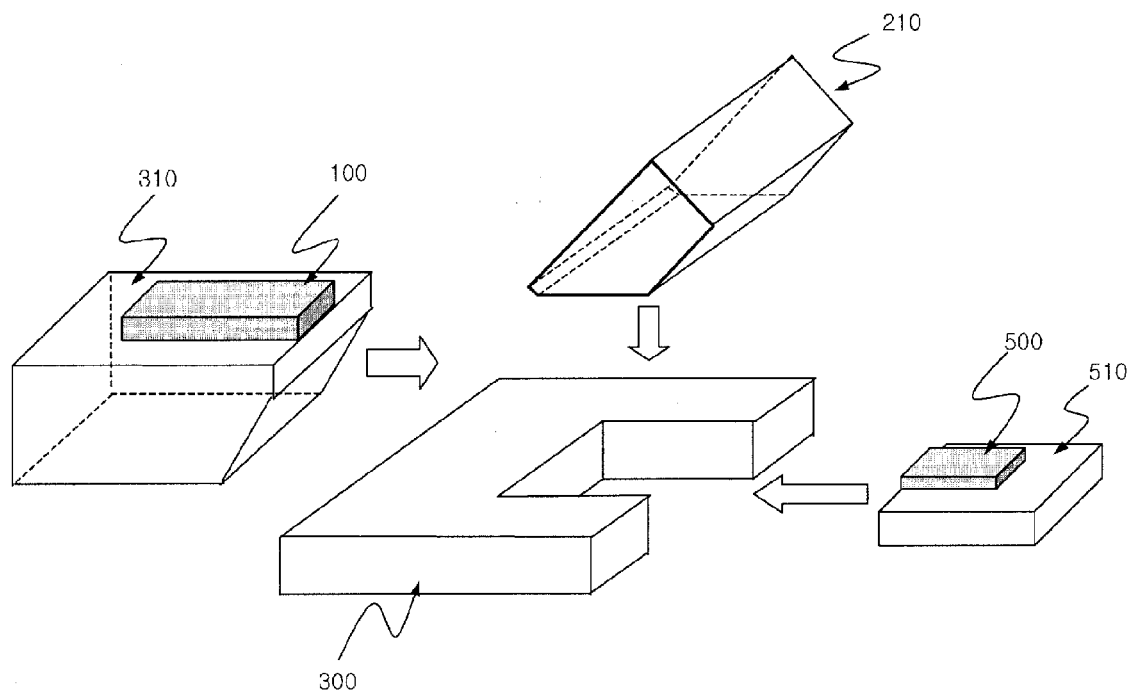
[Fig. 32]
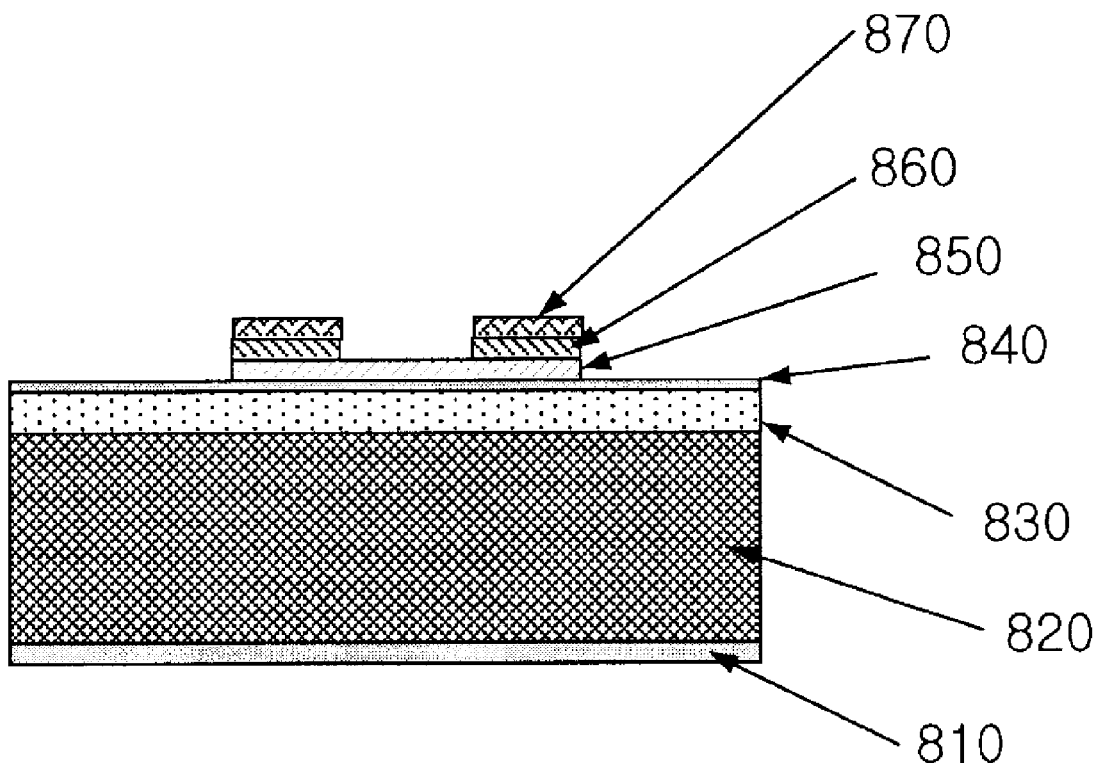

[Fig. 33]
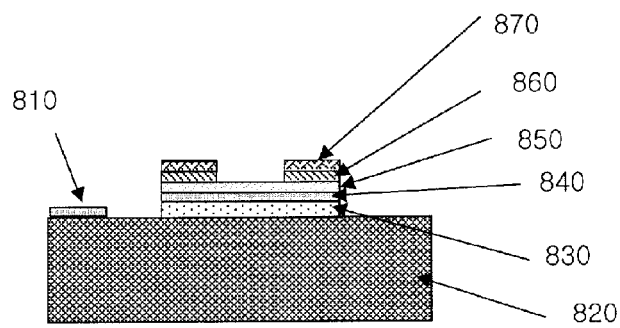
[Fig. 34]
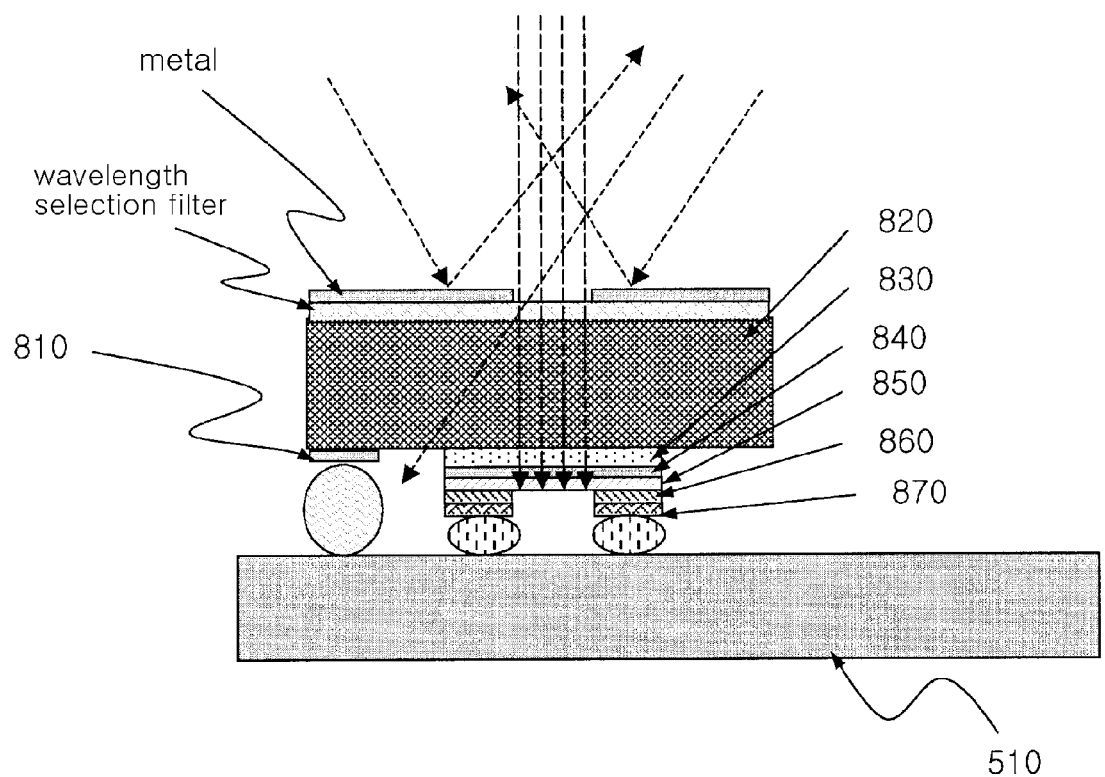

[Fig. 35]
diffusely reflected light
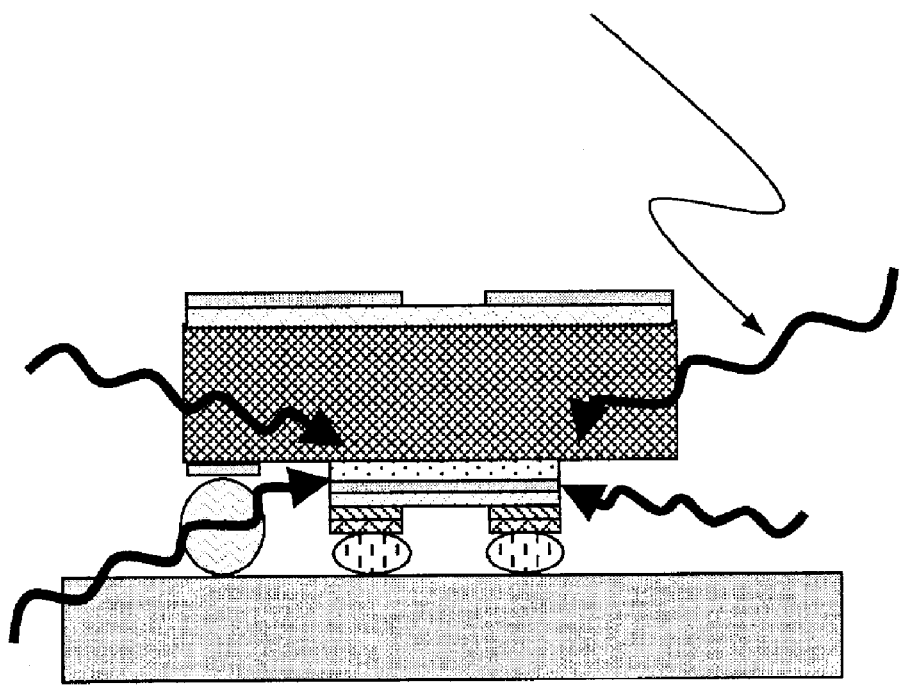
[Fig. 36]
material exhibiting electric insulating property and laser light interception property
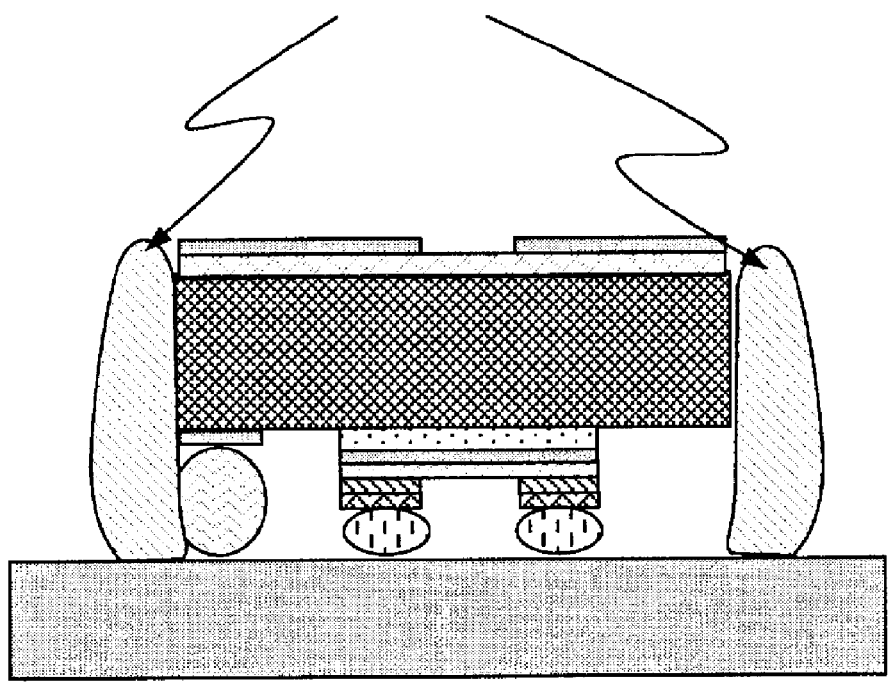

[Fig. 37]
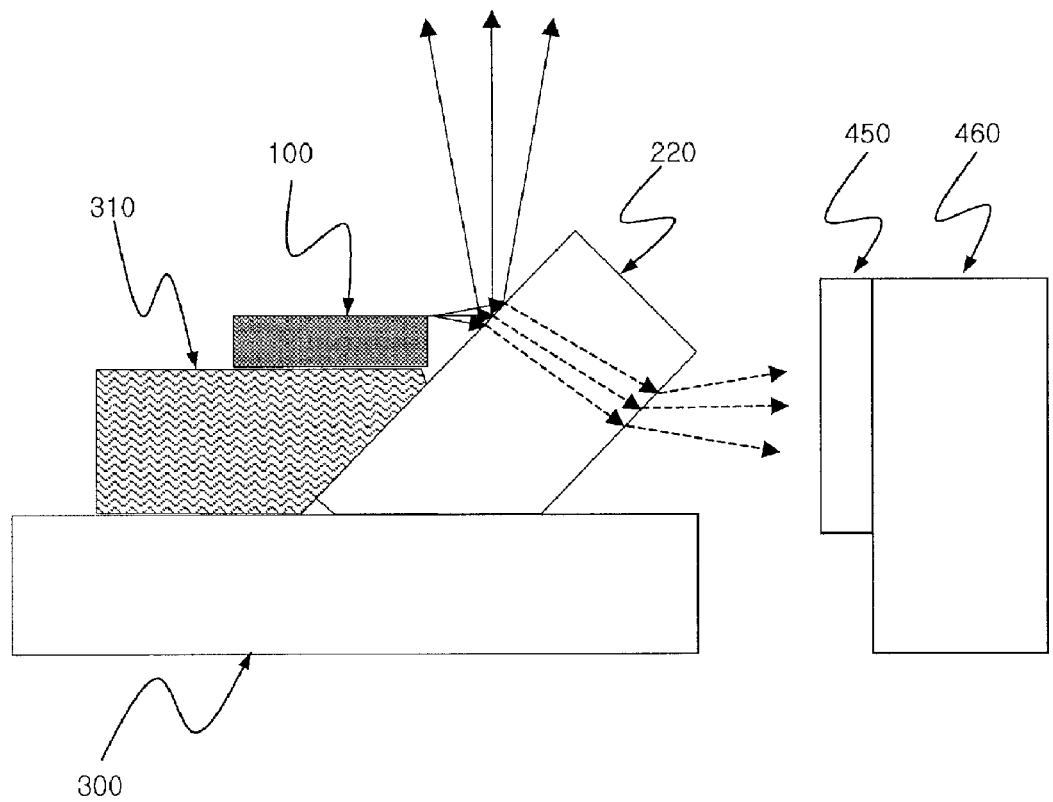
[Fig. 38]
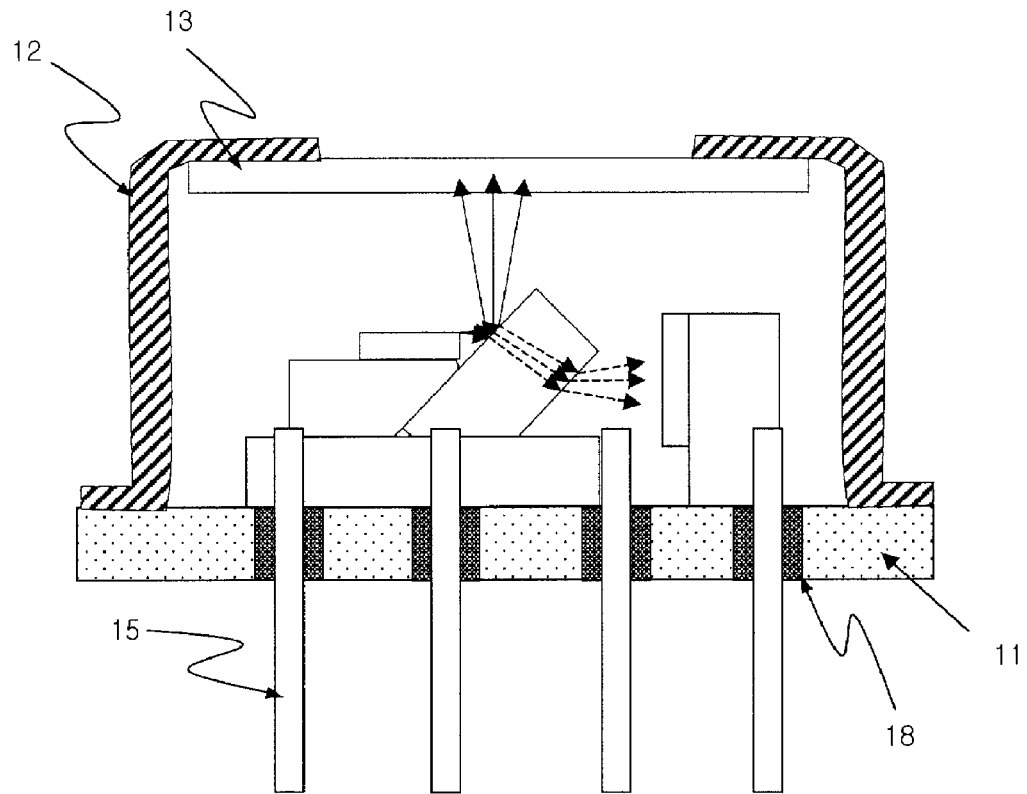

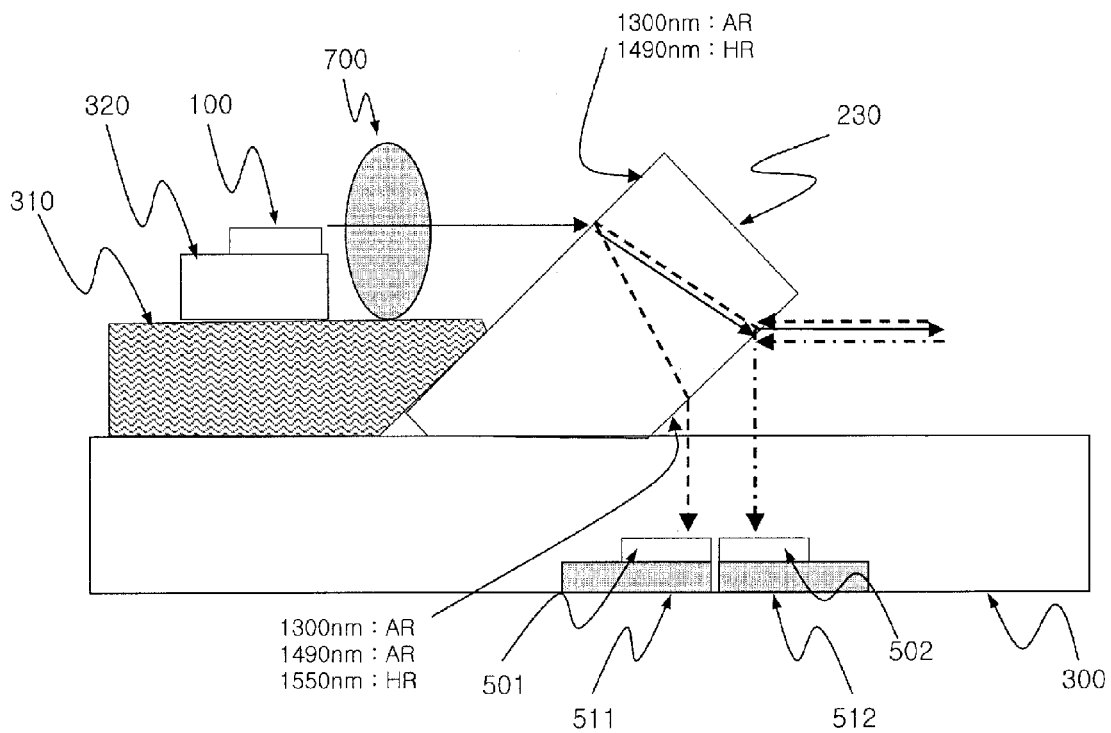
[Fig. 39]
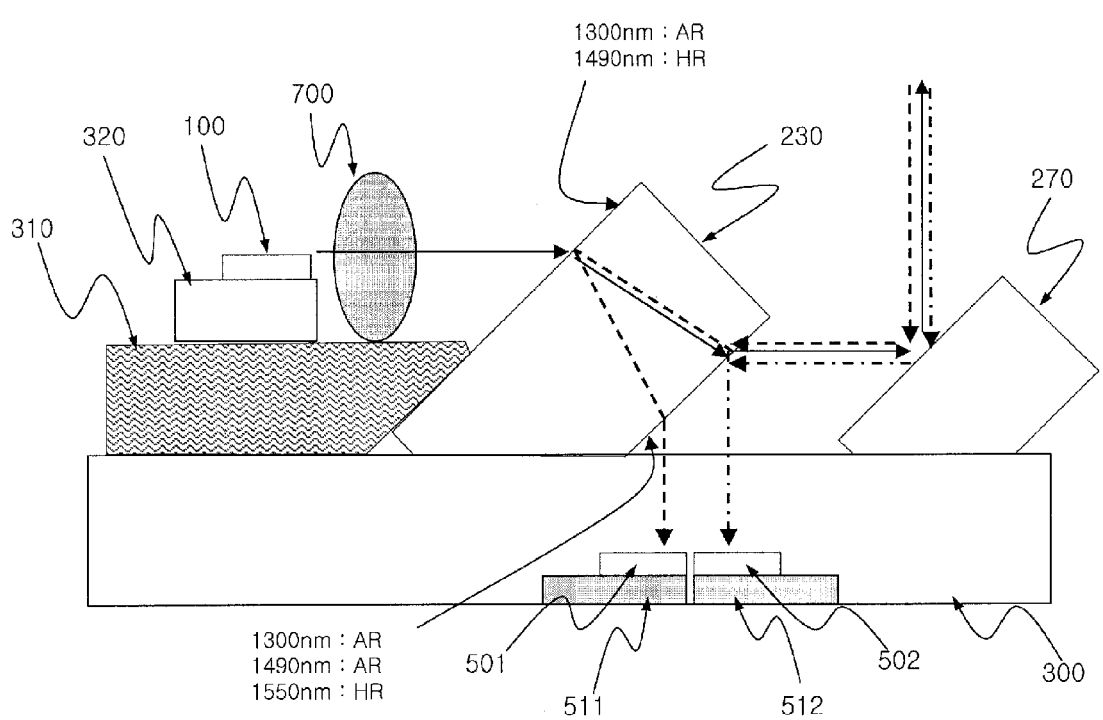
[Fig. 40]

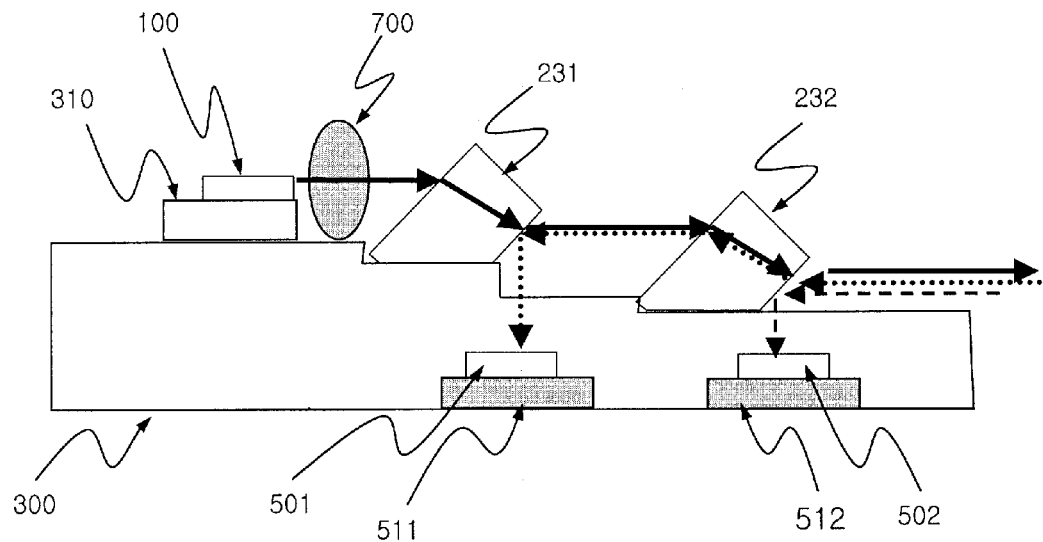
[Fig. 41]
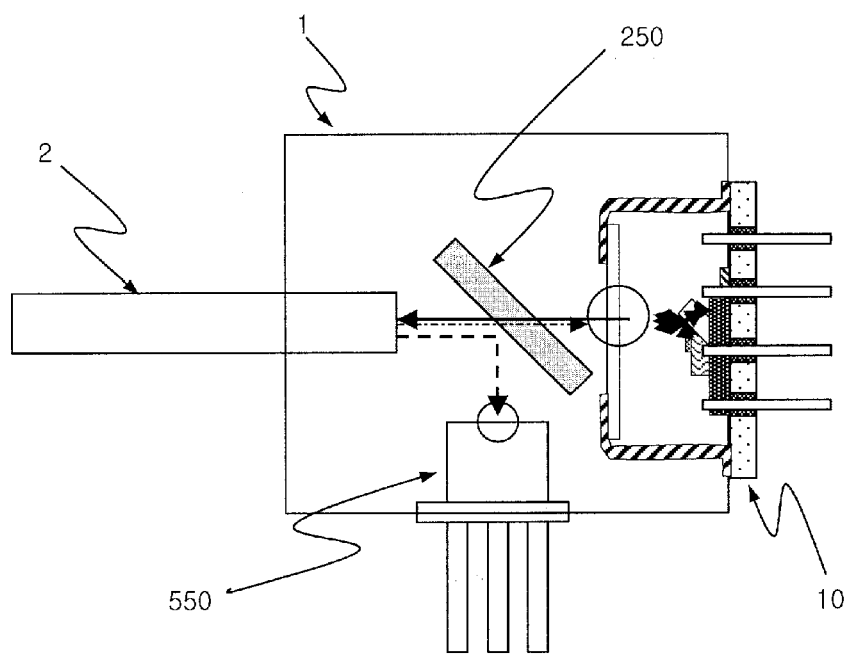
[Fig. 42]

[Fig. 43]
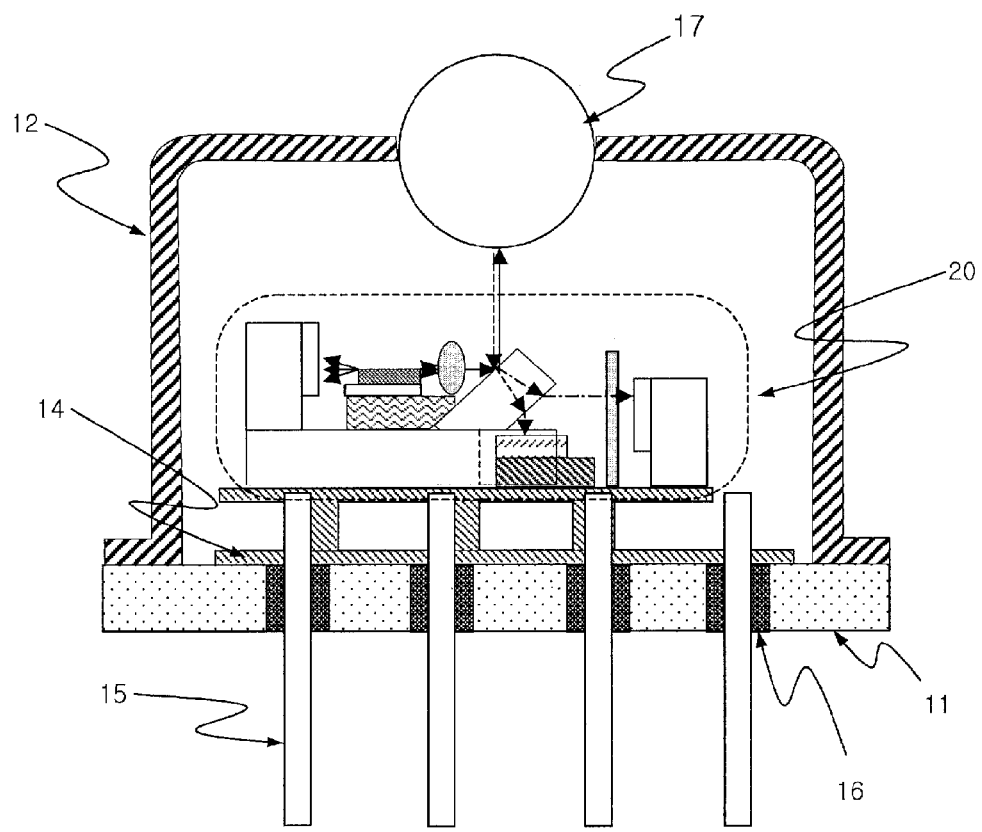
[Fig. 44]
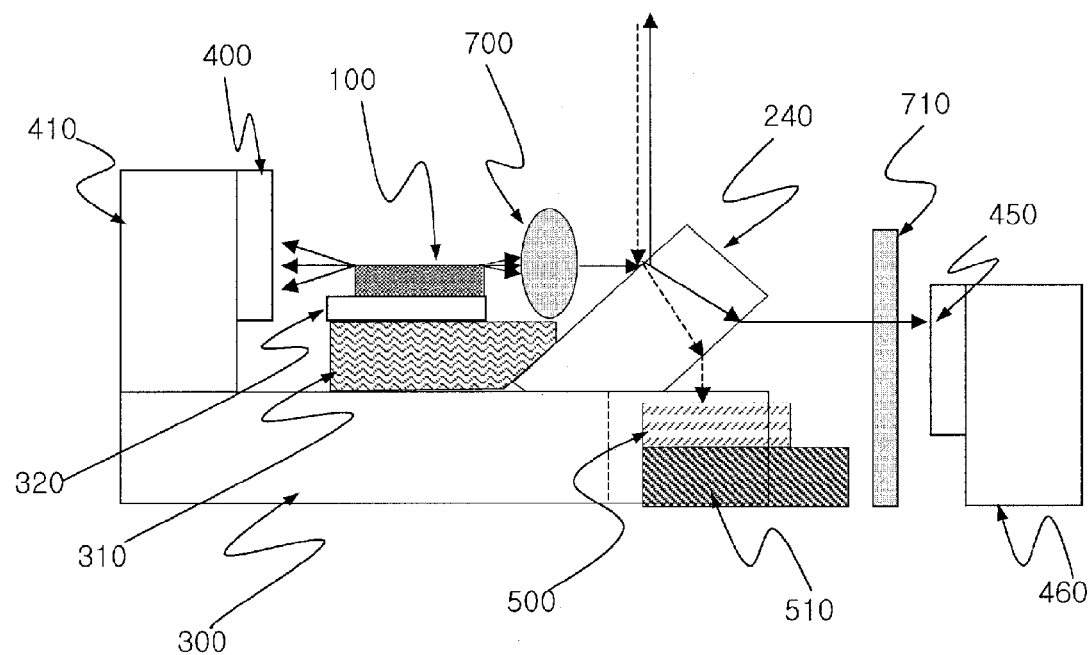

[Fig. 45]
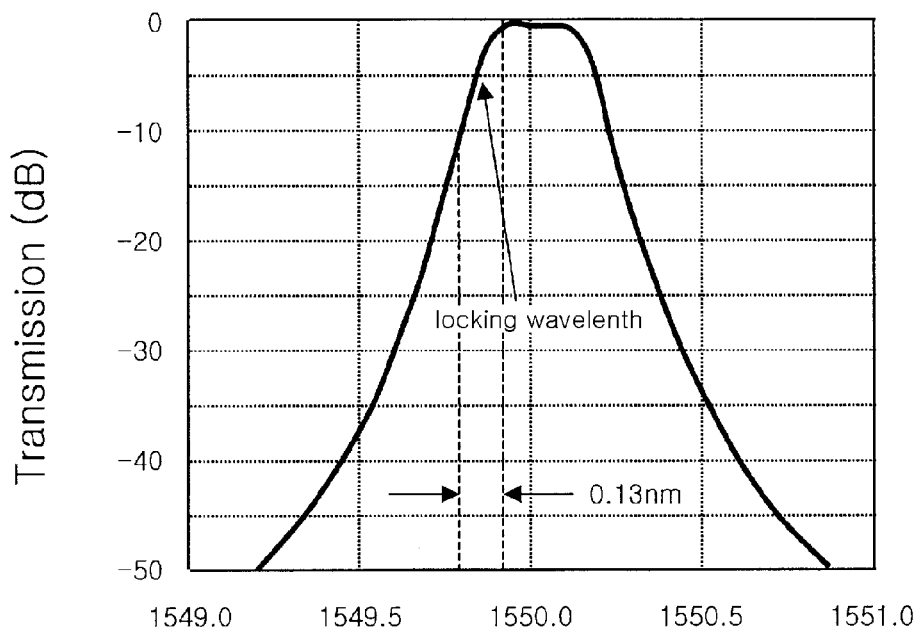
[Fig. 46]
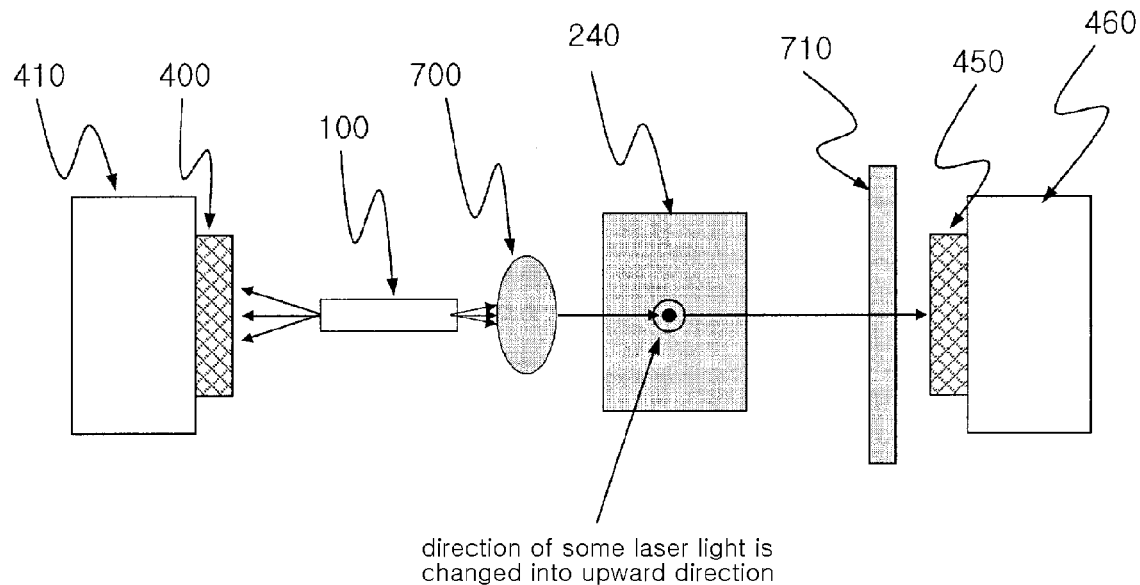

SELF-STANDING PARALLEL PLATE BEAM SPLITTER, METHOD FOR MANUFACTURING THE SAME, AND LASER DIODE PACKAGE STRUCTURE USING THE SAME

CROSS-REFERENCE TO RELATED APPLICATIONS

This application is the U.S. national phase of the International Patent Application No. PCT/KR2008/001520 filed Mar. 18, 2008, which claims the benefit of Republic of Korea Application No. 10-2007-0026558, filed Mar. 19, 2007; Republic of Korea Application No. 10-2007-0060267, filed Jun. 20, 2007; Republic of Korea Application No. 10-2007-0108008, filed Oct. 25, 2007; Republic of Korea Application No. 10-2007-0120602, filed Nov. 26, 2007; Republic of Korea Application No. 10-2008-0001466, filed Jan. 4, 2008; Republic of Korea Application No. 10-2008-0002613, filed Jan. 9, 2008; Republic of Korea Application No. 10-2008-0007104, filed Jan. 23, 2008; and Republic of Korea Application No. 10-2008-0020534, filed Mar. 5, 2008, the entire contents of which are incorporated herein by reference.

BACKGROUND

The present invention relates to a self-standing parallel plate beam splitter, a method for manufacturing the same, and a laser diode package structure using the same, and, more particularly, to a method for manufacturing a beam splitter that reflects or transmits light depending upon wavelengths of the light in the form of a self-standing parallel plate, a bidirectional-communication laser diode package structure manufactured using such a self-standing parallel plate beam splitter, and a laser diode package structure having triplexer and wavelength locking functions.

In recent years, optical communication using light as an information communication medium for large-capacity information transmission and high-speed information communication has been generalized. Consequently, it is possible to easily convert an electric signal of 10 Gbps (giga bit per sec) into laser light using a semiconductor laser diode chip having a width and length of approximately 0.3 mm. Also, it is possible to easily convert an optical signal transmitted through an optical fiber into an electric signal using a semiconductor light receiving device. Light is an energy wave exhibiting a very peculiar property. It is required for various lights simultaneously existing at a certain region to have the same wavelength, the same phase, and the same advance direction in order that the lights interact with one another. Consequently, the interference between lights is very low. For this reason, it is preferred to use a wavelength division multiplexing (WDM) type optical communication for simultaneously transmitting lights having different wavelengths through a single optical fiber using such a property of the lights. In the WDM type optical communication, the optical fiber, which is a signal transmission medium, is shared, with the result that optical fiber installation costs are reduced. Consequently, the WDM type optical communication is a very economical communication method. The WDM method is a technology for transmitting and receiving laser lights having different wavelengths through a single optical fiber. The WDM method is being commercialized in several communication fields now because the WDM method maximizes the capacity of information transmission using a single optical fiber. The WDM method is classified as a coarse WDM (CWDM) method, which is used when the difference between the wavelengths of the laser lights is great, or a dense WDM (DWDM).

The CWDM method may be classified as a communication method using laser light having a 1300 nm (nano meter) wavelength band and laser light having a 1490 nm or 1550 nm wavelength band or as a communication method simultaneously using all the wavelengths, i.e., 1300 nm, 1490 nm, and 1550 nm. In recent years, a fiber to the home (FTTH) method for connecting an optical fiber to the inside of a home of a communication subscriber has been increasingly generalized. The FTTH method, in which the optical fiber is drawn to the inside of the home of the communication subscriber to perform optical communication, needs an upstream optical communication mode, in which an optical signal is generated in the home of the communication subscriber and the generated optical signal is transmitted to a base station for optical communication, and a downstream optical communication mode, in which an optical signal transmitted from the base station for optical communication is converted into an electric signal. There has been proposed an optical communication method using an optical fiber for processing an upstream optical communication signal and an optical fiber for processing a downstream optical communication signal, wherein the optical fiber for processing the upstream optical communication signal and the optical fiber for processing the downstream optical communication signal are separately installed. However, this method brings about waste of optical fibers.

In recent years, therefore, a bidirectional optical communication method for transmitting an upstream optical signal and a downstream optical signal using a single optical fiber has been widely adopted. A light receiving device for receiving an optical signal downstream-transmitted through the optical fiber and converting the received optical signal into an electric signal and a light transmitting device for converting an electric signal into an optical signal and transmitting the converted optical signal through the optical fiber are integrated to manufacture a module that can be optically coupled to a single optical fiber, which is commonly referred to as a bidirectional (BiDi) module. For the BiDi module, it is required that a light transmitter and a light receiver of the BiDi module be simultaneously optically connected to a single optical fiber. Consequently, the BiDi module needs a function to adjust the advance direction of light depending upon the wavelength of the light.

FIG. 1 is a schematic view illustrating a typical BiDi module that is presently commercialized. The BiDi module is manufactured based on a transistor outline (hereinafter, referred to as a "TO") type laser diode module and a TO type light receiving module. In the structure as shown in FIG. 1, the advance direction of an optical signal of a wavelength emitted from an optical fiber 2 is changed 90 degrees by a 45-degree filter 3 having wavelength selectivity, and is then incident on a TO type light receiving device 5, disposed below the 45-degree filter 3, with the result that the optical signal is converted into a current signal. Laser light of a wavelength emitted from a TO type laser diode module 4 is transmitted through the 45-degree filter 3 and is then condensed to the optical fiber 2. A filter having a function to reflect or transmit light, depending upon the wavelength of the light, to divide the light is called a beam splitter. In the BiDi module, i.e., the module for bidirectional optical communication, therefore, the beam splitter, which changes the advance path of light depending upon the wavelength of the light, plays an important role. On the beam splitter is deposited a material exhibiting a property to transmit or reflect light depending upon the wavelength of the light. However, the conventional BiDi module needs two TO type optical modules and a beam splitter to separately process the upstream optical signal and the downstream optical signal. In addition, a housing 1 is further needed to fix the TO type optical modules and the beam splitter. As a result, the structure of the BiDi module is complicated, and a large number of parts are needed to manufacture the BiDi module, with the result that the manufacturing costs of the BiDi module increase.

Also, the installation angle of the beam splitter may deviated from a desired angle when the beam splitter, the TO type laser diode module, and the TO type light receiving device are assembled. When the installation angle of the beam splitter may deviated from the desired angle, the position of light, which is incident from the optical fiber, is reflected by the beam splitter, and is then incident on a photo diode chip installed in the TO type light receiving device, changes. The position of light incident on the photo diode chip is decided based on the accuracy in installation angle of the beam splitter and the distance between the beam splitter and the photo diode chip. When the distance between the beam splitter and the photo diode chip is small, the alignment error of the beam splitter decreases, and the position error of light incident on the photo diode chip decreases, with the result that the positional alignment of the photo diode chip is easily carried out. Consequently, decreasing the distance between the beam splitter and the photo diode chip is an important factor that easily increases assembly accuracy and thus improves productivity. In the above, decreasing the distance between the beam splitter and the photo diode chip was discussed. However, this discussion may also be applied to decrease the distance between the beam splitter and a laser diode chip installed in the laser diode module. Therefore, decreasing the distance between the beam splitter and the laser diode chip and the distance between the beam splitter and the photo diode chip is a method for increasing margins on alignment errors of the respective optical parts, in addition to the reduction of a space, and therefore, improving assembly productivity. Consequently, a possible method for minimizing the distance between the beam splitter and the laser diode chip or the distance between the beam splitter and the photo diode chip will be a very important technical factor that greatly improves productivity.

Meanwhile, there have been proposed several methods for assembling the BiDi module using a method for reflecting laser light emitted from the laser diode module at the incline plane of the beam splitter to change the advance direction of the laser light and transmitting laser light for reception through the incline plane of the beam splitter.

FIG. 2 is a conceptional view of U.S. Pat. No. 4,733,067 to which one of such assembling methods is applied. The U.S. Pat. No. 4,733,067 shown in FIG. 2 discloses a module including a prism as the beam splitter and constructed in a structure in which the prism changes the advance direction of laser light horizontally incident on the side thereof by 90 degrees, and the received light passes through the prism such that the light is received by a receiver below the prism. When the prism is used as the beam splitter, as shown in FIG. 2, it is required to deposit a coating layer exhibiting a reflection or transmission property on the bottom plane and the incline plane of the prism, which are not parallel to each other but form an angle of 45 degrees. However, the deposition process is complicated, and therefore, the manufacturing costs of the module increase. Also, it is required to polish the bottom plane and the incline plane of the prism, which form an angle of 45 degrees, such that the bottom plane and the incline plane become mirror planes, during the manufacture of the prism. However, the polishing process is performed after the completion of a form of the prism, with the result that the manufacturing costs increase. Also, in FIG. 2, light advancing perpendicularly downward and transmitted through the incline plane of the prism does not advance perpendicularly downward after being transmitted through the bottom plane of the prism, with the result that accurate assembly is difficult. FIG. 3 is a view illustrating an example of a light advance path exhibiting the property of such a prism. Here, it is assumed that the prism is made of a glass material exhibiting a refractive index of 1.5.

As shown in FIG. 3, light incident perpendicularly downward on the incline plane of the prism advances in the prism at an angle of 28 degrees to the perpendicular direction according to Snell's law, exits from the bottom plane of the prism at an angle of 26 degrees to the perpendicular direction, and then continues to advance. This shows that it is required for the position of an active region to be changed depending upon the distance between the prism and the light receiving device, i.e., the photo diode chip, which acts as a factor that makes it difficult to arrange the photo diode chip.

FIG. 4 is a conceptional view of U.S. Pat. No. 7,093,988 to which a parallel plate beam splitter is applied. As shown in FIG. 4, U.S. Pat. No. 7,093,988 discloses a structure in which at a parallel plate beam splitter is installed at a support member having a tilt angle of 45 degrees, a laser diode chip is installed at one side of the beam splitter, and a photo diode chip is installed below the beam splitter. In this patent, the support member having the tilt angle of 45 degrees is needed, and the beam splitter is installed at the support member, with the result that the volume of the module increases, and the assembly process is complicated, whereby the manufacturing costs of the module increase.

FIG. 5 is a conceptional view of U.S. Pat. No. 4,807,238 using a silicon substrate. As shown in FIG. 5, this U.S. patent discloses a method for changing the advance direction of laser light emitted horizontally from a horizontally-disposed laser diode chip upward using the etched incline plane of the silicon substrate. For easy understanding, the plane direction of a crystal will be indicated hereinafter using braces. In this patent, when a wafer constructed in a diamond structure, such as silicon, having a plane direction of {100} plane is etched with an anisotropic etching solution, the etched side becomes {111} plane. The {111} plane has a tilt angle of 54.74 degrees to the {100} bottom plane. Consequently, light emitted horizontally from the laser diode chip is reflected at the incline plane, with the result that the light is emitted at a tilt angle, not in the perpendicular direction. In order to change the optical axis, which is tilted, of the laser light advancing upward into the perpendicular direction, it is required to install a Fresnel lens on the incline plane. However, the Fresnel lens is a part that is very difficult to manufacture, and therefore, the manufacturing costs of the Fresnel lens are high. Furthermore, it is required to accurately adjust the optical axis of the laser light, the advance direction of which is changed at the incline plane and the Fresnel lens. However, this process is difficult and troublesome.

FIG. 6 is a conceptional view of U.S. Pat. No. 5,566,265 using a trapezoidal beam splitter. This U.S. patent discloses a single TO type package that is capable of performing bidirectional communication using a trapezoidal beam splitter constructed in a structure in which one side of the beam splitter has a tilt angle of approximately 45 degrees and the other side of the beam splitter is vertical. In the trapezoidal beam splitter of this U.S. patent, light received from an optical fiber is incident on the incline plane, the tilt angle of which is approximately 45 degrees, and then exits from the horizontal plane. Consequently, as previously described in connection with FIG. 3, the incident direction of the light before the light is incident on the beam splitter is different from the advance direction of the light after the light exits the beam splitter, with the result that the assembly is very difficult. Furthermore, the trapezoidal beam splitter applied to this U.S. patent transmits or reflects light through the direct use of the incline plane. Consequently, it is required to form a coating layer on the incline plane by deposition; however, the accurate deposition of the thin film on the incline plane is a very difficult process, and therefore, it is difficult to manufacture the beam splitter.

FIG. 7 is a conceptional view of U.S. Pat. No. 4,733,067 using two prisms. This U.S. patent discloses a module that is capable of performing bidirectional communication in the form of a single TO type package using a beam splitter constructed in a structure in which two prisms are attached to each other. In the beam splitter, light is transmitted through or reflected at three planes of each prism, i.e., a total of six planes of the two prisms. However, a process for forming coating layers at the six planes of the two prisms by deposition and attaching the two prisms, three planes of each of which are coated, to complete the beam splitter is very complicated. Furthermore, the manufacturing costs of the beam splitter are very high.

FIG. 8 is a conceptional view of U.S. Pat. No. 6,879,784 using a parallelogram-shaped beam splitter. The U.S. patent shown in FIG. 8 discloses a method of dividing light, by an optical pick-up, using a beam splitter implemented by a parallelogram-shaped prism. Light is transmitted through or reflected at four planes of the parallelogram. Consequently, it is required to form the four planes of the parallelogram to be very smooth planes, such as mirror planes. Also, it is required to deposit dielectric thin film on the four planes of the parallelogram such that the four planes have appropriate reflection and transmission properties. As a result, the manufacture of the beam splitter is very difficult. Furthermore, laser light emitted from a laser diode chip, installed in the lower part of the module, is incident on the prism at an incident angle of 45 degrees and then exits from a horizontal plane having an angle of 45 degrees to an incline plane of 45 degrees. As previously in connection with FIG. 3, therefore, the optical axis of the light after being transmitted through the prism does not have an upward perpendicular direction, with the result that the optical axis alignment is difficult.

As can be clearly understood from the above description, the conventional BiDi module for bidirectional communication has problems in that the manufacture of the beam splitter is complicated, and the assembly for optical alignment is difficult, whereby manufacturing costs of the module greatly increase.

Meanwhile, there is a growing worldwide tendency, in recent optical communication, to need a triple play to combine data, voice, and analog video (broadcasting) into one. ITU.T G983.3, an international standard for communication, assigns frequency such that a wavelength of 1260 to 1360 nm (hereinafter, referred to as a 1310 nm wavelength band) is assigned as an upstream data signal, a wavelength of 1480 to 1500 nm (hereinafter, referred to as a 1490 nm wavelength band) is assigned as a downstream data signal, and a wavelength of 1550 to 1560 nm (hereinafter, referred to as a 1550 nm wavelength band) is assigned as a downstream video signal. Accordingly, an optical module is needed which is capable of upstream-transmitting an optical signal of a 1310 nm wavelength band and simultaneously transmitting and receiving a downstream data signal of a 1490 nm wavelength band and a downstream video signal of a 1550 nm wavelength band through a single optical fiber. Such an optical module having the above-specified functions is called a triplexer module. In the triplexer module, a function to change the advance path of light and divide wavelength is required to simultaneously optically connect a single optical fiber, a light transmitter, and a plurality of light receivers to one another.

FIG. 9 is a conceptional view of U.S. Pat. No. 6,493,121 to which such as triplexer module is applied.

The U.S. patent shown in FIG. 9 discloses a method for transmitting three kinds of optical signals through a single optical fiber using three TO type laser diode modules, a photo diode module for a 1490 nm band, and a photo diode module for a 1550 nm band. In the conventional triplexer structure shown in FIG. 9, an optical signal of a 1550 nm band and an optical signal of a 1490 nm band, transmitted while being mixed through the optical fiber, are reflected 90 degrees at a first beam splitter, with the result that the optical signal of the 1550 nm band is incident on the photo diode module for 1550 nm band reception, whereby the optical signal of the 1550 nm, band is extracted. The optical signal of the 1490 nm band is directly transmitted through the first beam splitter and is then incident on a second beam splitter. The second beam splitter reflects the optical signal of the 1490 nm band by 90 degrees, with the result that the optical signal of the 1490 nm band is incident on the photo diode module for the 1490 nm band, whereby the optical signal of the 1490 nm band is extracted. On the other hand, an upstream optical signal of 1310 nm band emitted from the TO type laser diode module is directly transmitted through the first and second beam splitter, and is optically coupled with the optical fiber, whereby the signal is upstream-transmitted. In this way, the three TO type optical modules and the two beam splitters are needed to divide the upstream optical signal of the 1310 nm band, the downstream optical signal of the 1490 nm band, and the downstream optical signal of the 1550 nm band, and a housing is further needed to fix the three TO type optical modules and the two beam splitters, with the result that the structure is very complicated, and a large number of parts are needed, whereby the manufacturing costs are high.

The BiDi module for bidirectional communication or the triplexer module is a technology that is capable of simultaneously transmitting and receiving several optical signals having different wavelengths using a single optical fiber. Moreover, there has been recently adopted a DWDM system that is capable of transmitting optical signals having a very narrow wavelength spacing using a single optical fiber. This DWDM is a system that divides laser light into narrow several nm wavelength bands. In International Telecommunications Union-Telecommunication Standardization Sector (ITU-T), establishing international standards for communication equipment and communication system, laser lights of specific frequencies having a spacing of approximately 100 GHz are established as DWDM. When such allowed frequencies are converted into wavelengths, the wavelength spacing becomes approximately 0.8 nm. Consequently, it is required for the laser light used in the DWDM to have a very narrow emission line width. In addition, it is required that the wavelength of the laser light be stable even irrespective of various changes of external working environment. A distributed feedback laser diode (DFB-LD) is used as laser having a very narrow emission line width. Generally, for a well-manufactured DFB-LD, −20 dB (decibel) line width is within 0.2 nm, which is much less than the wavelength spacing established by ITU-T, and therefore, signal overlapping does not occur during DWDM communication. For a semiconductor laser diode, however, an internal refractive index thereof changes depending upon temperature and injection current density, with the result that the output wavelength changes. Generally, DFB-LD has an emission wavelength change of approximately 0.09 nm with respect to a temperature change of 1° C. That is, when the same DFB laser diode is used at a condition having a temperature difference of approximately 9° C., an emission wavelength band is shifted from an ITU-T grid having an original wavelength band to a neighboring grid.

In order to solve the above-mentioned problem, there has been developed a laser diode package having a thermoelectric device to uniformly maintain the operating temperature environment of a laser diode installed therein. However, the emission wavelength of the DFB laser diode is affected not only by the working environment temperature of a laser diode chip but also by several other factors, including drive current of the laser diode chip. For this reason, there is being required a method for directly monitoring the wavelength change of the laser diode chip, instead of passively adjusting the wavelength of the laser diode to uniformly maintain the drive current of the laser diode chip.

A function to monitor the emission wavelength of the laser diode to uniformly maintain the wavelength of the laser diode is referred to as wavelength locking. The wavelength locking function may be carried out by a method for monitoring diffraction by a diffraction grating outside the laser diode module to check a wavelength and changing the drive temperature of the laser diode based on the checked wavelength. However, this method is very troublesome because the volume of the structure greatly increases. Accordingly, there have been developed methods for directly monitoring the wavelength of the laser diode chip in the laser diode module and changing the working temperature of the laser diode chip to offset the change of the wavelength.

An edge emitting semiconductor laser diode chip, which is a typical example of a semiconductor laser diode chip having a power of a few milliwatts or more, emits laser light from opposite edges of the chip in opposite directions. The intensity of light emitted from the edge of the laser diode chip may be changed by adjusting reflexibility at the opposite edges. Generally, a side from which light is emitted strongly is referred to as a front side of the semiconductor laser chip, and a side from which light is emitted weakly is referred to as a back side of the semiconductor laser chip. Generally, the light emitted strongly from the front side of the laser diode chip is used to transmit a signal for communication, and the light emitted weakly from the back side of the laser diode chip is incident on a photo diode chip installed in the module to monitor the operation state of the laser diode chip.

FIG. 10 is a conceptional view illustrating a wavelength locking laser diode module that monitors the fluctuation of emission wavelength of a laser diode chip in such a conventional laser diode module.

As shown in FIG. 10, laser light emitted from the back side of a laser diode chip 20 installed in a package housing 10 passes through a lens 70, with the result that the laser light is changed into parallel light. A predetermined portion of the intensity of the laser light is directly transmitted, and the remaining portion of the intensity of the laser light passes through a beam splitter 30, by which the advance direction of the laser light is changed 90 degrees, with the result that the laser light is divided into two laser light components having two different advance directions. One of the laser light components directly advances, and the intensity thereof is detected by a photo diode chip 40, which is a light receiving device for monitoring. The other laser light component passes through a filter 50 having wavelength selectivity and is then incident on a photo diode chip 60. On the other hand, laser light emitted from the front side of the laser diode chip 20 passes through a lens 80 and is then condensed to an optical fiber 90 outside the package housing 10.

In the above-described structure, the optical current of the photo diode chip 40 is not changed by the wavelength change of less than a few nm of the laser light for the laser light passing through the beam splitter 30 and directly incident on the photo diode chip 40; however, the optical current property of the photo diode chip 60 is sensitively changed even by the minute wavelength change of less than of a few nm, due to the property of the wavelength-selectivity filter 50, for the laser light passing through the beam splitter 30 and passing through the wavelength-selectivity filter 50. Consequently, the wavelength change of the laser light may be measured by comparing the intensity of the laser light divided into two components after passing through the beam splitter 30. In the conventional method, however, the beam splitter 30 has a size of 1.0 nm×1.0 nm×0.5 nm or more. That is, the size of the beam splitter 30 is very large. Also, the two built-in photo diode chips 40 and 60 are disposed in such a manner that the photo diode chip 40 lies at right angles to the photo diode chip 60, with the result that the area of the module increases. Accordingly, the laser diode module having the wavelength locking function is implemented using a butterfly package housing, which is a package housing the volume of which is greater than those of the other optical communication laser diode housings. Also, in FIG. 10, the installation angle of the rectangular parallelepiped beam splitter 30 in the horizontal direction at the time of installing the beam splitter 30 is adjusted according to installation accuracy, and the direction of light reflected by the beam splitter 30 is changed by the installation angle of the beam splitter 30. Consequently, it is required to very accurately install the beam splitter 30 and the respective photo diode chips 40 and 60. However, this process is difficult and troublesome.

In a present situation in which optical communication parts are implemented in the form of a very small-sized transceiver, such as small form factor (SFF) or small form factor pluggable (SFP), a butterfly package is too large to install in such a small-sized transceiver. Consequently, a DWDM laser diode package housing, which is applied to the transceiver, such as SFF or SFP, which is being presently commercialized, is implemented in a mini-flat or mini-DIL type structure. Such a laser diode package housing has an internal volume insufficient to have two photo diode chips having a wavelength locking function installed therein. For this reason, the present mini-DIL or mini-flat type DWDM package housing is implemented in a structure to uniformly maintain the temperature of the laser diode chip without the wavelength locking function. Due to the omission of the wavelength locking function, the mini-DIL or mini-flat type package adopts a passive temperature stabilization method, which does not actively stabilize the wavelength of the laser diode chip but adjusts only the working temperature of the laser diode chip, with the result that accurate wavelength stabilization is not possible. Therefore, there is a high necessity for a novel package having a wavelength locking function although the size of the package is small sufficient to install in a subminiature transceiver, such as SFF or SFP.

Also, an optical transceiver, manufactured in the form of a mini-flat or mini-DIL type package housing, includes a upstream optical transmitter for an upstream optical signal and a downstream optical receiver for a downstream optical signal, which are manufactured separately in the form of a package housing. The upstream optical transmitter and the downstream optical receiver are installed in the transceiver, such as SFF or SFP. Consequently, two strands of optical fiber are needed to use such an optical transceiver. In recent years, however, there has been widely adopted a bidirectional optical communication module, i.e., a bidirectional optical transmission module, which is capable of transmitting and receiving an optical signal using a single optical fiber. Consequently, there is a high necessity to develop a subminiature laser diode package that is capable of monitoring the fluctuation of emission wavelength of a laser diode chip to drive a thermoelectric device built-in in the direction to offset the change of the emission wavelength to change of the drive temperature of the laser diode chip, thereby stabilizing the emission wavelength of the laser diode chip and achieving bidirectional communication. Up to now, no conventional products, capable of performing bidirectional communication, implemented in the form of a DWDM optical module having a wavelength locking function, have not been invented or come onto the market.

In the edge emitting semiconductor laser diode, as previously described, laser light having intensity proportional to edge transmissivity is emitted from the opposite edges of the laser diode chip. However, this discussion is appropriate when the reflexibility at the opposite edges exceeds a few % or so. If the reflexibility at one edge is 0.1% or less, and the reflexibility at the other edge is several tens of % or so, i.e., if the difference in reflexibility between the edges is large, the energy ratio of light emitted from the opposite edges of the laser diode chip changes depending upon the state of current injection to the laser diode chip. A representative laser diode chip exhibiting this property may be a reflective semiconductor optical amplifier. The front side of the reflective semiconductor optical amplifier generally has a reflexibility of 0.1% or less, whereas the back side of the reflective semiconductor optical amplifier generally has a reflexibility of several tens of % or more. In this case, the intensity of the laser light detected at the back side of the laser diode chip does not represent that of the laser light emitted from the front side of the laser diode chip. For this reason, a method for coupling the laser light emitted from the front side of the laser diode with the optical fiber, dividing some energy of the light coupled with the optical fiber at a predetermined ratio through the optical fiber or an optical distributor manufactured in a waveguide structure, and making the divided optical signal to be incident on the photo diode to monitor the operation state of the laser diode chip is adopted instead of a technology for disposing the photo diode chip to monitor the laser diode chip at the back side of the chip as in the conventional laser diode module. However, the method for disposing the optical distributor at the front side of the laser diode module to monitor the operation state of the laser diode chip is very complicated and, in addition, cost-consuming.

It is a first object of the present invention to provide a self-standing parallel plate beam splitter easy to manufacture and easy to install in a laser diode package, and a method for manufacturing the same.

It is a second object of the present invention to provide a laser diode package structure that is capable of performing bidirectional communication using a self-standing parallel plate beam splitter easy to install.

It is a third object of the present invention to provide a laser diode package structure having a triplexer function using a self-standing parallel plate beam splitter easy to install.

It is a fourth object of the present invention to provide a laser diode package structure having a wavelength locking function using a self-standing parallel plate beam splitter easy to install.

It is a fifth object of the present invention to provide a laser diode package structure having a front side monitoring function to monitor the operation state of a laser diode chip using some of laser light emitted from the front side of the laser diode chip.

SUMMARY

The present invention provides a method for inserting a 45-degree self-standing parallel plate beam splitter into a TO type package, displacing a laser diode chip beside the 45-degree self-standing parallel plate beam splitter, reflecting upstream laser light emitted from the laser diode chip at an incline plane of the beam splitter, disposed at an angle of 45 degrees to an optical axis of the laser light to change the advance angle of the laser light by 90 degrees, such that the laser light passes through an opening formed at the top of the TO type package and is optically coupled with an optical fiber disposed outside the TO type package, and making a downstream optical signal emitted from the optical fiber disposed outside the TO type package to be transmitted through the beam splitter, such that the laser light is incident on a photo diode chip disposed below the beam splitter, to receive the optical signal.

In this method, it is necessary to very accurately adjust the angle of the beam splitter to achieve the stable optical coupling between the optical fiber the optical coupling efficiency of which is very sensitively changed depending upon the entry angle of the light toward the optical fiber and the built-in laser diode chip. The present invention provides a method for adding a bidirectional-communication BiDi function and a triplexer function to a single TO type package using a self-standing parallel plate beam splitter the tilt angle of which is very accurately adjustable.

Also, the self-standing parallel plate beam splitter according to the present invention may implement various functions depending upon the characteristics of the surface coating of the beam splitter. It is possible to manufacture various modules, such as a DWDM TO type module having a wavelength stabilization function, a bidirectional-communication DWDM TO type module having a wavelength stabilization function, and a front side monitoring laser diode TO package for monitoring function to monitor the operation state of a laser diode chip using laser light emitted from the front side of the laser diode chip, using the 45-degree self-standing parallel plate beam splitter.

BRIEF DESCRIPTION OF THE DRAWINGS

FIG. 1 is a schematic view illustrating a conventional commercialized BiDi module that is capable of performing a bidirectional communication;

FIG. 2 is a conceptional view of U.S. Pat. No. 4,733,067 disclosing a conventional module that is capable of performing a bidirectional communication using a prism;

FIG. 3 is a view illustrating an example of a light advance path exhibiting the property of a prism;

FIG. 4 is a conceptional view of U.S. Pat. No. 7,093,988 to which a conventional parallel plate beam splitter is applied;

FIG. 5 is a conceptional view of U.S. Pat. No. 4,807,238 using a conventional silicon substrate;

FIG. 6 is a conceptional view of U.S. Pat. No. 5,566,265 using a conventional trapezoidal beam splitter;

FIG. 7 is a conceptional view of U.S. Pat. No. 4,733,067 using conventional two prisms;

FIG. 8 is a conceptional view of U.S. Pat. No. 6,879,784 using a conventional parallelogram-shaped beam splitter;

FIG. 9 is a conceptional view of U.S. Pat. No. 6,493,121 to which a conventional triplexer module is applied;

FIG. 10 is a conceptional view illustrating a wavelength locking laser diode module that monitors the fluctuation of emission wavelength of a laser diode chip in a conventional laser diode module;

FIG. 11 is a schematic view illustrating the structure of an edge emitting semiconductor laser diode chip applicable to the present invention;

FIG. 12 is a schematic view illustrating the structure of a semiconductor photo diode chip applicable to the present invention;

FIG. 13 is a side view illustrating a self-standing parallel plate beam splitter according to an embodiment of the present invention;

FIG. 14 is a view illustrating an example of a light advance path in a case in which the self-standing parallel plate beam splitter according to the embodiment of the present invention exhibits a property in that a front side incline plane and a back side incline plane of the self-standing parallel plate beam splitter reflect light incident thereon;

FIG. 15 is a view illustrating an example of an advance path of light incident on the self-standing parallel plate beam splitter according to the embodiment of the present invention in the horizontal direction and in the perpendicular direction in a case in which the self-standing parallel plate beam splitter exhibits a property to transmit light incident thereon;

FIG. 16 is a view illustrating an example of an advance path of laser light when the laser light is incident on the back side incline plane of the self-standing parallel plate beam splitter according to the embodiment of the present invention in the horizontal direction, is transmitted through the back side incline plane, and is then reflected at the front side incline plane;

FIG. 17 is a view illustrating the overall structure of a bidirectional-communication laser diode package, using a self-standing parallel plate beam splitter, according to an embodiment of the present invention;

FIG. 18 is a detailed view illustrating a BiDi block of FIG. 17;

FIG. 19 is a plan perspective view illustrating a sub mount included in the bidirectional-communication laser diode package according to the embodiment of the present invention;

FIGS. 20 and 21 are views illustrating an example in which a second sub mount and the self-standing parallel plate beam splitter are installed at the top of the first sub mount in accordance with an embodiment of the present invention;

FIGS. 22 and 23 are conceptional views illustrating a process for manufacturing a self-standing parallel plate beam splitter having wavelength selectivity using a semiconductor silicon wafer according to an embodiment of the present invention;

FIG. 24 is a conceptional view illustrating a process for manufacturing a self-standing parallel plate beam splitter using a single crystal silicon wafer exhibiting a property described in connection with FIG. 23;

FIG. 25 is a view illustrating an example of a process for manufacturing a self-standing parallel plate beam splitter using a sawing method in accordance with an embodiment of the present invention;

FIG. 26 is a view illustrating an example of a process for manufacturing a self-standing parallel plate beam splitter by a sawing method in accordance with another embodiment of the present invention;

FIG. 27 is a view illustrating an example of a process for manufacturing a self-standing parallel plate beam splitter by a dry etching method using plasma in accordance with an embodiment of the present invention;

FIG. 28 is a view illustrating various forms of the self-standing parallel plate beam splitter according to the embodiment of the present invention;

FIG. 29 is a view illustrating an example of light paths changed depending upon the position of light incident on the self-standing parallel plate beam splitter according to the embodiment of the present invention;

FIG. 30 is a view illustrating an example of an incident point minimum height at which laser light is incident on the front side incline plane of the self-standing parallel plate beam splitter, which is necessary for the laser light advancing downward in the perpendicular direction to be transmitted through the self-standing parallel plate beam splitter and continue to advance downward in the perpendicular direction;

FIG. 31 is an assembly view, in detail, illustrating a process for assembling the BiDi block shown in FIGS. 17 and 18;

FIGS. 32 and 33 are views illustrating the structure of a general photo diode chip;

FIG. 34 is a view illustrating an example in which the photo diode chip is flip-chip bonded to a substrate for electric signal transmission;

FIG. 35 is a view illustrating an example in which stray light enters an active region of the photo diode chip;

FIG. 36 is a view illustrating an example to reduce a noise component generated by the stray light in accordance with an embodiment of the present invention;

FIG. 37 is a conceptional view illustrating a front side monitoring function of the laser semiconductor diode chip according to the embodiment of the present invention;

FIG. 38 is a view illustrating the structure of a TO type package having the front side monitoring photo diode chip of FIG. 37 installed therein;

FIG. 39 is a view illustrating the structure of a triplexer module in which a triplexer function is implemented in a single package in accordance with an embodiment of the present invention;

FIG. 40 is a view illustrating an example of a TO type package to which two self-standing parallel plate beam splitters are applied in accordance with an embodiment of the present invention;

FIG. 41 is a view illustrating the structure of a triplexer module that performs the function of FIG. 39 using two self-standing parallel plate beam splitters in accordance with an embodiment of the present invention;

FIG. 42 is a conceptional view illustrating a triplexer module according to an embodiment of the present invention manufactured in the form of conventional two TO type BiDi modules;

FIG. 43 is a view illustrating the structure of a TO type laser diode package having a wavelength locking function and a bidirectional communication function according to an embodiment of the present invention;

FIG. 44 is a view illustrating the structure of a bidirectional wavelength locking block according to an embodiment of the present invention;

FIG. 45 is a graph illustrating a very narrow transmission line width property of a narrow line width filter; and FIG. 46 is a plan view illustrating the arrangement of a module constructed in a structure in which a receiving photo diode chip is not provided below a self-standing parallel plate beam splitter, and therefore, the module has only a wavelength locking function.

DETAILED DESCRIPTION OF THE EMBODIMENTS

Hereinafter, preferred embodiments of the present invention will be described in detail with reference to the accompanying drawings.

A semiconductor laser chip to generate laser light of a 1300 nm or 1550 nm wavelength, which will be described hereinafter as an embodiment of the present invention, is constructed in a structure in which an indium gallium arsenide phosphide (InGaAsP) layer, as an active layer, is grown on an indium phosphide (InP) substrate exhibiting a n-type doping property, p-type InP is grown as a clad, and, according to circumstances, p-indium gallium arsenide (p-InGaAs) layer is grown as a p-type metal contact electrode on the p-type InP clad layer. Depending upon methods for manufacturing the semiconductor laser chip, the semiconductor laser chip may be classified as a vertical cavity surface emitting diode (VCSEL) chip that emits laser light in the crystal growth direction or an edge emitting laser diode (EEL) chip that emits laser light from the edge of the chip along a waveguide formed perpendicularly to the crystal growth direction. The present invention is preferably applicable to the edge emitting laser diode chip.

FIG. 11 is a schematic view illustrating the structure of the edge emitting semiconductor laser diode chip applicable to the present invention.

As shown in FIG. 11, the edge emitting laser diode chip is generally constructed in the form of a rectangular parallelepiped having a thickness of approximately 80 to 100 μm, a width of approximately 300 μm to 600 μm, and a length of approximately 300 μm to 600 μM. When an n-type substrate is used, an active region, from which laser light is emitted, is formed at a region 4 to 5 μm or less distant from the p-type surface. A method for the most easily attaching such a thin semiconductor laser diode chip to another substrate is to attach the semiconductor laser diode chip to the substrate such that the large bottom plane of the semiconductor laser diode chip is directed downward. A method for attaching the side of the semiconductor laser diode chip to the substrate reduces stability, and therefore, this method is not adopted. Consequently, when the semiconductor laser diode chip is attached to the substrate such that the large bottom plane of the semiconductor laser diode chip comes into contact with the substrate, laser light is emitted horizontally from opposite edges of the semiconductor laser diode chip.

FIG. 12 is a schematic view illustrating the structure of a semiconductor photo diode chip applicable to the present invention.

Generally, a photo diode chip for detecting laser light having a near-infrared wavelength band of 1310 nm to 1550 nm uses InGaAs, as a light absorption layer, lattice matched to InP on an n-InP substrate. When a p-n junction is formed at a portion of the InGaAs layer, only the p-n junction region effectively acts as the light absorption layer. The InGaAs layer at the remaining region where the p-n junction is not formed does not generate an electric signal although the InGaAs layer absorbs light. Consequently, the active region of the receiving photo diode chip is limited to the region where the p-n junction is formed at the InGaAs light absorption layer that is capable of absorbing light and generating an electric signal. The InGaAs lattice matched to the InP has a band gap energy of 0.75 eV (electron volt), and therefore, it is possible to absorb light having a wavelength of 1310 nm to 1550 nm. On the other hand, the InP substrate has a band gap energy of approximately 1.35 eV, with the result that it is not possible to absorb light having a wavelength of 1310 nm to 1550 nm. The photo diode chip with the above-stated structure is constructed in the form of a rectangular parallelepiped having a thickness of approximately 80 to 100 μm, a width of approximately 300 μm to 600 μm, and a length of approximately 300 μm to 600 μm. Consequently, the photo diode chip is also attached to a substrate, such that the large bottom plane of the photo diode chip comes is directed downward, as in the laser diode chip. In this case, an optical signal to be absorbed by the photo diode chip and converted into an electric signal appropriately responds to light advancing downward from above the photo diode chip.

As shown in FIGS. 11 and 12, when the semiconductor laser diode chip and the semiconductor photo diode chip are attached to the respective substrates horizontally disposed, such that the large bottom planes of the semiconductor laser diode chip and the semiconductor photo diode chip are directed downward, it is required that laser light emitted from the laser diode chip advance in the horizontal direction, and light to be incident on the photo diode chip advance in the downward perpendicular direction. Consequently, in order to fix the semiconductor laser diode chip and the semiconductor photo diode chip such that the bottom planes of the semiconductor laser diode chip and the semiconductor photo diode chip are horizontal, to couple laser light emitted horizontally from the semiconductor laser diode chip with an optical fiber, and to effectively irradiate the laser light incident from the optical fiber vertically on the photo diode chip, it is required to install a beam splitter for changing the advance direction of one laser light but not changing the advance direction of the other laser light at the intersection point between the optical axis of the laser diode chip and the optical axis incident on the photo diode chip.

FIG. 13 is a side view illustrating a self-standing parallel plate beam splitter according to an embodiment of the present invention.

As shown in FIG. 13, the self-standing parallel plate beam splitter 200 according to the present invention is constructed in a structure in which a front side incline plane F and a back side incline plane B are parallel to each other, the front side incline plane F and the back side incline plane B are at an angle of 45 degrees to a bottom plane, the bottom plane is fixed, whereby beam splitter 200 can stand for itself. The front side incline plane F and the back side incline plane B may be variously coated such that the front side incline plane F and the back side incline plane B exhibit transmission and reflection properties depending upon the wavelength of laser light. Laser light may have various transmission or reflection paths depending upon the incident path of light incident on the self-standing parallel plate beam splitter 200, and the coated states of the front side incline plane F and the back side incline plane B.

FIG. 14 is a view illustrating an example of an advance path of light in a case in which the self-standing parallel plate beam splitter according to the embodiment of the present invention exhibits a property in that the front side incline plane and the back side incline plane of the self-standing parallel plate beam splitter reflect light incident thereon.

When the front side incline plane F and the back side incline plane B of the self-standing parallel plate beam splitter are at an angle of 45 degrees to the bottom plane, as shown in FIG. 14, light horizontally incident on the front side incline plane F and the back side incline plane B is reflected, with the result that the advance direction of the light is changed into the upward vertical direction or the downward vertical direction. Consequently, when laser light is emitted in a structure in which the edge emitting laser diode chip is disposed in front of the front side incline plane F of the self-standing parallel plate beam splitter, the advance direction of the laser light straight advancing horizontally from the laser diode chip is changed 90 degrees at the front side incline plane F of the self-standing parallel plate beam splitter, and then the laser light advances in the upper direction, i.e., in the upward perpendicular direction of the self-standing parallel plate beam splitter. At this time, it is required for the laser light emitted from the laser diode chip to be diffused in the horizontal direction. To this end, the laser diode chip is attached to the substrate such that the large bottom plane of the laser diode chip is directed downward. In this case, the laser diode chip is easily attached to the substrate.

FIG. 15 is a view illustrating an example of an advance path of light incident on the self-standing parallel plate beam splitter according to the embodiment of the present invention in the horizontal direction and in the perpendicular direction in a case in which the self-standing parallel plate beam splitter exhibits a property to transmit light incident thereon.

For convenience of description, when four quadrants are established based on two axes constituted by the front side incline plane F of the self-standing parallel plate beam splitter and a perpendicular line of the front side incline plane F, light approaching the front side incline plane F of the self-standing parallel plate beam splitter in the downward perpendicular direction is incident on the first quadrant, and light approaching the front side incline plane F of the self-standing parallel plate beam splitter in the horizontal direction is incident on the second quadrant.

Since the front side incline plane F of the self-standing parallel plate beam splitter is at an angle of 45 degrees to the horizontal line, both the laser light approaching in the downward perpendicular direction and the laser light approaching in the horizontal direction have an incident angle of 45 degrees to the perpendicular line of the front side incline plane F. In the embodiment of the present invention, it is assumed that the self-standing parallel plate beam splitter is made of silicon having a refractive index of approximately 3.5. Since the refractive index of light in the air is 1.0, an angle of refraction of light in the silicon when laser light is transmitted through the silicon is represented by Mathematical equation 1 below according to Snell's law.

$$n_1 \times \sin \theta_1 = n_2 \times \sin \theta_2 \quad \text{Mathematical equation 1}$$

Where, $n_1$ is a refractive index of light in an incidence space, $n_2$ is a refractive index of light in an refraction space, $\theta_1$ is an incidence angle of incident light to the perpendicular line of an incidence plane, and $\theta_2$ is an angle of refracted light to the perpendicular line of the incidence plane.

When laser light has an incidence angle of 45 degrees to the perpendicular line of the front side incline plane F, the laser light has an angle of refraction of 11.7 degrees in the beam splitter according to Snell's law. Consequently, since light horizontally incident on the front side incline plane F at an incidence angle of 45 degrees is incident on the second quadrant; refracted light is refracted toward the fourth quadrant at an angle of refraction of 11.7 degrees and then advances. On the other hand, since light incident perpendicularly downward on the front side incline plane F at an incident angle 45 degrees is incident on the first quadrant, refracted light is refracted toward the third quadrant at an angle of refraction of 11.7 degrees and then advances. When the refracted and advancing light reaches the back side incline plane B of the self-standing parallel plate beam splitter, the incidence angle of the laser light to the back side incline plane B becomes 11.7 degrees, because the back side incline plane B is parallel to the front side incline plane F. Consequently, laser light transmitted through the silicon medium and exiting into the air recovers its original advancing direction by the reversibility of Snell's law, with the result that the light horizontally reaching the front side incline plane F of the self-standing parallel plate beam splitter exits from the back side incline plane B of the self-standing parallel plate beam splitter in the horizontal direction, and the light vertically reaching the front side incline plane F of the self-standing parallel plate beam splitter exits from the back side incline plane B in the vertical direction. It should be noted that the fact the light reaching the front side incline plane F of the self-standing parallel plate beam splitter and the light exiting from the back side incline plane B of the self-standing parallel plate beam splitter have the same advance direction is irrelevant to a refractive index of a medium and is obtained when the front side incline plane F and the back side incline plane B of the self-standing parallel plate beam splitter are parallel to each other. Consequently, when the front side and the back side of the self-standing parallel plate beam splitter are parallel to each other, light incident on the self-standing parallel plate beam splitter exits the self-standing parallel plate beam splitter in a state in which the light has its advance direction component at it is. Therefore, the self-standing parallel plate beam splitter has a property easy to control the advance path of laser light.

FIG. 16 is a view illustrating an example of an advance path of laser light when the laser light is incident on the back side incline plane of the self-standing parallel plate beam splitter according to the embodiment of the present invention in the horizontal direction, is transmitted through the back side incline plane, and is then reflected at the front side incline plane.

Light incident on the back side incline plane B of the self-standing parallel plate beam splitter in the horizontal direction is transmitted through the silicon medium while having an angle of refraction of 11.7 degrees according to Snell's law, as previously described in connection with FIG. 15. When the front side incline plane F of the self-standing parallel plate beam splitter has a property to reflect the light transmitted through the silicon medium, the laser light is reflected at the front side incline plane F, and then reaches the back side incline plane B of the self-standing parallel plate beam splitter. The light reflected at the front side incline plane F of the self-standing parallel plate beam splitter and reaching the back side incline plane B of the self-standing parallel plate beam splitter enters the first quadrant, with the result that the angle of the laser light refracted and exiting into the air becomes the perpendicular direction of the third quadrant. Here, the light directly reflected at the back side incline plane B of the self-standing parallel plate beam splitter and the light reflected at the front side incline plane F of the self-standing parallel plate beam splitter and exiting from the back side incline plane B of the self-standing parallel plate beam splitter have the same direction; however, they are different in horizontal distance from each other. This is because the laser light is affected by the refractive index of the medium and the thickness of the self-standing parallel plate beam splitter.

As can be seen from FIGS. 14 to 16, light incident on the self-standing parallel plate beam splitter has various advance paths by adjusting the transmission and reflection properties of the front side incline plane F and the back side incline plane B of the self-standing parallel plate beam splitter. Consequently, it is possible to variously adjust the advance path of the light by appropriately coating front side incline plane F and the back side incline plane B of the self-standing parallel plate beam splitter. Therefore, it is possible to manufacture an optical module having various functions in a structure in which the laser diode chip and the photo diode chip are integrated in the optical module through the control of such various optical paths.

A TO type package is a package very widely used in an optical communication laser diode package field. In general communication semiconductor laser diode TO type package, a package housing called a TO56 type package housing is mainly used. The TO56 type package is a very small-sized package having a diameter of 5.6 mm. Also, a general photo diode chip is mounted in a TO type package housing called a TO46 type package housing. The TO46 type package is a very small-sized package having a diameter of 5.4 mm. A duplexer transceiver or a BiDi transceiver, manufactured basically using the TO56 type package housing or the TO46 type package housing, has a very small volume. As a result, a very small-sized transceiver, such as small form factor (SFF) or small form factor pluggable (SFP), is implemented in a structure including several drive circuits. Consequently, a laser diode and photo diode package using a subminiature TO type package is needed to manufacture such a subminiature SFF or SFP. Accordingly, it is required for an integrated TO type package housing to be minimized in volume even when the transmission laser diode chip and the receiving photo diode chip are mounted in the TO type package housing.

The self-standing parallel plate beam splitter according to the embodiment of the present invention, previously described with reference to FIGS. 13 to 16, is provided to manufacture such a minimized TO type package.

FIG. 17 is a view illustrating the overall structure of a bidirectional-communication laser diode package, using a self-standing parallel plate beam splitter, according to an embodiment of the present invention, FIG. 18 is a detailed view illustrating a BiDi block of FIG. 17, and FIG. 19 is a plan perspective view illustrating a sub mount included in the bidirectional-communication laser diode package.

The bidirectional-communication laser diode package shown in FIG. 17 is constructed in a structure in which a BiDi transceiver for simultaneously transmitting and receiving an upstream optical signal and a downstream optical signal using a single optical fiber is implemented in a single TO package.

In the TO type package is mounted a BiDi block 10 including a semiconductor laser diode chip for generating an upstream laser light signal and a photo diode chip for receiving a downstream laser light and converting the received laser light into an electric signal. The BiDi block 10 is installed at the top of a stem base 11. Meanwhile, a plurality of electrode pins 15 are installed at the stem base 11 such that the electrode pins 15 vertically penetrate the stem base 11. The stem base 11 and the electrode pins 15, which are made of a metal material, are electrically isolated from one another by a glass material 16 for hermetic sealing. At the top of the stem base 11, including the BiDi block 10, is installed a metal cap 12 to complete a TO type BiDi transceiver. The stem base 11 and the cap 12 are made of iron or Kovar, which is an cobalt-nickel-iron alloy.

The cap 12 is provided at one side of the top thereof with a hole through which laser light passes. To the top of the cap 12 is attached a glass plate or a ball lens, made of glass, which has a property to transmit laser light, such that the package is constructed in a hermetically sealed structure. FIG. 17 illustrates an example in which the laser light passing-through hole of the cap 12 is covered by a glass plate 13; however, the laser light passing-through hole of the cap 12 may be covered by a ball lens or an aspherical lens.

In the TO type BiDi package with the above-stated construction, laser light emitted from the BiDi block 10 is transmitted through the glass plate 12 covering the laser light passing-through hole of the cap 12, is transmitted through a lens (not shown), and is then condensed to an optical fiber, whereby the upstream transmission of a laser signal is completed. Also, a downstream laser signal emitted from an optical fiber (not shown), transmitted through a lens, and passing through the laser light passing-through hole of the cap 12 of the TO type package is converted into an electric signal by the receiving photo diode chip, whereby the reception of a downstream optical signal is completed.

As shown in FIG. 18, the BiDi block 10 of the TO package according to the present invention is constructed in a structure in which a wedge-shaped self-standing parallel plate beam splitter 210, having front and back side incline planes of which have a tilt angle of 45 degrees to a bottom plane, is installed at one side of the top of a first sub mount 300, a second sub mount 310 is installed at the side of the self-standing parallel plate beam splitter 210, and a laser diode chip 100 is installed at the top of the second sub mount 310 such that the laser diode chip 100 is directed toward the front side incline plane of the self-standing parallel plate beam splitter 210. At this time, the second sub mount 310 is configured such that the second sub mount 310 has an external appearance reverse to the self-standing parallel plate beam splitter 210 and comes into contact with the front side incline plane of the self-standing parallel plate beam splitter 210. Consequently, it is possible to dispose the laser diode chip 100 adjacent to the front side incline plane of the self-standing parallel plate beam splitter 210 to the highest degree.

As shown in FIG. 19, the first sub mount 300 is manufactured in the form of "⊏" such that a receiving photo diode chip sub mount 510, at the top of which a receiving photo diode chip 500 is installed, is inserted into the groove.

FIGS. 20 and 21 are views illustrating an example in which the second sub mount and the self-standing parallel plate beam splitter are installed at the top of the first sub mount in accordance with an embodiment of the present invention.

The assembly is more easily carried out when a cutting plane, having a different angle, to cut the bottom plane and the front side incline plane of the self-standing parallel plate beam splitter 210 is disposed between the bottom plane and the front side incline plane of the self-standing parallel plate beam splitter 210, as shown in FIG. 21, than when the bottom plane and the front side incline plane of the self-standing parallel plate beam splitter 210 directly intersect to form an acute angle of 45 degrees, as shown in FIG. 20. This is because, when the bottom plane and the front side incline plane of the self-standing parallel plate beam splitter 210 directly intersect, as shown in FIG. 20, no space is provided between the self-standing parallel plate beam splitter 210 and the second sub mount 310, with the result that a bonding agent 301, such as solder or epoxy, used to attach the self-standing parallel plate beam splitter 210 and the second sub mount 310 to the first sub mount 300 is interposed between the self-standing parallel plate beam splitter 210 and the second sub mount 310, whereby the bonding agent 301 disturbs the tight contact between the self-standing parallel plate beam splitter 210 and the second sub mount 310. On the other hand, when a cutting plane is formed at the bottom plane of the self-standing parallel plate beam splitter 210 to cut the bottom plane and the front side incline plane of the self-standing parallel plate beam splitter 210, as shown in FIG. 21, an empty space is formed below the joint between the self-standing parallel plate beam splitter 210 and the second sub mount 310, and the empty space is filled with surplus bonding agent 301, such as solder or epoxy, whereby the tight contact with the self-standing parallel plate beam splitter 210 and the second sub mount 310 is achieved.

The self-standing parallel plate beam splitter 210 is manufactured such that the front side incline plane of the self-standing parallel plate beam splitter 210 has a property to reflect light of a wavelength corresponding to laser light emitted from the laser diode chip 100 and transmit light of a wavelength corresponding to laser light emitted from an optical fiber (not shown) and advancing toward the receiving photo diode chip 500. The present invention needs a first photo diode chip for detecting an external optical signal transmitted through an optical fiber and a second photo diode chip (not shown) for monitoring the operation state of the laser diode chip 100. For convenience of description, the first photo diode chip for detecting the external optical signal will be referred to as the receiving photo diode chip 500, and the second photo diode chip for monitoring the operation state of the laser diode chip 100 will be referred to as a monitoring photo diode chip. Also, it will be assumed hereinafter that laser light emitted from the laser diode chip 100 has a wavelength of 1310 nm, and laser light advancing from the optical fiber to the receiving photo diode chip 500 has a wavelength of 1490 nm. This wavelength classification is provided only for convenience of description, and the wavelength classification is equally applied even when the wavelengths are reversed. In the module manufactured as described above, laser light of 1310 nm emitted from the laser diode chip 100 is reflected at the front side incline plane of the self-standing parallel plate beam splitter 210, with the result that the advance direction of the laser light is changed 90 degrees, and then the laser light is transmitted to the optical fiber through an upper lens (not shown). Light has a property in that the advance direction of the light is reversible. Consequently, laser light, having a wavelength of 1490 nm, emitted from the optical fiber is incident on the self-standing parallel plate beam splitter 210 in the direction opposite to the advance direction of the laser light, having a wavelength of 1310 nm, advancing from the laser diode chip 100 to the optical fiber. Since the front side incline plane of the self-standing parallel plate beam splitter 210 has a property to transmit laser light of 1490 nm incident from the optical fiber, the laser light of 1490 nm reaching the front side incline plane of the self-standing parallel plate beam splitter 210 is transmitted into the self-standing parallel plate beam splitter 210 and continues to advance. The self-standing parallel plate beam splitter 210 used in the present invention is manufactured using silicon or glass, which does not absorb a near-infrared wavelength of 1310 nm or 1490 nm, as the basic material. Consequently, laser light, having a wavelength of 1490 nm, advancing to the self-standing parallel plate beam splitter 210 is transmitted through the self-standing parallel plate beam splitter 210 and then exits from the back side incline plane of the self-standing parallel plate beam splitter 210. The laser light, having a wavelength of 1490 nm, exiting from the back side incline plane of the self-standing parallel plate beam splitter 210 has the same advance direction as before the laser light reaches the self-standing parallel plate beam splitter 210 according to Snell's law. Consequently, the laser light, having a wavelength of 1490 nm, transmitted through the self-standing parallel plate beam splitter 210, exits into the " ⊂ "-shaped groove of the " ⊂ "-shaped first sub mount 300, as shown in FIG. 18. Since the receiving photo diode chip 500 is disposed in the groove of the first sub mount 300, the laser light, having a wavelength of 1490 nm, incident from the optical fiber, is received by the receiving photo diode chip 500, whereby the reception of the transmitted optical signal is achieved. The receiving photo diode chip 500 is installed at the top of the receiving photo diode chip sub mount 510, which is installed at the bottom plane in the " ⊂ "-shaped groove of the first sub mount 300. In this structure, the receiving photo diode chip 500 is located in the lower space of the self-standing parallel plate beam splitter 210. Consequently, it is possible to minimize the bottom area, and therefore, it is possible to integrate the transmitting laser diode chip and the receiving photo diode chip in the TO type package housing even through the size of the TO type package housing is very small. To this end, it is required to provide a subminiature self-standing parallel plate beam splitter constructed in a structure in which the front and back side planes, reflecting or transmitting laser light, of the self-standing parallel plate beam splitter have a tilt angle of 45 degrees to the bottom plane, and the front and back side planes are parallel to each other. Also, the tilt angle of the self-standing parallel plate beam splitter 210 decides the advance angle of an upstream laser light signal, emitted from the laser diode chip 100 and reflected at the front side incline plane of the self-standing parallel plate beam splitter 210, when exiting the TO type package. The exiting angle of the laser light exiting the TO type package is a very important factor that decides condensing efficiency and manufacturing efficiency when condensing the laser light to the optical fiber using a lens (not shown). Consequently, it is important to maintain the exiting angle of the laser light such that the exiting angle of the laser light is nearly perpendicular to the TO type package. For this reason, it is very important to manufacture a subminiature self-standing parallel plate beam splitter constructed in a structure in which the tilt angle of the self-standing parallel plate beam splitter 210 is maintained at an angle of approximately 45 degrees.

Hereinafter, a method for manufacturing the subminiature self-standing parallel plate beam splitter with the above-stated construction according to an embodiment of the present invention will be described.

FIGS. 22 and 23 are conceptional views illustrating a process for manufacturing a self-standing parallel plate beam splitter having wavelength selectivity using a semiconductor silicon wafer according to an embodiment of the present invention.

Referring first to FIG. 22, a single crystal semiconductor silicon wafer is manufactured by cutting a single crystal silicon ingot, such that {100} planes generally become top and bottom planes of the wafer, and polishing the surface of each cut piece of the silicon ingot. A portion of each silicon wafer at any one {100} plane is covered with photo resist (PR), serving as an etching prevention layer, and the remaining region of the silicon wafer where the photo resist is not applied is etched with an anisotropic etching solution, such as HCL or KOH, with the result that side planes, as {111} planes, are formed by etching. In each silicon wafer having a diamond structure, the {111} planes have a tilt angle of 54.74 degrees to the {100} plane. In other words, when a single crystal silicon wafer having a {100} plane direction is etched, by anisotropic etching, to form {111} planes, the {111} planes have a tilt angle of 54.74 degrees to {100} planes, which are the top and bottom planes of the wafer.

On the other hand, when the silicon ingot is cut such that the each cut piece of the silicon ingot is tilted at an angle of 9.74 degrees to a {100} plane direction, as shown in FIG. 23, the top and bottom planes of each cut semiconductor wafer are tilted at an angle of 9.74 degrees to the {100} plane. A portion of each silicon wafer is covered with photo resist, and the remaining region of the silicon wafer where the photo resist is not applied is etched with an anisotropic etching solution, such as HCL or KOH, with the result that side planes, as {111} planes, are formed by etching, irrespective of the angle when the silicon ingot is cut to manufacture each wafer. The {111} planes have a tilt angle of 54.74 degrees to the {100} plane, and the top and bottom planes of each silicon wafer have a tilt angle of 9.74 degrees to the {100} plane. Consequently, the etched {111} planes have a tilt angle of 54.74 degrees +9.74 degrees and a tilt angle of 54.74 degrees −9.74 degrees to the top and bottom planes of each wafer, and therefore, the {111} planes have a tilt angle of 45 degrees and a tilt angle of 64.48 degrees to the bottom plane of each wafer.

FIG. 24 is a conceptional view illustrating a process for manufacturing a self-standing parallel plate beam splitter using a single crystal silicon wafer exhibiting a property described in connection with FIG. 23.

First, as shown in FIG. 24(a), a semiconductor silicon ingot is cut to obtain a semiconductor silicon wafer having a tilt angle of 9.74 to a {001} plane, and photo resist is applied to a portion of the top of the obtained semiconductor silicon wafer. Subsequently, as shown in FIG. 24(b), the photo resist at a region to be etched is removed by photolithography. Subsequently, as shown in FIG. 24(c), the region where the photo resist is removed off the semiconductor silicon wafer is etched with an anisotropic etching solution, with the result that side planes, as {111} planes, are formed by etching. Since the etched {111} planes have a tilt angle of 54.74 degrees to the {001} plane, and the semiconductor silicon wafer is cut from the semiconductor silicon ingot such that the {001} plane has a tilt angle of 9.74 degrees to the horizontal plane, the etched and thus exposed {111} planes have a tilt angle of 45.00 degrees and a tilt angle of 64.48 degrees to the horizontal plane of the semiconductor silicon wafer.

Subsequently, as shown in FIG. 24(d), a dielectric thin film having a property to reflect a wavelength of laser light emitted from a laser diode chip 100, which is installed in a module, and transmit a wavelength of laser light emitted from an optical fiber is deposited on the bottom plane of the wafer, in which the two {111} planes having a tilt angle of 45.00 degrees and a tilt angle of 64.48 degrees to the bottom plane of the semiconductor silicon wafer are exposed. Such a dielectric thin film having wavelength selectivity may be obtained by alternately depositing materials having different refractive indexes. Generally, a dielectric thin film having wavelength selectivity is obtained by alternately depositing materials having different refractive indexes, e.g., titanium oxide ($TiO_2$) and silicon oxide ($SiO_2$) or thallium oxide ($TlO_2$). A filter, having wavelength selectivity, manufactured by a method for alternately depositing materials having different refractive indexes on a glass substrate has been already adopted widely in conventional bidirectional optical communication modules.

Subsequently, as shown in FIG. 24(e), an antireflective layer is deposited on the top plane of the silicon wafer for preventing the reflection at the interface between the silicon wafer and the air when laser light emitted from an optical fiber is transmitted through the silicon wafer, exits the silicon wafer, and advances into the air. The deposition of such an antireflective layer may be achieved by adjusting the thickness of the above-described dielectric layer of $TiO_2$/$SiO_2$/$TlO_2$. The top and bottom planes of the semiconductor silicon wafer have high smoothness after polishing. Consequently, it is very easy to deposit the dielectric thin film on the smooth top and bottom planes of the semiconductor silicon wafer.

The semiconductor silicon wafer, manufactured through the above-described processes, is cut into an appropriate size, as shown in FIG. 24(f), with the result that a 45-degree beam splitter is manufactured in a form as shown in FIG. 24(g). When the 45-degree beam splitter, manufactured as shown in FIG. 24(g) is placed such that the etched {111} plane is directed downward, a self-standing parallel plate beam splitter 210 in a form as shown in FIG. 24(h) is completed.

In the embodiment of the present invention, the description was given based on the BiDi module when depositing the dielectric thin film on the top and bottom planes of the silicon wafer. However, a process for manufacturing a self-standing parallel plate beam splitter for a triplexer module or a bidirectional-communication DWDM transceiver module having a wavelength locking function, which will be described hereinafter, is characterized by depositing a dielectric thin film suitable for each application example on the top and bottom planes of the silicon wafer. Such a method for manufacturing a self-standing parallel plate beam splitter 210 using a semiconductor etching process is suitable for the manufacture of a subminiature self-standing parallel plate beam splitter 210; however, it is also possible to manufacture a self-standing parallel plate beam splitter using other different methods.

Meanwhile, when a glass or silicon substrate is cut to manufacture optical parts, the process for cutting the glass or silicon substrate is carried out with a saw having a small thickness. This cutting method is called a sawing method. It is possible to manufacture a self-standing parallel plate beam splitter at a sawing angle of 45 degrees at the time of sawing.

FIG. 25 is a view illustrating an example of a process for manufacturing a self-standing parallel plate beam splitter using a sawing method in accordance with an embodiment of the present invention.

First, as shown in FIG. 25(a), a dielectric thin film having transmission and reflection properties suitable for various application examples, such as a BiDi module, a triplexer module, and a bidirectional-communication DWDM module having a wavelength locking function, is deposited on opposite planes of a glass or silicon substrate. The present invention to which the sawing method is applied will be described based on the BiDi module. For a BiDi module, which is an embodiment of the present invention, a dielectric thin film having a property to transmit a wavelength of 1490 nm and a property to reflect a wavelength of 1310 nm is deposited on the top plane of the parallel plate, and a dielectric thin film having a property not to reflect but to transmit a wavelength of 1490 nm is deposited on the bottom plane of the parallel plate.

Subsequently, as shown in FIG. 25(b), the parallel plate is cut with a rotary saw, which is maintained at an angle of 45 degrees to the parallel plate, with the result that the angle between the cut planes and the top and bottom planes of the parallel plate form an angle of 45 degrees. The manufactured substrate is rotated 45 degrees, as shown in FIG. 25(c), to complete a BiDi self-standing parallel plate beam splitter 210 that is capable of reflecting laser light having a wavelength of 1310 nm emitted from the laser diode chip 100 and transmitting a laser light having a wavelength of 1490 nm incident from the optical fiber.

FIG. 26 is a view illustrating an example of a process for manufacturing a self-standing parallel plate beam splitter by a sawing method in accordance with another embodiment of the present invention. As shown in FIG. 26, a rotary saw, for cutting a substrate having dielectric thin films deposited on the top and bottom planes thereof, has a 45-degree wedge-type section with a protrusion. Consequently, when the substrate is cut by the rotary saw having the protruding 45-degree wedge-type section, each cut substrate has a cutting plane to cut the bottom plane and the incline plane of the self-standing parallel plate beam splitter 210. Consequently, when the second sub mount 310 and the self-standing parallel plate beam splitter 210 are fixed to the first sub mount 300 such that the second sub mount 310 and the self-standing parallel plate beam splitter 210 come into contact with each other, as shown in FIG. 21, an empty space is formed below the joint between the self-standing parallel plate beam splitter 210 and the second sub mount 310. The empty space will be filled with a bonding agent 301, such as solder or epoxy.

Meanwhile, a semiconductor silicon wafer may be etched by a dry etching method. The dry etching method is a method for etching the semiconductor silicon wafer with etching gas.

In particular, a dry etching method using plasma has a property in that etching orientation is very excellent in the movement direction of the plasma.

FIG. 27 is a view illustrating an example of a process for manufacturing a self-standing parallel plate beam splitter by a dry etching method using such plasma.

As shown in FIG. 27, a wafer to be etched is placed in an etching apparatus for performing a dry etching process using a dry etching method at a tilt angle of 45 degrees, and the dry etching process is performed in the plasma etching direction. As a result, the wafer is etched as indicated by a dotted line, and finally a self-standing parallel plate beam splitter 210 as shown in FIG. 23 is manufactured.

In addition to methods for cutting the substrate at a tilt angle of 45 degrees to manufacture the self-standing parallel plate beam splitter 210 as shown in FIGS. 25 to 27, other methods, such as a method for cutting the substrate using laser, may also used to manufacture the self-standing parallel plate beam splitter 210, and it is natural that these methods are included in a category for manufacturing the self-standing parallel plate beam splitter 210.

Meanwhile, the self-standing parallel plate beam splitter 210 may have various forms based on the cut size of each separate self-standing parallel plate beam splitter when separating each individual self-standing parallel plate beam splitter from the semiconductor silicon wafer manufactured through the process of FIG. 24.

FIG. 28 is a view illustrating various forms of the self-standing parallel plate beam splitter according to the embodiment of the present invention. In the self-standing parallel plate beam splitter shown in FIG. 28, plane ① indicates a polished bottom plane of the original silicon wafer, plane ② indicates a sawn plane of the original silicon wafer, plane ③ indicates an etched plane of the original silicon wafer, and plane ④ indicates a polished top plane of the original silicon wafer.

Depending upon the arrival position of laser light at the self-standing parallel plate beam splitter 210 manufactured in the form as described above, the laser light has various transmission paths. FIG. 29 is a view illustrating an example of light paths changed depending upon the position of light incident on the self-standing parallel plate beam splitter.

As shown in FIG. 29, laser light advancing downward from above the self-standing parallel plate beam splitter 210 in the vertical direction is transmitted through the front side incline plane of the self-standing parallel plate beam splitter 210 and then advances in the self-standing parallel plate beam splitter 210. At this time, the laser light advancing in the self-standing parallel plate beam splitter 210 has different advancing paths depending upon the arrival positions of the laser light in the self-standing parallel plate beam splitter 210.

As shown in FIG. 29, light incident on region "L" advances in the self-standing parallel plate beam splitter 210, while having an angle of 11.7 degrees to the perpendicular line of the front side incline plane of the self-standing parallel plate beam splitter 210, according to Snell's law. When the light advancing in the self-standing parallel plate beam splitter 210 meets the bottom plane of the self-standing parallel plate beam splitter 210, the light has an incidence angle of 33.3 degrees to the perpendicular line of the bottom plane of the self-standing parallel plate beam splitter 210. On the assumption that the silicon has a refractive index of 3.5 and the air has a refractive index of 1, the incidence angle of 33.3 degrees is an incidence angle corresponding to total reflection. Consequently, the light incident on region "L" is totally reflected at the bottom plane of the self-standing parallel plate beam splitter 210, reaches plane ② of the self-standing parallel plate beam splitter 210, and then exits into the air.

On the other hand, light incident on region "H" of the self-standing parallel plate beam splitter 210 in the vertical direction has an incidence angle of 45 degrees to the perpendicular line of the front side incline plane of the self-standing parallel plate beam splitter 210. The light, transmitted through the front side incline plane and advancing in the self-standing parallel plate beam splitter 210 according to Snell's law, has an angle of 11.7 degrees to the perpendicular line of the front side incline plane. When the light is incident on plane ④, the light has an incidence angle of 11.7 degrees to the perpendicular line of plane ④. The light exits into the air while the light has a downward vertical directionality. Consequently, it is required for the laser light to advance to plane ④, i.e., the back side incline plane, of the self-standing parallel plate beam splitter 210 in order that the laser light incident from the optical fiber is transmitted through the self-standing parallel plate beam splitter 210 and incident on the receiving photo diode chip 500 disposed below the self-standing parallel plate beam splitter 210.

FIG. 30 is a view illustrating an example of an incident point minimum height at which laser light is incident on the front side incline plane of the self-standing parallel plate beam splitter, which is necessary for the laser light advancing downward in the perpendicular direction to be transmitted through the self-standing parallel plate beam splitter and continue to advance downward in the perpendicular direction.

As shown in FIG. 30, it is assumed that the position where the laser light reaches the front side incline plane of the self-standing parallel plate beam splitter 210 is A, the intersection point between the bottom plane and the back side incline plane is B, the intersection point between the perpendicular line from A to the back side incline plane and the back side incline plane is C, and the intersection point between the perpendicular line from A to the bottom plane and the bottom plane is D. The length of segment A-C corresponds to the thickness of the self-standing parallel plate beam splitter 210. When manufacturing the self-standing parallel plate beam splitter 210 using a semiconductor process, the thickness of the semiconductor wafer corresponds to the length of segment A-C, and therefore, the length of segment A-C may be easily adjusted or measured. Here, the length of segment A-C is denoted by t. The length of segment A-B depends upon t and an advance angle $\theta_2$ of the laser light in the self-standing parallel plate beam splitter 210. $\theta_2$ depends upon an incidence angle $\theta_1$ of the laser light incident on the self-standing parallel plate beam splitter 210 and a refractive index $n_2$ of the self-standing parallel plate beam splitter 210.

The following mathematical equations are represented by a simple trigonometrical function.

$l \times \cos \theta_2 = t$      Mathematical equation 2

$l = t / \cos \theta_2$      Mathematical equation 3

$h = l \times \cos(45° - \theta_2) = t \times \cos(45° - \theta_2) / \cos \theta_2$      Mathematical equation 4

On the assumption that the air has a refractive index of 1, $\theta_2$ is represented by Mathematical equation 5 below according to Snell's law.

$\theta_2 = \arcsin(n_2 \times \sin \theta_1 / n_2)$      Mathematical equation 5

Consequently, the height of the self-standing parallel plate beam splitter 210, necessary for the laser light to advance in the downward perpendicular direction, be transmitted through the front side incline plane of the self-standing parallel plate beam splitter 210, and continue to advance in the downward perpendicular direction, must be greater than at least the height h represented by Mathematical equation 4 and Mathematical equation 5.

The principal idea of the present invention is a method for disposing the self-standing parallel plate beam splitter 210, horizontally disposing the edge emitting laser diode chip 100 while the bottom plane of the edge emitting laser diode chip 100 is directed downward such that the edge emitting laser diode chip 100 is adjacent to the front side incline plane of the self-standing parallel plate beam splitter 210, and disposing the receiving photo diode chip 500 below the self-standing parallel plate beam splitter 210. Several methods for assembling a module using a method for reflecting laser light emitted from the laser diode chip 100 at the front side incline plane to change the advance direction of the laser light and transmitting laser light to be received through the front side incline plane were previously described in the background art section. As previously described in the background art section, however, these methods have several problems in that it is difficult to manufacture the beam splitter, and assembly for optical alignment is difficult, whereby the manufacturing costs are high. According to the present invention, on the other hand, the above-mentioned problems are solved, whereby it is easy to manufacture the beam splitter, and, at the same time, assembly for optical alignment is easily achieved.

FIG. 31 is an assembly view, in detail, illustrating a process for assembling the BiDi block shown in FIGS. 17 and 18. As shown in FIG. 31, a first sub mount 300 is provided at one side thereof with a "⊂"-shaped groove, into which a receiving photo diode chip 500 will be inserted. Preferably, the first sub mount 300 is made of silicon, which is inexpensive and can be easily formed in the shape of "⊂" by a dry or wet etching process. At this time, a silicon wafer having a {110} plane direction is suitable for the silicon substrate having the "⊂"-shaped groove formed at one side thereof. This is because the etched sections, i.e., {111} planes, formed by anisotropic etching, such as KOH or HCl, are perpendicular to the {110} plane, and therefore, walls of the "⊂"-shaped groove are perpendicular to the bottom plane.

A self-standing parallel plate beam splitter 210, which is a wavelength selective reflection/transmission mirror, is installed at the top of the first sub mount 300 formed in the shape of "⊂". The self-standing parallel plate beam splitter 210 is installed such that a portion of the bottom plane of the self-standing parallel plate beam splitter 210 is located in the "⊂"-shaped groove of the first sub mount 300. Also, a second sub mount 310 having a laser diode chip 100 attached to the top thereof is installed at the other side of the top of the first sub mount 300. At this time, the second sub mount 310 and the self-standing parallel plate beam splitter 210 are installed such that the second sub mount 310 is in tight contact with the front side incline plane of the self-standing parallel plate beam splitter 210. The second sub mount 310 may be manufactured by the same method as the method for manufacturing the self-standing parallel plate beam splitter 210. Specifically, the second sub mount 310 may be manufactured by a manufacturing method identical to the method for manufacturing the self-standing parallel plate beam splitter 210 except that a process for depositing a dielectric film for wavelength selection on the plane is omitted. Subsequently, a receiving photo diode chip sub mount 510 having a receiving photo diode chip 500 attached to the top thereof is inserted into the "⊂"-shaped groove of the first sub mount 300 such that the receiving photo diode chip sub mount 510 is coupled to the first sub mount 300.

FIGS. 32 and 33 are views illustrating the structure of a general photo diode chip. As shown in FIG. 32, the general photo diode chip is manufactured using a semiconductor wafer, constructed in a structure in which an undoped-InGaAs layer 830 having a thickness of approximately 1000 nm, as a light absorption layer, is grown in a lattice matched state at the top of an n-InP substrate 820 exhibiting a negative doping property, an undoped-InP layer 840 having a thickness of approximately 1000 nm and a p-InP layer 850 having a thickness of approximately 1.5 μm and exhibiting a positive doping property are grown on the undoped-InGaAs layer 830, and a p-InGaAs layer 860 having a thickness of approximately 300 nm is grown by metal organic vapor phase epitaxy (MOCVD), liquid phase epitaxy (LPE), molecular beam epitaxy (MBE), or hydride vapor phase epitaxy (HVPE), as a substrate. Subsequently, the p-InGaAs layer 860 and the p-InP layer 850 at the remaining region excluding a light absorption region of the substrate are etched to define the light absorption region. On the p-InGaAs layer 860 at the unetched light absorption region is formed a p-ohmic contact layer 870 using a titanium-platinum-gold alloy, the p-InGaAs layer 860 at the light absorption region uncovered with metal is removed, and n-type ohmic contact metal 810 is deposited at the bottom of the n-InP substrate 820 to manufacture a photo diode chip. Alternatively, as shown in FIG. 33, both a p-type electrode and an n-type electrode may be formed at one side of the substrate to manufacture a photo diode chip.

In a BiDi type module that is capable of performing bidirectional communication using a single TO type package, in which a transmitting laser diode chip and a receiving photo diode chip are simultaneously mounted, one of the important application examples of the present invention, some of laser light to be transmitted is directly incident on the receiving photo diode chip due to the structure in which both the transmitting laser diode chip and the receiving photo diode chip are mounted in the single package, with the result that cross-talk may occur. To minimize such cross-talk, more preferably, an optical filter for transmitting laser light of a wavelength to be received and reflecting laser light of a wavelength to be transmitted such that the optical filter is disposed adjacent to the photo diode chip. For the structure in which both the p-type electrode and the n-type electrode are formed at one side of the chip, as shown in FIG. 33, there is widely adopted a method for reversely attaching the photo diode chip to the substrate having an electric signal transmission electrode formed thereon and electrically connecting the p-type electrode and the n-type electrode of the substrate to a p-type electrode and an n-type electrode of the photo diode chip via metal balls. This method is called flip chip bonding. In such flip chip bonding, the substrate-side surface of the photo diode chip does not perform any electrical function, and therefore, any possible processing method may be applied on the substrate-side surface of the photo diode chip without limit.

FIG. 34 is a view illustrating an example in which the photo diode chip is flip-chip bonded to a substrate for electric signal transmission. In this structure, light of a 1310 nm band wavelength having an energy of 0.95 eV and light of a 1550 nm band wavelength having an energy of 0.80 eV are transmitted through an InP substrate having a band gap energy of 1.35 eV, without absorption, and are then absorbed into a light absorption region of InGaAs having a band gap energy of approximately 0.75 eV, where the optical signal is converted into an electric signal. Consequently, when an optical signal advances downward from above, the optical signal is converted into an electric signal irrespective of whether the p side of the photo diode chip is directed upward or the n-type substrate is directed upward. In the bidirectional-communication BiDi type module, which is an important application example of the present invention, light having a wavelength incident from the optical fiber and received by the receiving photo diode chip is light having a 1490 nm band wavelength or a 1550 nm band wavelength, whereas a semiconductor laser diode chip for emitting laser light of a 1310 band wavelength to transmit an upstream optical signal is mounted in the bidirectional-communication BiDi type module. Generally, laser light emitted from the bidirectional-communication BiDi type module has intensity 100 times higher than an optical signal for reception transmitted through a long-distance optical fiber. The InGaAs absorption region of the photo diode chip responds not only laser light of a 1490 nm band wavelength and laser light of a 1550 nm band wavelength but also laser light of a 1310 nm band wavelength. Consequently, when laser light of a 1310 nm band wavelength emitted from the laser diode chip mounted in the bidirectional-communication BiDi module is incident on the receiving photo diode chip, there occurs a cross-talk phenomenon in which the received signal and the transmitted signal are mixed with each other. For this reason, there is needed a method for allowing light of a wavelength emitted from the optical fiber to be incident on the photo diode but preventing light emitted from the laser diode chip mounted in the bidirectional-communication BiDi module from being incident on the receiving photo diode chip.

As shown in FIG. 34, a wavelength selective filter may be obtained by alternately depositing dielectric thin films, such as Si, $SiO_2$ and $TiO_2$, having relatively high and low refractive indexes. The wavelength selective filter obtained by depositing the dielectric thin films has a property in that the wavelength selectivity of the filter changes depending upon the incidence angle of incident light. For this reason, when light is incident on the wavelength selective filter at an angle different from the incidence angle of the received light, the wavelength selectivity of the filter may lower. This problem may be solved by a method for covering the remaining n-type substrate, excluding the opposite n-type substrate area at the InGaAs light absorption region of the photo diode chip, with a metal material exhibiting a property to reflect all wavelengths. Common metal materials, such as Au, Al, Ag and Cu, absorb or reflect light of all wavelengths, and therefore, these metal materials minimize the incidence of stray light on the active region of the photo diode chip in the bidirectional-communication optical module. Also, in a case in which the position of the InGaAs absorption region is indicated at the n-type substrate side of the photo diode chip with a metal thin film, the indication may be utilized as a reference point when performing optical alignment of the photo diode chip during the assembly of the bidirectional-communication BiDi type module, whereby it is possible to smoothly perform the assembly of the BiDi type module.

Meanwhile, the stray light in the BiDi optical module may enter the active region of the photo diode chip not only through the n-type substrate plane of the photo diode chip but also through the side planes of the photo diode chip and through a space defined between the photo diode chip and a substrate for electrode connection below the photo diode chip. FIG. 35 is a view illustrating an example in which such stray light enters the active region of the photo diode chip, and FIG. 36 is a view illustrating an example to reduce a noise component generated by the stray light. As shown in FIG. 36, a polymer material exhibiting opacity with respect to all kinds of light and electrical nonconductibility is applied to the side planes of the receiving photo diode chip for preventing the incidence of a noise component on the receiving photo diode chip through the side planes of the receiving photo diode chip. Examples of such a polymer material exhibiting the above-mentioned properties may include polyethylene (PE), polypropylene (PP), and epoxy, containing light absorption dye.

The self-standing parallel plate beam splitter according to the present invention may be applied to various modules. Another important application example is a TO type laser diode package having a front side monitoring function to monitor the operation state of a laser diode using laser light emitted from the front side of a laser diode chip. In the edge emitting laser diode chip, light is emitted from the opposite edges of the laser diode chip, the side from which light is strongly emitted by the reflexibility adjustment coating layers for adjusting the reflexibility of the edges is referred to as the front side of the laser diode chip, and the side from which light is weakly emitted by the reflexibility adjustment coating layers is referred to as the back side of the laser diode chip, which were previously described in detail. In a general semiconductor laser diode chip, the reflexibility of the front side thereof is approximately 1 to 30%, and the reflexibility of the back side thereof is approximately 30 to 99%. At the ratio of the reflexibility of one side to the reflexibility of the other side, the intensity of laser light emitted from the back side of the laser diode chip is linearly proportional to that of laser light emitted from the front side of the laser diode chip. In a reflective semiconductor optical amplifier (RSOA), however, the reflexibility of the front side of the chip is 1% or less, normally 0.01% or less. On the other hand, the rear side of the RSOA has a reflexibility of approximately 30 to 99%. When the difference between the reflexibility of the front side of the laser diode chip and the reflexibility of the back side of the laser diode chip is great, as described above, the ratio of the intensity of laser light emitted from the front side of the laser diode chip to the intensity of laser light emitted from the back side of the laser diode chip changes depending upon the amount of current injected into the laser diode. In the semiconductor laser diode chip, such as RSOA, therefore, it is not possible to monitor the intensity of laser light emitted from the front side of the laser diode chip using light emitted from the back side of the laser diode chip. For this reason, there is being used, at the present time, a method for dividing laser light emitted from the front side of the laser diode chip and condensed to the optical fiber through the lens into two paths to use one of the paths for external signal transmission and monitor the operation state of the RSOA using the laser light on the other path outside the TO type package. However, this method needs a large-volume and expensive optical distributor and an additional TO type monitoring photo diode chip. That is, this method is cost-consuming.

FIG. 37 is a conceptional view illustrating a front side monitoring function of the laser semiconductor diode chip according to the embodiment of the present invention to solve the above-mentioned problems, and FIG. 38 is a view illustrating the structure of a TO type package having the front side monitoring photo diode chip of FIG. 37 installed therein.

A self-standing parallel plate beam splitter 220 applied to FIGS. 37 and 38 is constructed in a structure in which a dielectric thin film is deposited on the front side incline plane directed toward the laser diode chip 100, during the manufacture of the self-standing parallel plate beam splitter described in connection with FIGS. 24 to 27, such that the front side incline plane has a property as a partial mirror to partially transmit and partially reflect light emitted from the front side of the laser diode chip 100. Also, a dielectric thin film is deposited on the back side incline plane of the self-standing parallel plate beam splitter 220, such that the back side incline plane exhibits an antireflection property with respect to light transmitted through the self-standing parallel plate beam splitter 220. At the side of the back side incline plane of the self-standing parallel plate beam splitter 220, a front side monitoring photo diode chip 450 for monitoring the operation state of the laser diode chip 100 using laser light transmitted through the self-standing parallel plate beam splitter 220 is mounted to a front side monitoring photo diode chip sub mount 460. In this embodiment, when the reflexibility of the front side incline plane of the self-standing parallel plate beam splitter 220 directed toward the laser diode chip 100 is too low, the intensity of a signal to be transmitted out of the TO package becomes small. On the other hand, when the reflexibility of the front side incline plane of the self-standing parallel plate beam splitter 220 is too high, the optical intensity of a signal to be incident on the front side monitoring photo diode chip 450 becomes too small. Therefore, the reflexibility of the front side incline plane of the self-standing parallel plate beam splitter 220 is preferably 80 to 97%, more preferably 85 to 95%. The path of the laser light transmitted through the self-standing parallel plate beam splitter 220 in FIGS. 37 and 38 is the same as in FIG. 15.

A triplexer module necessary to transmit an optical signal for transmission of a 1310 nm band wavelength and an optical signal for reception of a 1550 nm band wavelength using a single optical fiber was previously described with reference to FIG. 9. Through the use of the self-standing parallel plate beam splitter according to the present invention, it is possible to manufacture a triplexer module mounted in a single package, i.e., a one body TO type triplexer module.

FIG. 39 is a view illustrating the structure of a triplexer module in which a triplexer function is implemented in a single package in accordance with an embodiment of the present invention.

In describing the triplexer module according to the embodiment of the present invention, it is assumed that laser light emitted from a laser diode chip 100 mounted in the package has a wavelength of 1310 nm band, and light for reception emitted from an optical fiber has a wavelength of 1490 nm band and a wavelength of 1550 nm band. As shown in FIG. 39, the front side incline plane of a self-standing parallel plate beam splitter 230 directed toward the laser diode chip 100 is coated with an antireflective transmissive layer not to reflect the 1310 nm band, wavelength. Also, the front side incline plane of the self-standing parallel plate beam splitter 230 is coated with a high-reflective layer to reflect the 1490 nm band wavelength. The back side incline plane of the self-standing parallel plate beam splitter 230 directed toward an optical fiber (not shown) is coated with an antireflective transmissive layer not to reflect the 1310 nm band wavelength and the 1490 nm band wavelength. Also, the back side incline plane of the self-standing parallel plate beam splitter 230 is coated with a high-reflective layer to reflect the 1550 nm band wavelength. When using the self-standing parallel plate beam splitter 230 with the above-stated construction, laser light of a 1310 nm wavelength emitted from the laser diode chip 100 is transmitted through the self-standing parallel plate beam splitter 230 and advances toward the optical fiber (not shown) because the opposite planes of the self-standing parallel plate beam splitter 230 are coated with the antireflective layers not to reflect the 1310 nm band wavelength. Laser light of a 1550 nm wavelength incident from the optical fiber (not shown) is reflected at the back side incline plane of the self-standing parallel plate beam splitter 230 and is then incident on a photo diode chip 502 for receiving a 1550 nm band wavelength, disposed vertically below the self-standing parallel plate beam splitter 230, where an optical current signal is generated. The optical path of the 1490 nm band wavelength transmitted through the back side incline plane of the self-standing parallel plate beam splitter 230 and reflected at the front side incline plane of the self-standing parallel plate beam splitter 230 was previously described in detail with reference to FIG. 16. As previously described in connection with FIG. 16, laser light of a 1490 nm wavelength incident from the optical fiber is transmitted through the back side incline plane of the self-standing parallel plate beam splitter 230, is reflected at the front side incline plane of the self-standing parallel plate beam splitter 230, reaches the back side incline plane of the self-standing parallel plate beam splitter 230, and is then incident on a photo diode chip 501 for receiving a 1490 nm band wavelength, disposed vertically below the self-standing parallel plate beam splitter 230.

Among paths of the light transmitted through the back side incline plane of the self-standing parallel plate beam splitter 230, reflected at the front side incline plane of the self-standing parallel plate beam splitter 230, and reaching the back side incline plane of the self-standing parallel plate beam splitter 230, the path of the light reflected at the front side incline plane of the self-standing parallel plate beam splitter 230 and advancing to the back side incline plane of the self-standing parallel plate beam splitter 230 is identical to that of the light incident on the beam splitter in the perpendicular direction and transmitted through the beam splitter in FIG. 15. Consequently, the minimum height of the light at the front side incline plane necessary for the light transmitted through the back side incline plane of the self-standing parallel plate beam splitter 230 and reflected at the front side incline plane of the self-standing parallel plate beam splitter 230 not to be incident on the bottom plane of the self-standing parallel plate beam splitter 230 must be greater than the height h represented by Mathematical equation 4 and Mathematical equation 5. The height h is equal to the point where light emitted from the laser diode chip 100 reaches the self-standing parallel plate beam splitter 230. Even in the triplexer module using the self-standing parallel plate beam splitter 230, therefore, the minimum height of light emitted from the laser diode chip 100 mounted in the triplexer module and reaching the self-standing parallel plate beam splitter 230 is equal to the height h represented by Mathematical equation 4 and Mathematical equation 5.

In the wavelength selective beam splitter manufactured using dielectric thin films having relatively high and low refractive indexes as described above, the transmission/reflection property of the wavelength selective beam splitter greatly depend on the incidence angle of light incident on the wavelength selective beam splitter. In order that the light of a 1490 nm band wavelength and the light of a 1550 nm band wavelength are easily divided from each other by the wavelength selective beam splitter, therefore, it is advantageous for all the light components incident on the wavelength selective beam splitter to have the same incidence angle. Consequently, a lens 700, disposed between the laser diode chip 100 and the self-standing parallel plate beam splitter 230 as shown in FIG. 39, serves to change the laser light emitted from the laser diode chip 100 into parallel light. In order to condense the laser light, changed into the parallel light, to an optical fiber, it is necessary to provide an additional lens (not shown) between the laser diode chip 100 and the optical fiber. Light is reversible on its path. In a structure in which light is emitted from the laser diode chip 100, is changed into parallel light by the lens 700, and is condensed to the optical fiber by the additional lens (not shown), therefore, laser light incident from the optical fiber is changed into parallel light by the additional lens (not shown) adjacent to the optical fiber. Consequently, when light of a 1490 nm band wavelength and the light of a 1550 nm band wavelength, incident from the optical fiber, reaches the respective planes of the self-standing parallel plate beam splitter 230, the lights have a property as parallel light. As a result, the light of a 1490 nm band wavelength and the light of a 1550 nm band wavelength, incident on the wavelength selective beam splitter as the parallel light, can be easily divided from each other.

Although a single self-standing parallel plate beam splitter is used in FIG. 39, the direction of the light finally advancing out of the package is parallel to the bottom plane of the package. A package the most effectively exhibiting such a property may be a mini-DIL, mini-flat or butterfly package. However, it costs several US dollars to several tens of US dollars to manufacture the housing of the mini-DIL, mini-flat or butterfly package as compared with the housing of the TO type package manufactured generally at low costs, e.g., 0.1 to 0.5 US dollars. For this reason, it is required to manufacture a TO type package having a triplexer function using an inexpensive TO type package housing.

An embodiment for applying a triplexer function to a TO type package is illustrated in FIG. 40. FIG. 40 is a view illustrating an example of a TO type package to which two self-standing parallel plate beam splitters are applied. A second self-standing parallel plate beam splitter 270 is disposed at one side of a first self-standing parallel plate beam splitter 230 to achieve a function as a TO type triplexer. Here, the second self-standing parallel plate beam splitter 270 is referred to as a beam splitter, but it is required for the second self-standing parallel plate beam splitter 270 to have only a property to reflect light of all wavelengths at the front side incline plane thereof. In order for the second self-standing parallel plate beam splitter 270 to have a property to reflect light of all wavelengths, it is preferred that the front side incline plane of the second self-standing parallel plate beam splitter 270 be coated with metal, such as Au, Al, Ag and Cu.

Meanwhile, two self-standing parallel plate beam splitters may be used to implement the function of FIG. 39. FIG. 41 is a view illustrating the structure of a triplexer module that performs the function of FIG. 39 using two self-standing parallel plate beam splitters.

As shown in FIG. 41, a bidirectional-communication triplexer optical module package according to the present invention is constructed in a structure in which a second sub mount 310 for a laser diode chip is installed at one side of the top of a first sub mount 300, and a laser diode chip 100 is installed at the top of the second sub mount 310. Also, a lens 700 for changing laser light for transmission of a 1310 nm band wavelength emitted from the laser diode chip 100 into parallel light is installed at one side of the top of the first sub mount 300, and a self-standing parallel plate beam splitter 231 for a 1490 nm band wavelength is installed at the top of the first sub mount 300 beside the lens 700.

The self-standing parallel plate beam splitter 231 for the 1490 nm band wavelength is constructed in a structure in which the front side incline plane of the self-standing parallel plate beam splitter 231 directed toward the laser diode chip 100 is coated with an antireflective layer not to reflect a 1310 nm band wavelength, and two or more dielectric thin films having relatively high and low refractive indexes are alternately deposited on the back side incline plane of the self-standing parallel plate beam splitter 231 such that the back side incline plane does not reflect a 1310 nm band wavelength but a 1490 nm band wavelength. Below the self-standing parallel plate beam splitter 231 for the 1490 nm band wavelength is disposed a photo diode chip 501 for receiving a 1490 nm band wavelength, which responds to a 1490 nm band wavelength. The photo diode chip 501 for receiving a 1490 nm band wavelength is installed at the top of a sub mount 511 for receiving a 1490 nm band wavelength.

Meanwhile, a self-standing parallel plate beam splitter 232 for a 1550 nm band wavelength is disposed at the top of the first sub mount 300 beside the self-standing parallel plate beam splitter 231 for the 1490 nm band wavelength. The self-standing parallel plate beam splitter 232 for the 1550 nm band wavelength is constructed in a structure in which the front side incline plane of the self-standing parallel plate beam splitter 232 directed toward the laser diode chip 100 is coated with an antireflective layer not to reflect a 1310 nm band wavelength and a 1490 nm band wavelength, and the back side incline plane of the self-standing parallel plate beam splitter 232 is coated with a plurality of dielectric thin films not to reflect a 1310 nm band wavelength and a 1490 nm band wavelength but to reflect a 1550 nm band wavelength. Below the self-standing parallel plate beam splitter 232 for the 1550 nm band wavelength is disposed a photo diode chip 502 for a 1550 nm band wavelength, which responds to a 1550 nm band wavelength. The photo diode chip 502 for the 1550 nm band wavelength is installed at the top of a sub mount 512 for receiving a 1550 nm band wavelength.

Laser light of a 1310 nm wavelength emitted from the laser diode chip 100 is transmitted through the self-standing parallel plate beam splitter 231 for the 1490 nm band wavelength and the self-standing parallel plate beam splitter 232 for the 1550 nm band wavelength, both of which do not reflect the 1310 nm wavelength, and is then transmitted to the optical fiber (not shown). Also, laser light of a 1490 nm wavelength incident from the optical fiber is transmitted through the self-standing parallel plate beam splitter 232 for the 1550 nm band wavelength, which does not reflect the 1490 nm wavelength, is reflected at the back side incline plane of the self-standing parallel plate beam splitter 231 for the 1490 nm band wavelength, which is directed toward the optical fiber and is coated with the reflective layer to reflect the 1490 nm band wavelength, and is then transmitted to the photo diode chip 501 for the 1490 nm band wavelength. On the other hand, laser light of a 1550 nm wavelength incident from the optical fiber is reflected at the back side incline plane of the self-standing parallel plate beam splitter 232 for the 1550 nm band wavelength, which is coated with the reflective layer to reflect the 1550 nm band wavelength, and is then transmitted to the photo diode chip 502 disposed below the beam splitter for the 1550 nm band wavelength.

The bidirectional-communication triplexer optical module package using the two self-standing parallel plate beam splitters described above in detail with reference to FIG. 41 may be implemented in the form of a TO type package housing by disposing another self-standing parallel plate beam splitter for reflection at one side of the self-standing parallel plate beam splitter 232 for the 1550 nm band wavelength, as previously described with reference to FIG. 40.

The triplexer package, one example of the present invention, was described above to be implemented in the form of a single TO type package, or a mini-DIL, mini-flat or butterfly package. In addition, it is possible to implement a triplexer package in the form of the conventional two TO type BiDi packages as shown in FIG. 1 by incorporating an integrated BiDi optical module or another TO type photo diode package in a single TO type package, another example of the present invention.

FIG. 42 is a conceptional view illustrating a triplexer module according to an embodiment of the present invention manufactured in the form of the conventional two TO type BiDi modules. The triplexer module shown in FIG. 42 is constructed in a structure in which a TO type BiDi module 10 having 1310 nm wavelength and 1490 nm wavelength BiDi functions using a self-standing parallel plate beam splitter is installed at the position of the TO type laser diode module shown in FIG. 1, and a TO type photo diode module 550 for receiving a 1550 nm wavelength is disposed at the position of the existing TO type light receiving device. At this time, a beam splitter 250, used in the conventional BiDi module, has a property to reflect a 1550 nm wavelength and transmit a 1490 nm wavelength and a 1310 nm wavelength. With the above-stated construction, it is possible for the conventional BiDi type module to perform a function of the triplexer module.

FIG. 43 is a view illustrating the structure of a TO type laser diode package having a wavelength locking function and a bidirectional communication function according to an embodiment of the present invention.

As shown in FIG. 43, the TO type laser diode package having the wavelength locking function and the bidirectional communication function is constructed in a structure in which a thermoelectric device 14 is disposed at the top of a TO type stem base 11, and an optical part block having a bidirectional optical communication function and a wavelength locking function (hereinafter, referred to as a "bidirectional wavelength locking block" is disposed at the top of the thermoelectric device 14. A metal cap 112 having a lens 17 is attached to the top of the stem base 11, at which the bidirectional wavelength locking block 20 is disposed, by an electric welding method, thereby completing a TO type package housing. Meanwhile, a plurality of vertical through-holes are formed through the stem base 11. In the respective through-holes are fitted electrode pins 15, and then the through-holes are sealed by glass beads 16.

FIG. 44 is a view illustrating the structure of a bidirectional wavelength locking block according to an embodiment of the present invention.

As shown in FIG. 44, a back side monitoring photo diode chip 400 for monitoring laser light emitted from the back side of a laser diode chip 100 is attached to a back side monitoring photo diode chip sub mount 410 at the top of a first sub mount 300.

Also, a self-standing parallel plate beam splitter 240 is installed at the other side of the top of the first sub mount 300. The self-standing parallel plate beam splitter 240 reflects some of laser light emitted from the front side of the laser diode chip 100 at the front side incline plane thereof and transmits the reflected laser light to an optical fiber outside a TO type package through a lens (not shown) disposed above the self-standing parallel plate beam splitter 240, thereby achieving the transmission of information. Also, the self-standing parallel plate beam splitter 240 transmits some of laser light emitted from the front side of the laser diode chip 100 and forwards the transmitted laser light to a wavelength selectivity filter having a narrow transmission line width, i.e., a narrow line width filter 710. In addition, the self-standing parallel plate beam splitter 240 transmits light emitted from an optical fiber disposed above the self-standing parallel plate beam splitter 240 and forwards the transmitted light to a receiving photo diode chip 500 disposed below the self-standing parallel plate beam splitter 240.

At, the side of the self-standing parallel plate beam splitter 240 is disposed a second sub mount 310, which is in tight contact with the front side incline plane of the self-standing parallel plate beam splitter 240. At one side of the top of the second sub mount 310 is disposed a third sub mount 320 having the laser diode chip 100 attached to the top thereof. At the other side of the top of the second sub mount 310 is disposed a lens 700 for changing laser light emitted from the laser diode chip 100, while spreading at a wide angle, into parallel light.

The narrow line width filter 710, for selectively transmitting only a narrow wavelength region, is disposed beside the first sub mount 300. At the rear of the narrow line width filter 710, a front side monitoring photo diode chip 450 for monitoring laser light emitted from the laser diode chip 100 and passing through the narrow line width filter 710 is attached to a front side monitoring photo diode chip sub mount 460. Since laser light emitted, while spreading at a wide angle, from the front side of the laser diode chip 100 is changed into parallel light through the lens 700 disposed at the front of the laser diode chip 100, the laser light passing through the lens 700 is indicated by a single line in FIG. 44.

In describing this embodiment, for easy understanding, it is assumed that the wavelength of laser light emitted from the laser diode chip 100 is 1550 nm at room temperature, and the wavelength of laser light emitted from an optical fiber (not shown) is 1310 nm. The above-mentioned wavelength establishment is given only for convenience of description, and therefore, it is natural that a combination of various different wavelengths is applicable to the present invention.

The back side monitoring photo diode chip 400, disposed at the rear of the laser diode chip 100, is manufactured by crystal growing an indium gallium arsenide (hereinafter, referred to as "InGaAs") semiconductor layer on an indium phosphide (hereinafter, referred to as "InP") semiconductor substrate. InGaAs lattice matched to InP has a band gap energy of approximately 0.75 eV (electron volt) at room temperature. The InGaAs layer absorbs light energy having a wavelength of 1000 nm to 1700 nm and converts the absorbed light energy into electric current. The InGaAs layer, as a light absorption layer, has an optical-electrical conversion ratio changeable depending upon incident wavelength; however, the optical-electrical conversion ratio of the InGaAs layer does not greatly change within a wavelength range of 1000 nm to 1700 nm. A principal application example of an optical module having a wavelength locking function, which is a target of the present invention, is a DWDM. The wavelength displacement width of a laser diode chip for DWDM is within a range of approximately a few nm. Therefore, it may be regarded that the optical-electrical conversion ratio of the back side monitoring photo diode chip 400 with respect to a wavelength displacement of a few nm is uniform. Consequently, the back side monitoring photo diode chip 400 detects optical current proportional to energy emitted from the laser diode chip 100 irrespective of the wavelength fluctuation of the laser diode chip 100. Energy corresponding to a predetermined rate of laser light emitted from the front side of the laser diode chip 100 is reflected by the self-standing parallel plate beam splitter 240 and is condensed to the optical fiber outside the package through the lens disposed at the top of the package, thereby achieving the transmission of a signal. Some of energy emitted from the front side of the laser diode chip 100 is transmitted through self-standing parallel plate beam splitter 240, and exits from the back side incline plane of the self-standing parallel plate beam splitter 240.

The narrow line width filter 710 is disposed beside the back side incline plane of the self-standing parallel plate beam splitter 240. FIG. 45 is a graph illustrating a very narrow transmission line width property of the narrow line width filter 710. The narrow line width filter 710 may be obtained by depositing a plurality of dielectric thin films on a material exhibiting low absorptivity with respect to light concerned. At a near-infrared region where the energy of the light concerned is 1000 nm to 1700 nm, glass or silicon having low absorptivity with respect to this wavelength range may be a material for the narrow line width filter. Alternatively, the narrow line width filter 710 may be implemented by an etalon filter. As can be seen from FIG. 45, the transmissivity of the narrow line width filter 710 abruptly changes even with the wavelength change of 0.13 nm. Consequently, after laser light is emitted from the front side of the laser diode chip 100, is transmitted through the self-standing parallel plate beam splitter 240, and exits from the back side incline plane of the self-standing parallel plate beam splitter 240, light energy corresponding to the transmissivity of the narrow line width filter 710 is transmitted through the narrow line width filter 710, and is then incident on the front side monitoring photo diode chip 450, disposed at the rear of the narrow line width filter 710, with the result that the light energy is changed into optical current. Consequently, in a case in which the emission wavelength of the laser diode chip 100 is tuned to a wavelength established as a locking wavelength of FIG. 45, the transmissivity of the narrow line width filter 710 abruptly increases, when the emission wavelength of the laser diode chip 100 shifts to a long wavelength, with the result that the optical current generated by the front side monitoring photo diode chip 450 abruptly increases. On the other hand, the transmissivity of the narrow line width filter 710 abruptly decreases, when the emission wavelength of the laser diode chip 100 shifts to a short wavelength, with the result that the optical current generated by the front side monitoring photo diode chip 450 abruptly decreases. Consequently, the change degree and change direction of the emission wavelength are easily recognized. Generally, as the drive temperature of the laser diode chip 100 increases, the emission wavelength of the laser diode chip 100 shifts to a long wavelength. Consequently, when emission wavelength of the laser diode chip 100 shifts to a long wavelength due to an undesired cause, the built-in thermoelectric device 14 is driven to lower the temperature of the laser diode chip 100, thereby offsetting the shift of the emission wavelength of the laser diode chip 100. On the other hand, when emission wavelength of the laser diode chip 100 shifts to a short wavelength due to an undesired cause, the built-in thermoelectric device 14 is driven to raise the temperature of the laser diode chip 100, thereby offsetting the shift of the emission wavelength of the laser diode chip 100. A downstream optical signal of a 1310 nm band wavelength incident from the optical fiber is transmitted through the self-standing parallel plate beam splitter 240, and is then incident on the receiving photo diode chip 500 disposed below the self-standing parallel plate beam splitter 240, whereby the reception of the downstream optical signal is achieved.

It is possible to manufacture a TO type optical transmitter only having a wavelength locking function by removing the receiving photo diode chip 500, disposed below the self-standing parallel plate beam splitter 240, from the module of FIG. 44. FIG. 46 is a plan view illustrating the arrangement of a module constructed in a structure in which a receiving photo diode chip is not provided below a self-standing parallel plate beam splitter, and therefore, the module has only a wavelength locking function. This module has a linear arrangement as compared with the arrangement of FIG. 10 in which the conventional DWDM light source having a wavelength locking function, implemented by a butterfly package as previously described, is perpendicular to the monitoring photo diode chip. Consequently, it is possible to implement the wavelength locking function at a smaller bottom area. Also, optical alignment is achieved on a straight line as compared with the photo diode chip disposed in the perpendicular state, with the result that the assembly is simplified, and therefore, the manufacturing costs are reduced.

In the above description of the present invention, the wavelengths of laser light were presented as several examples; however, it is possible to implement embodiments of the present invention using a combination of various different wavelengths.

Also, the several embodiments of the present invention described above may further include a base sub mount to which not only the first sub mount and the receiving photo diode chip sub mount but also several parts, such as the narrow line width filter and the front and back side photo diode chips, are simultaneously attached. In this case, the assembly is simplified by using a method for assembling all other parts on the base sub mount and attaching the base sub mount to a TO type package housing or the bottom of a package, such as mini-DIL. Also, the height of the laser diode chip or the like is easily adjusted.

The adjustment of the height of the laser diode chip or the like is a very important factor; however, it is difficult to independently change only the height of the laser diode chip due to the restriction in size of the self-standing parallel plate beam splitter and the restriction in distance between the self-standing parallel plate beam splitter and the receiving photo diode chip. On the other hand, in a structure in which the base sub mount is disposed below the first sub mount, it is possible to easily raise and lower the overall block by changing only the height of the base sub mount, with the result that it is possible to adjust the height of the laser diode chip without the damage to the optical alignment of the laser diode chip, the self-standing parallel plate beam splitter, and the receiving photo diode chip.

The self-standing parallel plate beam splitter according to the present invention is easy to manufacture and can be mounted in various laser diode packages. In particular, the self-standing parallel plate beam splitter according to the present invention enables easy implementation of a laser diode package that is capable of performing bidirectional communication, a laser diode package having a triplexer function, a laser diode package having a wavelength locking function, and a laser diode package having a front side monitoring function to monitor the operation state of a laser diode chip using some of laser light emitted from the front side of the laser diode chip.

| Table of Reference Characters | |
|---|---|
| 100 | laser diode chip |
| 200 | self-standing parallel plate beam splitter |
| 210 | BiDi self-standing parallel plate beam splitter capable of performing bidirectional communication |
| 220 | front side monitoring self-standing parallel plate beam splitter |
| 230 | triplexer self-standing parallel plate beam splitter capable of performing bidirectional communication |
| 231 | triplexer self-standing parallel plate beam splitter capable of performing bidirectional communication for 1490 nm band wavelength division |
| 232 | triplexer self-standing parallel plate beam splitter capable of performing bidirectional communication for 1550 nm band wavelength division |
| 240 | DWDM self-standing parallel plate beam splitter having wavelength locking function and capable of performing bidirectional communication |
| 270 | self-standing parallel plate beam splitter exhibiting property to reflect all wavelengths |
| 300 | first sub mount |
| 310 | second sub mount |
| 320 | third sub mount |

Table of Reference Characters

| | |
|---|---|
| 400 | back side monitoring photo diode chip |
| 410 | back side monitoring photo diode chip sub mount |
| 450 | front side monitoring photo diode chip |
| 460 | front side monitoring photo diode chip sub mount |
| 500 | receiving photo diode chip for receiving optical signal transmitted from optical fiber |
| 510 | receiving photo diode chip sub mount |
| 501 | receiving photo diode chip for receiving optical signal of 1490 nm band wavelength transmitted from optical fiber |
| 511 | sub mount for receiving photo diode chip for receiving optical signal of 1490 nm band wavelength transmitted from optical fiber |
| 502 | receiving photo diode chip for receiving optical signal of 1550 nm band wavelength transmitted from optical fiber |
| 512 | sub mount for receiving photo diode chip for receiving optical signal of 1550 nm band wavelength transmitted from optical fiber |
| 700 | lens |
| 710 | narrow line width filter |
| 810 | n-type contact metal |
| 820 | n-InP substrate |
| 830 | u-InGaAs optical absorption region |
| 840 | u-InP |
| 850 | p-InP |
| 860 | p-InGaAs |
| 870 | Ti/Pt/Au p-type contact metal |

The invention claimed is:

1. A self-standing parallel plate beam splitter for performing a function to divide light incident thereon by reflecting or transmitting the light depending upon a wavelength of the light, wherein the self-standing parallel plate beam splitter is constructed in a structure in which a front side incline plane and a back side incline plane formed at opposite sides of a substrate is at an angle of 45 degrees to a bottom plane of the substrate, whereby, when the bottom plane of the substrate is attached to a top plane of a sub mount having a flat bottom plane, the front side incline plane and the back side incline plane are at a tilt angle of 45 degrees to the top plane of the sub mount, and dielectric thin films or metal thin films are deposited on the front side incline plane and the back side incline plane such that the front side incline plane and the back side incline plane have transmissivity or reflexibility of a ratio predetermined with respect to light of a specific wavelength.

2. The self-standing parallel plate beam splitter according to claim 1, wherein a cutting plane is formed between the front side incline plane and the bottom plane of the self-standing parallel plate beam splitter to partially cut the front side incline plane and the bottom plane.

3. A method of manufacturing a self-standing parallel plate beam splitter according to claim 1, the method comprising:
   (a) cutting a silicon wafer from a silicon ingot such that the silicon wafer is tilted 9.74 degrees with respect to a plane and applying photo resist on a portion of a top plane of the silicon wafer;
   (b) removing the photo resist at a region to be etched of the silicon wafer by photolithography;
   (c) etching the region where the photo resist is removed using an anisotropic etching solution such that the exposed planes are formed as planes having a tilt angle of 54.74 degrees to the plane;
   (d) depositing a dielectric thin film or a metal thin film on a bottom plane of the silicon wafer such that the bottom plane of the silicon wafer has transmissivity or reflexibility of a ratio predetermined according to a wavelength of incident light;
   (e) depositing a dielectric thin film or a metal thin film on the top plane, including the planes, of the silicon wafer such that the top plane, including the planes, of the silicon wafer has transmissivity or reflexibility of a ratio predetermined according to a wavelength of incident light; and
   (f) cutting the silicon wafer to complete the self-standing parallel plate beam splitter.

4. A method of manufacturing a self-standing parallel plate beam splitter according to claim 1, the method comprising:
   (a) depositing a dielectric thin film or a metal thin film on one plane of a silicon or glass parallel plate such that the one plane of the silicon or glass parallel plate has transmissivity or reflexibility of a ratio predetermined according to a wavelength of incident light;
   (b) depositing a dielectric thin film or a metal thin film on the other plane of the silicon or glass parallel plate such that the other plane of the silicon or glass parallel plate has transmissivity or reflexibility of a ratio predetermined according to a wavelength of incident light; and
   (c) sawing the parallel plate such that the parallel plate has an angle of 45 degrees to the section of the parallel plate to complete the self-standing parallel plate beam splitter.

5. The method according to claim 4, wherein the step of (c) sawing the parallel plate includes sawing the parallel plate using a 45-degree wedge-type rotary saw having a protrusion at the section thereof to form a cutting plane for cutting the bottom plane and the incline plane between the bottom plane and the incline plane.

6. The method according to claim 4, wherein the step of (c) sawing the parallel plate includes sawing the parallel plate by dry etching or laser.

7. A bidirectional-communication laser diode package structure having a self-standing parallel plate beam splitter according to claim 1, a laser diode chip, and a receiving photo diode chip mounted in a package housing, wherein a front side incline plane of the self-standing parallel plate beam splitter is coated with a single dielectric thin film or a plurality of dielectric thin films having different refractive indexes to reflect laser light of a wavelength emitted from the laser diode chip and exit the reflected laser light to an optical fiber outside the package and to transmit laser light of a wavelength incident from the optical fiber outside the package and forward the transmitted laser light to the receiving photo diode chip.

8. A TO type laser diode package structure constructed in a structure in which a laser diode chip is disposed at one side of a front side incline plane of a self-standing parallel plate beam splitter according to claim 1, and a light receiving device for monitoring is disposed at the other side of a back side incline plane of the self-standing parallel plate beam splitter, wherein the front side incline plane of the self-standing parallel plate beam splitter is coated with a single dielectric thin film or a plurality of dielectric thin films having different refractive indexes to reflect some of laser light emitted from the front side of the laser diode chip and exit the reflected laser light out of the package, and the remaining laser light, not reflected at the front side incline plane, is transmitted through the front side incline plane, and is irradiated to a monitoring photo diode chip through the back side incline plane, whereby the operation state of the laser diode chip is monitored using some of the laser light emitted from the front side of the laser diode chip.

9. A bidirectional-communication triplexer laser diode package structure having a self-standing parallel plate beam splitter according to claim 1, a laser diode chip, and two receiving photo diode chips mounted in a package housing, wherein the laser diode chip, for emitting light toward a front side incline plane of the self-standing parallel plate beam splitter, is disposed at the side of the self-standing parallel plate beam splitter, one of the receiving photo diode chips, for receiving laser light of a 1490 nm band wavelength incident from an optical fiber through a back side incline plane of the self- standing parallel plate beam splitter, and the other receiving photo diode chip, for receiving laser light of a 1550 nm band wavelength incident from the optical fiber through the back side incline plane, are disposed below the back side incline plane.

10. The laser diode package structure according to claim 9, wherein the front side incline plane of the self-standing parallel plate beam splitter transmits laser light of a 1310 nm band wavelength and reflects laser light of a 1490 nm band wavelength, and the back side incline plane of the self-standing parallel plate beam splitter transmits laser light of a 1310 nm band wavelength and laser light of a 1490 nm band wavelength and reflects laser light of a 1550 nm band wavelength.

11. A bidirectional-communication triplexer laser diode package structure having two self-standing parallel plate beam splitters according to claim 1, a laser diode chip, and two receiving photo diode chips mounted in a package housing, wherein a self-standing parallel plate beam splitter for a 1490 nm band wavelength, which transmits laser light of a wavelength emitted from the laser diode chip and reflects laser light of a 1490 nm band wavelength incident from an optical fiber downward, and a self-standing parallel plate beam splitter for a 1550 nm band wavelength, which transmits laser light of a wavelength emitted from the laser diode chip and laser light of a 1490 nm band wavelength incident from the optical fiber and reflects laser light of a 1550 nm band wavelength incident from the optical fiber downward, are disposed at the side of the laser diode chip in a line, and a receiving photo diode chip for a 1490 nm band wavelength, which detects laser light of a 1490 nm band wavelength, is disposed below the self-standing parallel plate beam splitter for the 1490 nm band wavelength, and a receiving photo diode chip for a 1550 nm band wavelength, which detects laser light of a 1550 nm band wavelength, is disposed below the self-standing parallel plate beam splitter for the 1550 nm band wavelength.

12. The laser diode package structure according to claim 11, wherein a front side incline plane and a back side incline plane of the self-standing parallel plate beam splitter for the 1490 nm band wavelength are alternately coated with a plurality of dielectric thin films having relatively high and low refractive indexes to transmit a 1310 nm band wavelength at the front side incline plane and transmit a 1310 nm band wavelength and reflect a 1490 nm band wavelength at the back side incline plane, and a front side incline plane and a back side incline plane of the self-standing parallel plate beam splitter for the 1550 nm band wavelength are alternately coated with a plurality of dielectric thin films having relatively high and low refractive indexes to transmit a 1310 nm band wavelength and a 1490 nm band wavelength at the front side incline plane and transmit a 1310 nm band wavelength and a 1490 nm band wavelength and reflect a 1550 nm band wavelength at the back side incline plane.

13. The laser diode package structure according to claim 9, wherein a reflective self-standing parallel plate beam splitter for reflecting laser light emitted from the self-standing parallel plate beam splitter at a front side incline plane thereof and forwarding the reflected laser light to the optical fiber, disposed above the reflective self-standing parallel plate beam splitter, and reflecting laser light incident from the optical fiber at the front side incline plane thereof and forwarding the reflected laser light to the self-standing parallel plate beam splitter is further disposed at the side of the self-standing parallel plate beam splitter.

14. A bidirectional-communication triplexer laser diode package structure constructed in a structure in which two TO type optical modules are disposed at a right angle to each other, and a beam splitter is disposed at an intersection point between optical axes of the TO type optical modules, wherein one of the TO type optical modules is a receiving TO type optical module for receiving a 1550 nm wavelength, and the other TO type optical module is a TO type optical module having a bidirectional communication function to transmit laser light of a 1310 nm wavelength and receive laser light of a 1490 nm wavelength as the bidirectional-communication laser diode package according to claim 7, and the beam splitter, disposed at the intersection point between the optical axes of the TO type optical modules, reflects laser light of a 1550 nm wavelength and transmits laser light of a 1490 nm wavelength and laser light of a 1310 nm wavelength.

15. A bidirectional-communication laser diode package structure having a self-standing parallel plate beam splitter according to claim 1, comprising:
 a laser diode chip for emitting laser light; a back side monitoring photo diode chip for detecting the laser light emitted from the back side of the laser diode chip; a self-standing parallel plate beam splitter having a front side incline plane exhibiting a property to partially reflect and partially transmit laser light emitted from the front side of the laser diode chip; a narrow line width filter for selecting and transmitting a narrow wavelength region of the laser light transmitted through the self-standing parallel plate beam splitter; and a front side monitoring photo diode chip for detecting the laser light transmitted through the narrow line width filter, the laser diode chip, the back side monitoring photo diode chip, the self-standing parallel plate beam splitter, the narrow line width filter, and the front side monitoring photo diode chip being arranged in a line to perform a wavelength locking function.

16. The laser diode package structure according to claim 15, wherein the front side incline plane of the self-standing parallel plate beam splitter has a property to transmit laser light emitted from an optical fiber, disposed above the self-standing parallel plate beam splitter, and a receiving photo diode chip for receiving an optical signal emitted from the optical fiber and transmitted through the self-standing parallel plate beam splitter is further disposed below the self-standing parallel plate beam splitter.

17. The laser diode package structure according to claim 15, wherein the back side monitoring photo diode chip, the laser diode chip, the self-standing parallel plate beam splitter, the narrow line width filter, and the front side monitoring photo diode chip are disposed above a thermoelectric device.

18. The laser diode package structure according to claim 7, further comprising:
 a preamplifier for amplifying the optical signal received through the receiving photo diode chip.

19. The laser diode package structure according to claim 7, further comprising:
 a lens for changing the laser light emitted from the laser diode chip into parallel light.

20. The laser diode package structure according to claim 7, wherein the photo diode chip is installed at the top of a photo diode chip sub mount, and a side plane of the photo diode chip and a space defined between the photo diode chip and the photo diode chip sub mount are filled with a material exhibiting opacity with respect to laser light and an electric insulating property.

21. The laser diode package structure according to claim 7, wherein the laser diode chip is fixedly installed at the top of a second sub mount, and the second sub mount and the self-standing parallel plate beam splitter are fixedly installed at the top of a first sub mount.

22. The laser diode package structure according to claim 7, wherein the laser diode chip is fixedly installed at the top of a second sub mount, the second sub mount and the self-standing parallel plate beam splitter are fixedly installed at the top of a first sub mount, and the receiving photo diode chip is installed inside the first sub mount.

23. The laser diode package structure according to claim 22, wherein the first sub mount has a "⊏"-shaped groove, in which the receiving photo diode chip is placed.

24. The laser diode package structure according to claim 21, wherein the second sub mount has the same structure as the self-standing parallel plate beam splitter.

25. The communication optical module package structure according to claim 24, wherein the second sub mount is installed at the top of the first sub mount such that the second sub mount is in tight contact with the front side incline plane of the self-standing parallel plate beam splitter.

26. The bidirectional-communication optical module package structure according to claim 7, wherein the receiving photo diode chip is installed at the top of a receiving photo diode chip sub mount, and the receiving photo diode chip is flip-chip bonded to the receiving photo diode chip sub mount.

27. The bidirectional-communication optical module package structure according to claim 7, wherein the package housing is a TO type package housing.

28. The bidirectional-communication optical module package structure according to claim 9, wherein the package housing is a mini-DIL, mini-flat or butterfly package.

29. The laser diode package structure according to claim 7, wherein the minimum height of the optical axis of an optical signal emitted from the optical fiber reaching the front side incline plane of the self-standing parallel plate beam splitter from the bottom plane of the self-standing parallel plate beam splitter is represented by the following Mathematical equation $h=t \times \cos(45°-\theta_2)/\cos_2$ on the assumption that the refractive index of the air is $n_1$, the refractive index of the self-standing parallel plate beam splitter is $n_2$, the incidence angle of the optical axis on the self-standing parallel plate beam splitter in the air is $\theta_1$ and $\theta_2 = \arcsin(n_2 \times \sin \theta_1/n_2)$.

* * * * *